(12) United States Patent
Yasuda

(10) Patent No.: US 7,781,824 B2
(45) Date of Patent: Aug. 24, 2010

(54) MEMORY CELL OF NONVOLATILE SEMICONDUCTOR MEMORY

(75) Inventor: Naoki Yasuda, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 221 days.

(21) Appl. No.: 12/044,645

(22) Filed: Mar. 7, 2008

(65) Prior Publication Data

US 2008/0237688 A1 Oct. 2, 2008

(30) Foreign Application Priority Data

Mar. 27, 2007 (JP) ............... 2007-082822

(51) Int. Cl.
*H01L 27/105* (2006.01)
(52) U.S. Cl. ............... 257/316; 257/E29.302
(58) Field of Classification Search ......... 257/316, 257/E29.302
See application file for complete search history.

(56) References Cited

U.S. PATENT DOCUMENTS

| 2006/0022252 | A1 | 2/2006 | Doh et al. |
| 2006/0240623 | A1* | 10/2006 | Lee et al. ............ 438/257 |
| 2006/0261401 | A1* | 11/2006 | Bhattacharyya ......... 257/316 |

FOREIGN PATENT DOCUMENTS

| JP | 2004-165553 | 6/2004 |
| JP | 2005-5715 | 1/2005 |
| JP | 2005-268756 | 9/2005 |
| JP | 2007-27759 | 2/2007 |
| WO | WO 2006/059368 A1 | 6/2006 |

OTHER PUBLICATIONS

U.S. Appl. No. 12/234,126, filed Sep. 19, 2008, Yasuda.
U.S. Appl. No. 11/822,579, filed Jul. 9, 2007, Naoki Yasuda.
T. Sugizaki, et al.,"Novel Multi-bit SONOS Type Flash Memory Using a High-k Charge Trapping Layer", Symposium on VLSI Technology Digest of Technical Papers, 3B-1, Jun. 2003, pp. 27-28.
Naoki Yasuda, et al., "The Relation between Dielectric Constant and Film Composition of Ultra-Thin Silicon Oxynitride Films: Experimental Evaluation and Analysis of Nonlinearity", Extended Abstracts of the 2001 International Conference on Solid State Devices and Materials, B-8-1, Sep. 2001, pp. 486-487.

(Continued)

*Primary Examiner*—Lex Malsawma
(74) *Attorney, Agent, or Firm*—Oblon, Spivak, McClelland, Maier & Neustadt, L.L.P.

(57) ABSTRACT

A memory cell of a nonvolatile semiconductor memory includes a first insulating film whose principal constituent elements are Si, O and N, a charge storage layer whose principal constituent elements are Hf, O and N, formed on the first insulating film, a second insulating film having dielectric constant higher than that of the first insulating film and formed on the charge storage layer, and a control gate electrode formed on the second insulating film. Relation between a composition of the first insulating film and a composition of the charge storage layer is determined under the conditions that (A) a valence band offset of the first insulating film is larger than a valence band offset of the charge storage layer, and (B) a trap energy level of electrons due to oxygen vacancies in the charge storage layer exists within a band gap of the charge storage layer.

12 Claims, 26 Drawing Sheets

OTHER PUBLICATIONS

K. Muraoka, et al., "Optimum structure of deposited ultrathin silicon oxynitride film to minimize leakage current", Journal of Applied Physics, American Institute of Physics, vol. 94, No. 3, Aug. 1, 2003, pp. 2038-2045.

John Robertson, "Band offsets of wide-band-gap oxides and implications for future electronic devices", J. Vac. Sci. Technol. B, American Vacuum Society, vol. 18, No. 3, May-Jun. 2000, pp. 1785-1791.

N. Umezawa, et al., "First-principles studies of the intrinsic effect of nitrogen atoms on reduction in gate leakage current through Hf-based high-k dielectrics", Applied Physics Letters 86, American Institute of Physics, Mar. 2005, pp. 143507-1-143507-3.

S. V. Hattangady, et al., "Integrated processing of silicon oxynitride films by combined plasma and rapid-thermal processing", J. Vac. Sci. Technol. A, American Vacuum Society, vol. 14, No. 6, Nov.-Dec. 1996, pp. 3017-3023.

G. Shang, et al., Stability and band offsets of nitrogenated high-dielectric-constant gate oxides, Applied Physics Letters, American Institute of Physics, vol. 84, No. 1, Jan. 5, 2004, pp. 106-108.

K. Xiong, et al., "Defect energy levels in $HfO_2$ high-dielectric-constant gate oxide", Applied Physics Letters 87, American Institute of Physics, Oct. 26, 2005, pp. 183505-1-183505-3.

Hiroyoshi Momida, et al., "Effects of nitrogen atom doping on dielectric constants of Hf-based gate oxides", Applied Physics Letters 88, American Institute of Physics, Mar. 14, 2006, pp. 112903-1-112903-3.

Albert Chin, et al., "Low Voltage High Speed $SiO_2$/AlGaN/$AlGaO_3$/TaN Memory with Good Retention", IEDM Tech. Dig., IEEE, Dec. 2005, 4 Pages.

Katsuyuki Matsunaga, et al., First-principles calculations of intrinsic defects in $Al_2O_3$, Physical Review B 68, The American Physical Society, Aug. 25, 2003, pp. 085110-1-085110-9.

G. Lucovsky, et al. "Bonding constraints and defect formation at interfaces between crystalline silicon and advanced single layer and composite gate dielectrics", Applied Physics Letters, Americal Institute of Physics, vol. 74, No. 14, Apr. 5, 1999, pp. 2005-2007.

Takashi Ito, et al., "Plasma-enhanced thermal nitridation of silicon", Appl. Phys. Lett. 38(5), American Institute of Physics, Mar. 1, 1981, pp. 370-372.

X.P.Wang, et al., "Dual Metal Gates with Band-Edge Work Functions on Novel HfLaO High- K Gate Dielectric", Symposium on VLSI Technology Digest of Technical Papers, IEEE, Session 22, Jun. 2006, 2 Pages.

Eiichi Suzuki, et al., Traps created at the interface between the nitride and the oxide on the nitride by thermal oxidation, Appl. Phys. Lett. 42 (7), American Institute of Physics, Apr. 1, 1983, pp. 608-610.

U.S. Appl. No. 12/404,648, filed Mar. 16, 2009, Ino, et al.

* cited by examiner

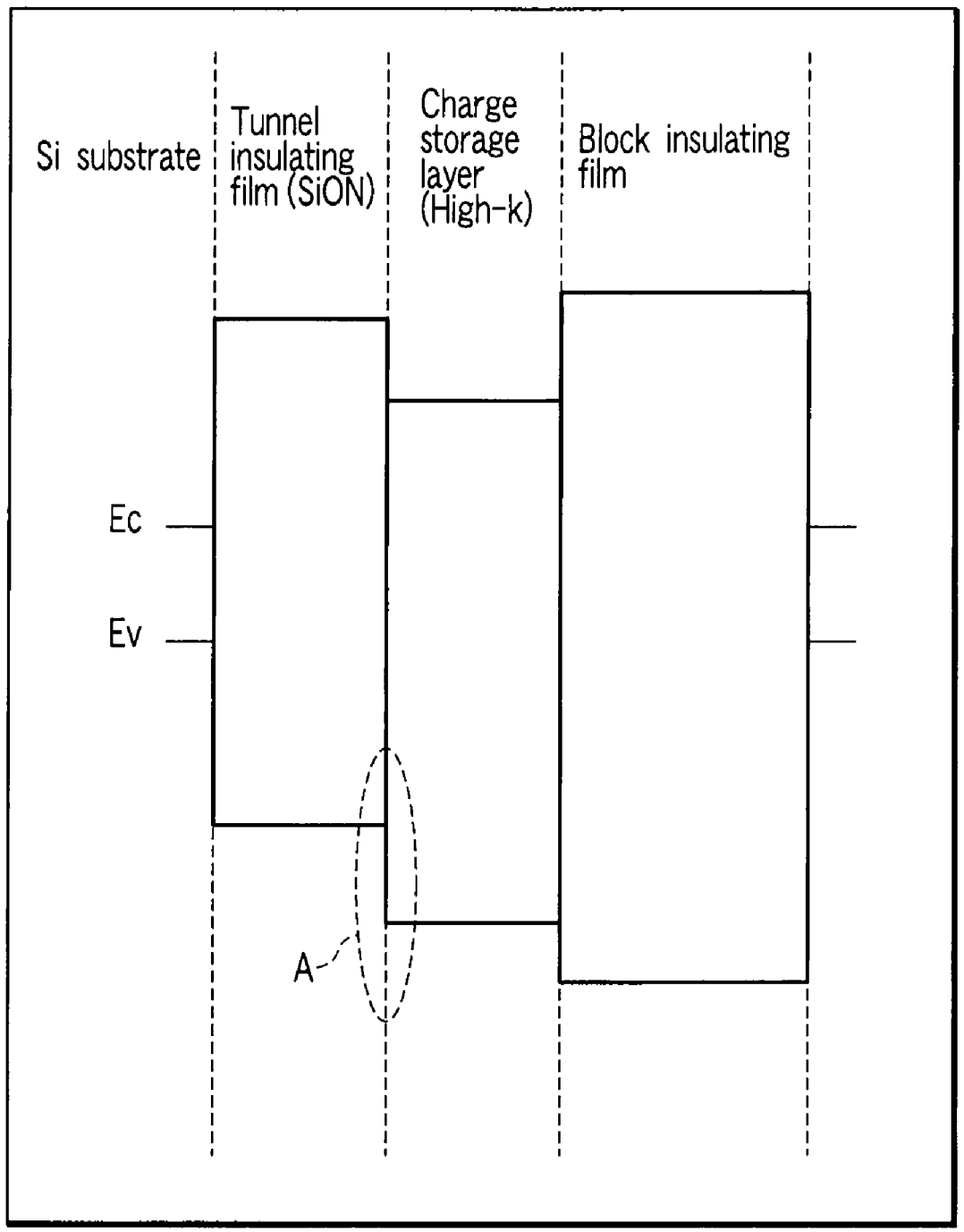
F I G. 4

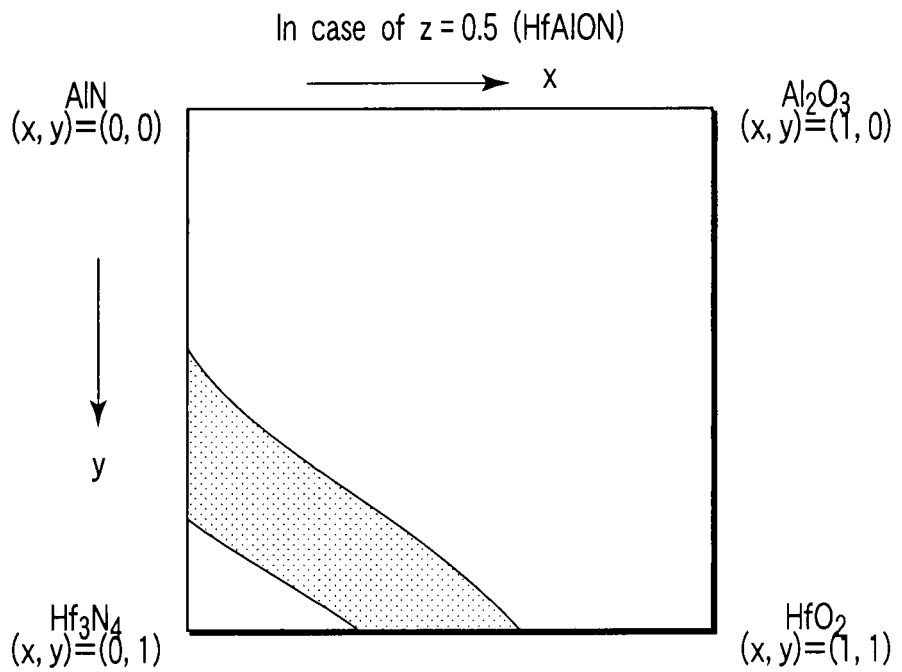
F I G. 13
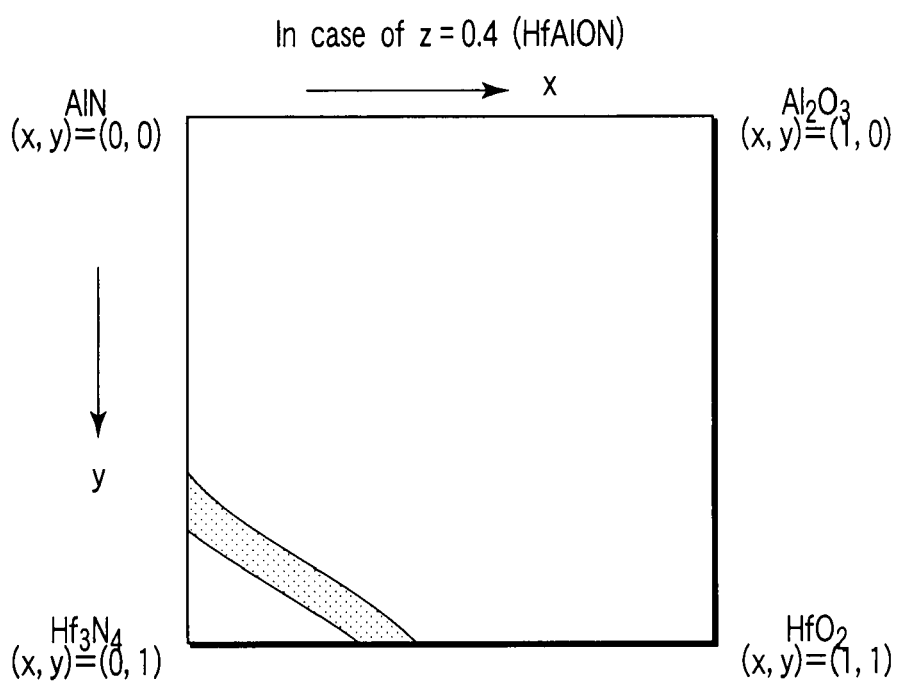
F I G. 14

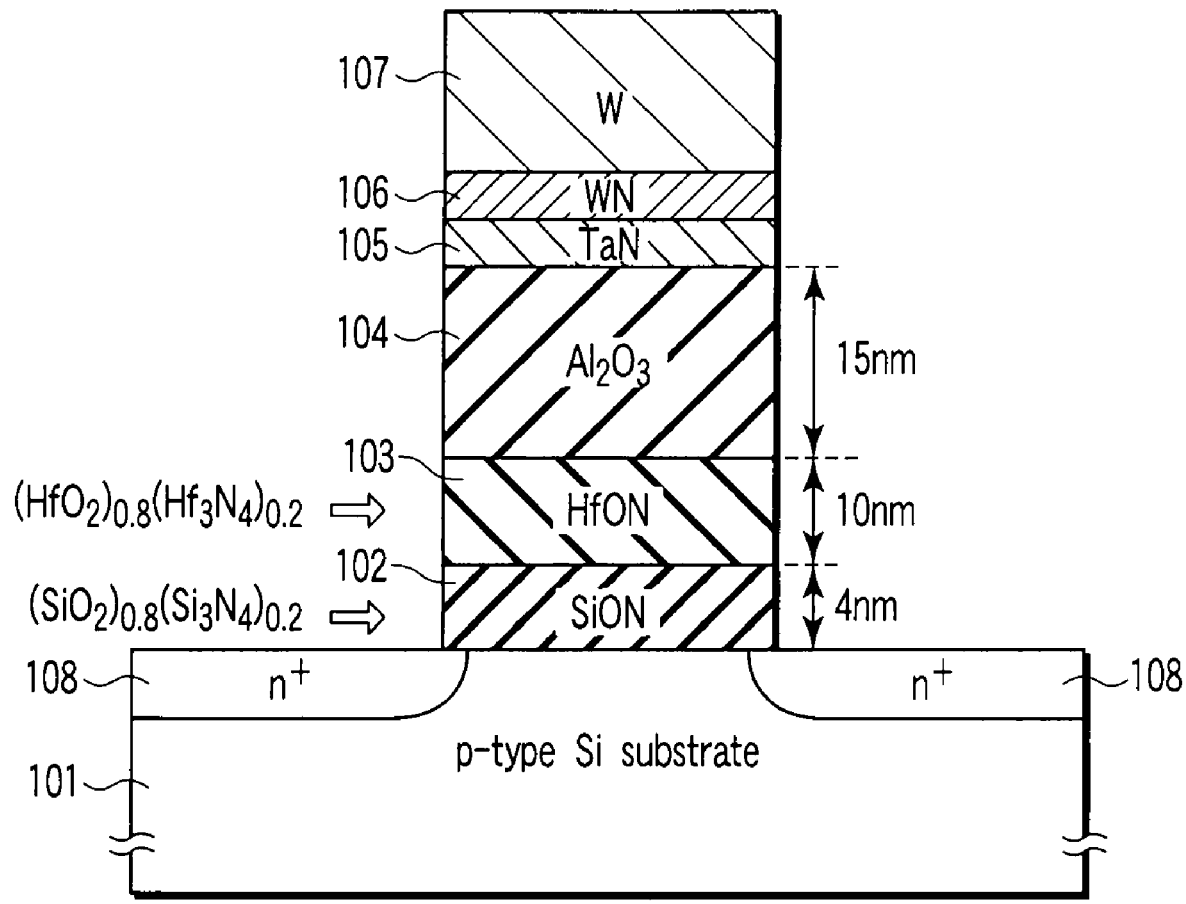
F I G. 26

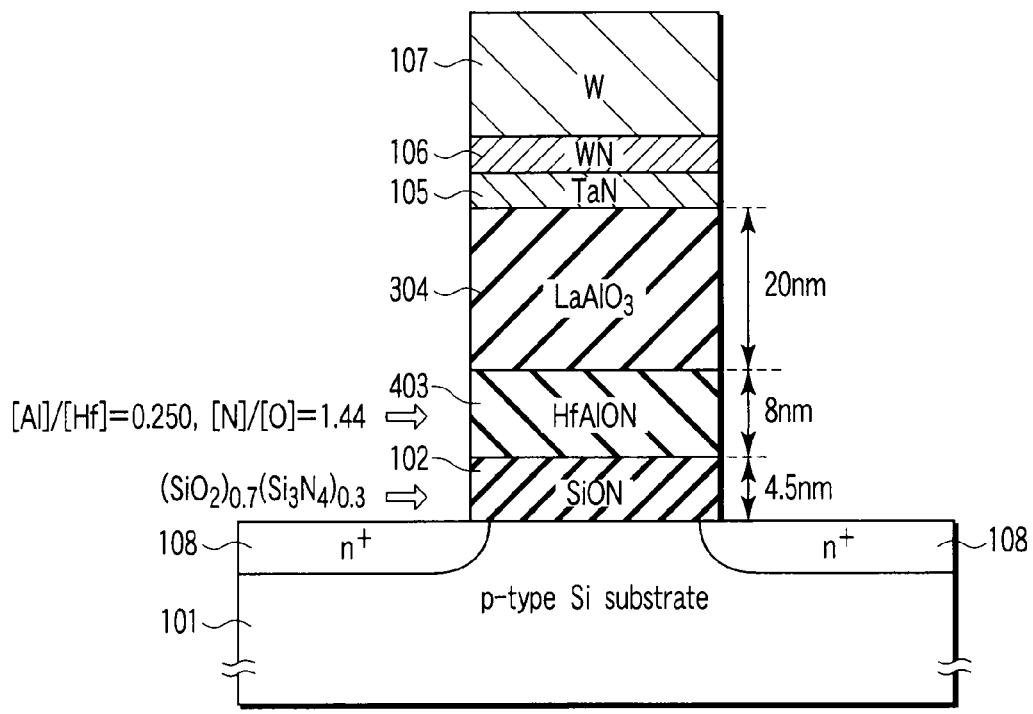
F I G. 34
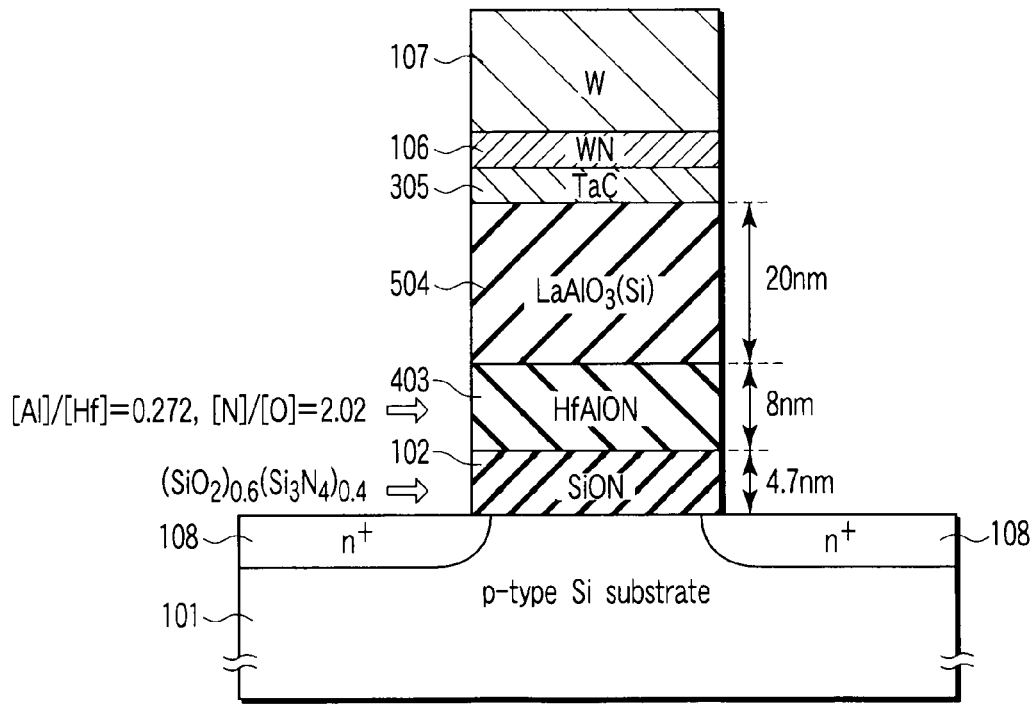
F I G. 35

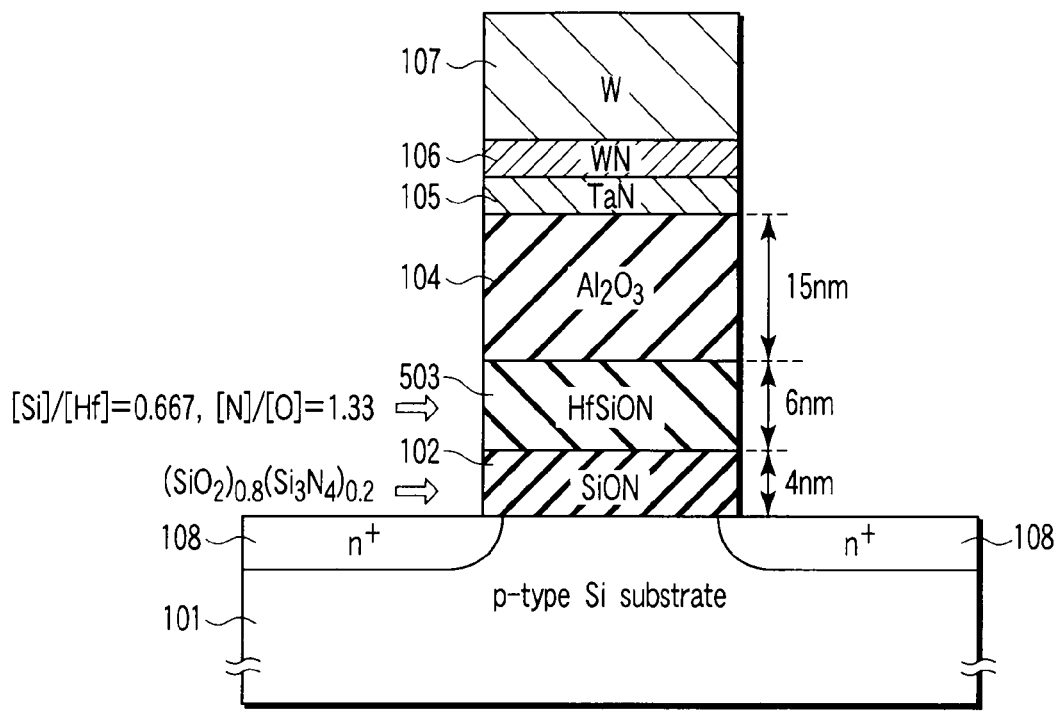
F I G. 36
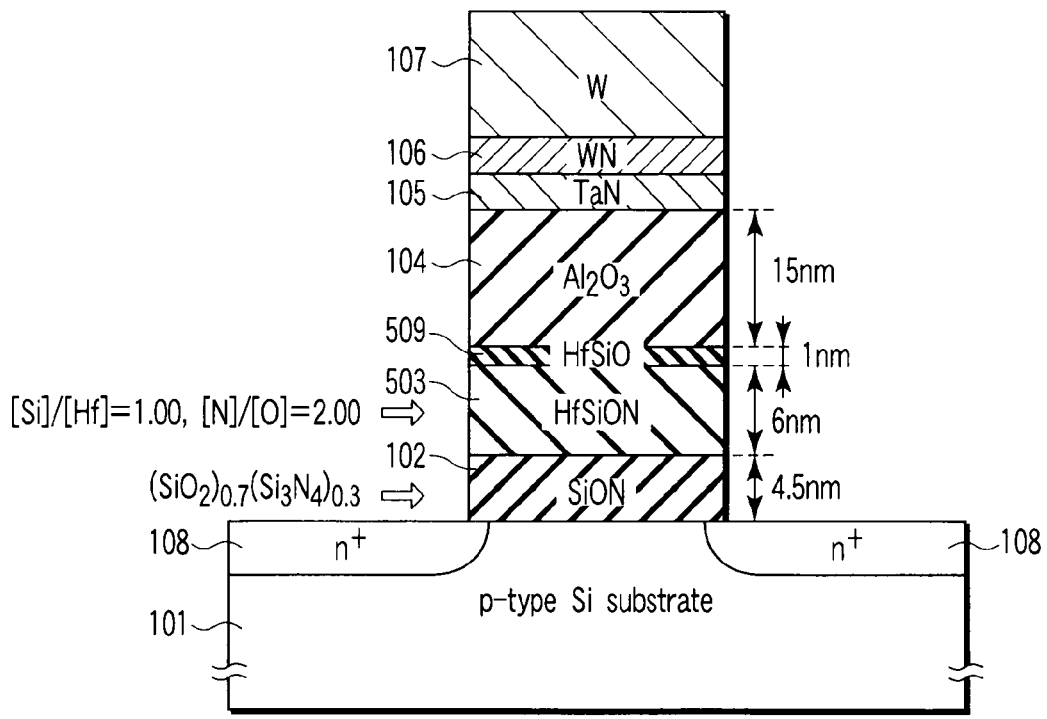
F I G. 37

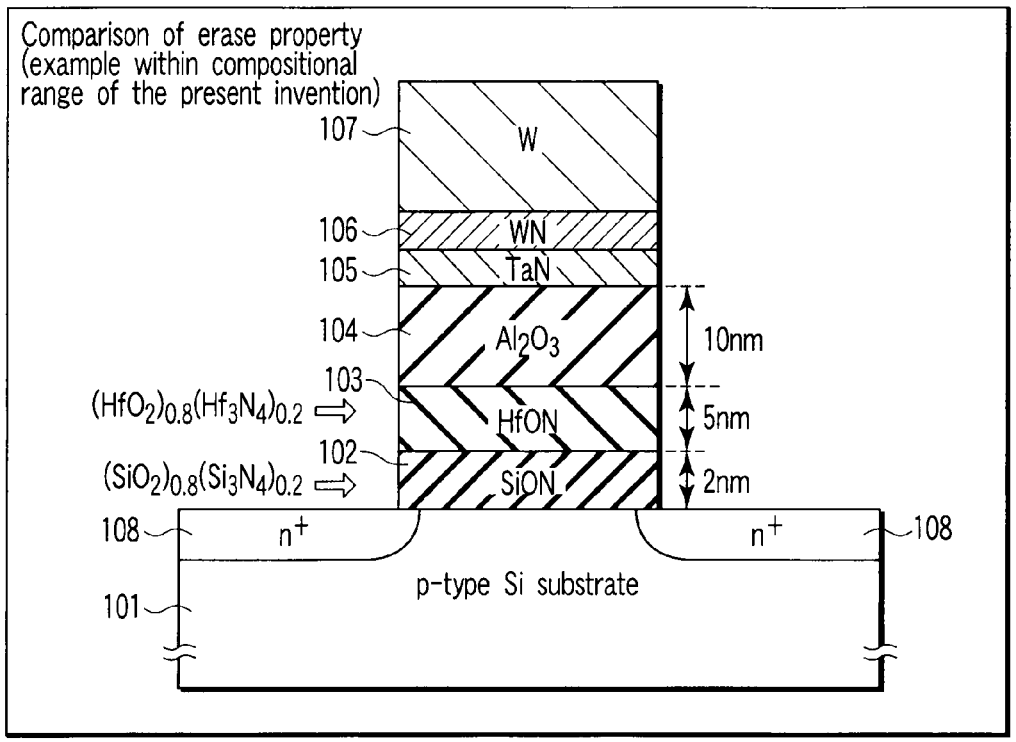
F I G. 38
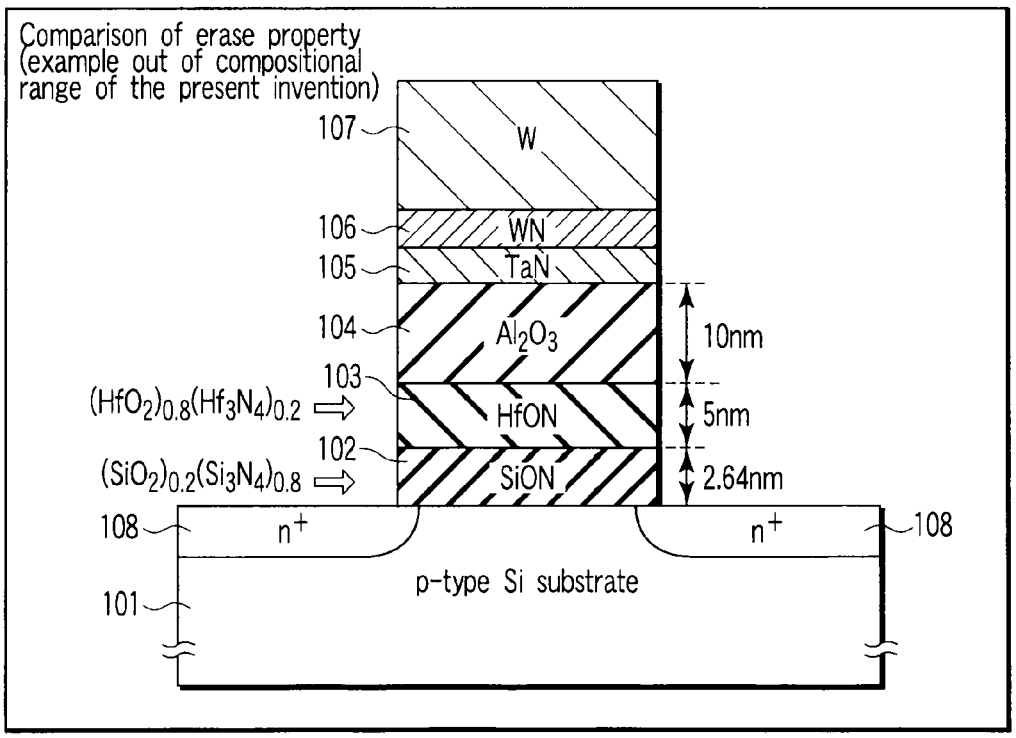
F I G. 39

MEMORY CELL OF NONVOLATILE SEMICONDUCTOR MEMORY

CROSS-REFERENCE TO RELATED APPLICATIONS

This application is based upon and claims the benefit of priority from prior Japanese Patent Application No. 2007-082822, filed Mar. 27, 2007, the entire contents of which are incorporated herein by reference.

BACKGROUND OF THE INVENTION

1. Field of the Invention

The present invention relates to a memory cell of a nonvolatile semiconductor memory in which a charge storage layer is constituted from an insulating film.

2. Description of the Related Art

One of the candidates for architecture of a memory cell of a NAND type flash memory whose gate length is 30 nm or less is a MONOS (metal/oxide film/nitride film/oxide film/semiconductor) structure with interferences between adjacent cells reduced.

The MONOS type memory cell has a characteristic in that a charge storage layer is constituted from an insulating film.

That is, the memory cell is constituted in such a way that, for instance, on a channel between two source/drain diffusion layers on an Si substrate, a tunnel insulating film through which electric charges are passed at the time of write/erase, a silicon nitride film functioning as the charge storage layer, a block insulating film having a function to block current, and a gate electrode are stacked.

Here, write/erase property and retention property are improved when the tunnel insulating film of the MONOS type memory cell is formed of a silicon oxynitride film (SiON) (for instance, refer to Jpn. Pat. Appln. KOKAI Publication No. 2004-165553).

Further, when changing the charge storage layer from the silicon nitride film to a high-k insulating film, it is possible to realize both increase in a trap density of the charge storage layer and decrease in Equivalent Oxide Thickness (EOT) simultaneously (for instance, refer to T. Sugizaki, M. Kobayashi, M. Ishida, H. Minakata, M. Yamaguchi, Y. Tamura, Y. Sugiyama, T. Nakanishi, and H. Tanaka, "Novel Multi-bit SONOS Type Flash Memory Using a High-k Charge Trapping Layer," Symp. VLSI Tech. Digest p. 27 (2003)).

Furthermore, proposed is the technique in which both the tunnel insulating film and the charge storage layer are formed of the high-k insulating film (for instance, refer to Jpn. Pat. Appln. KOKAI Publication No. 2005-268756).

However, MONOS type memory cells having further superior property are required with respect to both write/erase and retention.

BRIEF SUMMARY OF THE INVENTION

A memory cell of a nonvolatile semiconductor memory according to an aspect of the present invention comprises source/drain diffusion layers formed separately on a surface part of a semiconductor substrate, a first insulating film whose principal constituent elements are Si, O and N, formed on a channel between the source/drain diffusion layers, a charge storage layer whose principal constituent elements are Hf, O and N, formed on the first insulating film, a second insulating film having dielectric constant higher than that of the first insulating film and formed on the charge storage layer, and a control gate electrode formed on the second insulating film.

Relation between a composition of the first insulating film and a composition of the charge storage layer is determined under the condition that (A) a valence band offset of the first insulating film is larger than a valence band offset of the charge storage layer, and (B) a trap energy level of electrons generated by oxygen vacancies in the charge storage layer exists within a band gap of the charge storage layer.

According to the present invention, when the silicon oxynitride film is used as the tunnel insulating film, and the high-k insulating film is used as the charge storage layer, it is possible to provide the MONOS type memory cell having superior property with regard to write/erase and retention, because material compositions having optimum band profile and trap energy level are used.

BRIEF DESCRIPTION OF THE SEVERAL VIEWS OF THE DRAWING

FIG. 4 is an explanatory figure showing a band profile when connecting a silicon oxynitride film and a high-k insulating film;

FIG. 13 is a view showing an appropriate compositional range when HfAlON is used for the charge storage layer;

FIG. 14 is a view showing an appropriate compositional range when HfAlON is used for the charge storage layer;

FIG. 26 is a cross sectional view showing a cell structure as the first embodiment;

FIG. 34 is a cross sectional view showing a cell structure as a fourth embodiment;

FIG. 35 is a cross sectional view showing a cell structure as a fifth embodiment;

FIG. 36 is a cross sectional view showing a cell structure as a sixth embodiment;

FIG. 37 is a cross sectional view showing a cell structure as a seventh embodiment;

FIG. 38 is a view for comparing embodiments whose compositional ranges are within and out of the present invention;

FIG. 39 is a view for comparing embodiments whose compositional ranges are within and out of the present invention;

DETAILED DESCRIPTION OF THE INVENTION

Figure 1:
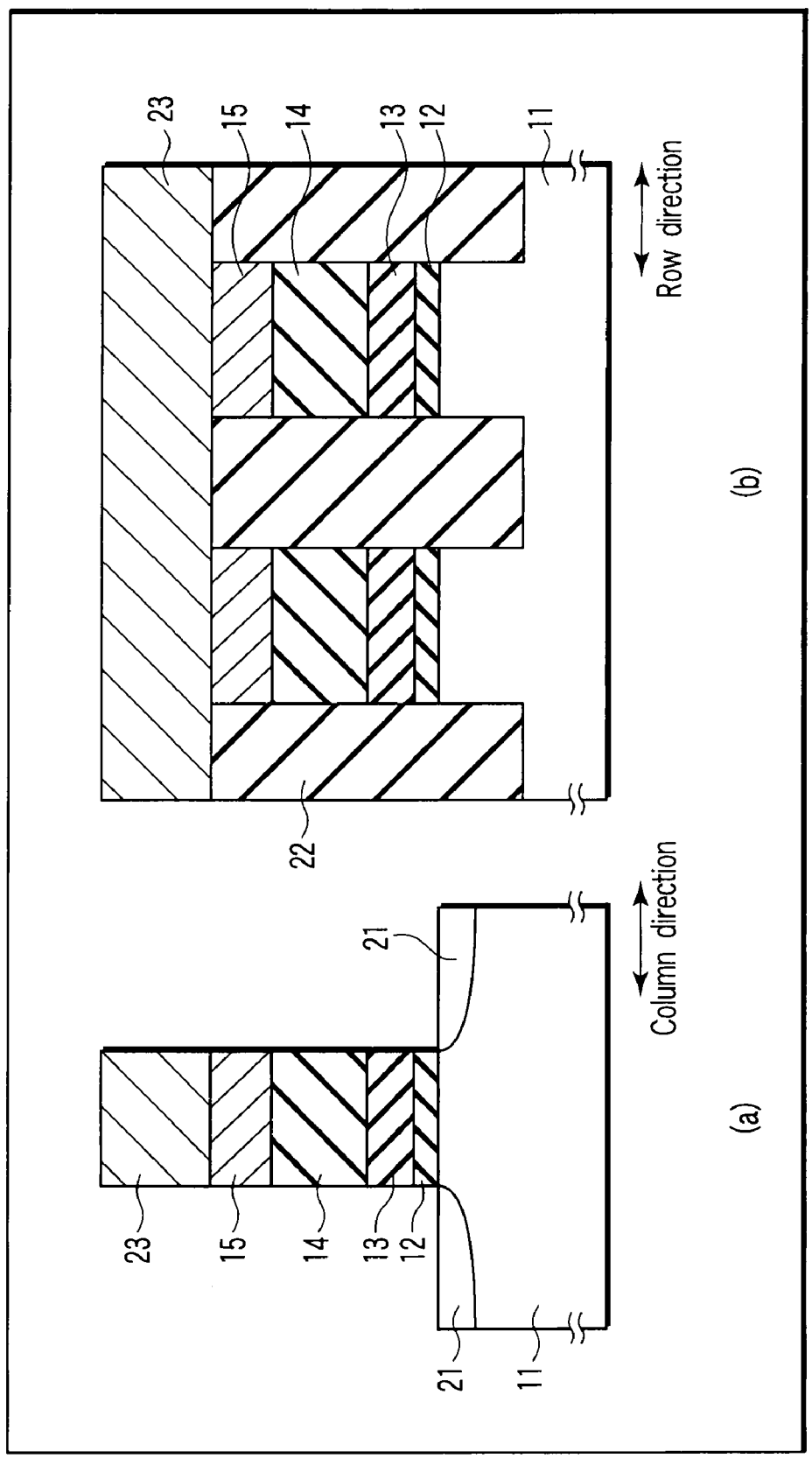
FIG. 1 is a cross sectional view showing a cell structure as a reference example.

A memory cell of a nonvolatile semiconductor memory of an aspect of the present invention will be described below in detail with reference to the accompanying drawings.

The present invention is intended to improve the performance of a memory cell by making all of a tunnel insulating film, a charge storage layer and a block insulating film of the MONOS type memory cell an insulating film having a dielectric constant higher than that of a silicon oxide film, or by constituting a structure including such insulating films. If the high-k insulating film is used as the block insulating film, it is possible to reduce leakage currents flowing through the high-k insulating film, and thus it is possible to improve the write/erase and the retention properties. In addition, when changing the charge storage layer into a metal oxide-based insulating film having dielectric constant higher than that of the silicon nitride film, it is possible to realize both increase in a trap density of the charge storage layer and decrease in Equivalent Oxide Thickness (EOT) simultaneously. Further, when changing the tunnel insulating film to a silicon oxynitride film from the silicon oxide film, it is possible to obtain the sufficient write/erase currents in a high electric field region and to reduce the leakage current in a low electric field region. Moreover, mutual relation of the materials constituting the memory cell structure has been investigated, in the case where the tunnel insulating film, the charge storage layer, and the block insulating film are respectively changed to the insulating film with high dielectric constant or to the structure including such insulating films. Particularly, mutual relation between the tunnel insulating film and the charge storage layer is important because it exerts influence on storage/emission property of the charges, and thus investigation for optimization has been conducted.

There will be described the best mode to implement examples of the present invention while referring to the drawings in detail below.

1. Outline

In the memory cell of the nonvolatile semiconductor memory according to the examples of the present invention, the tunnel insulating film is constituted from a silicon oxynitride film (SiON), and the charge storage layer is constituted from a high-k metal oxide doped with nitrogen. Optimization of nitrogen density of the charge storage layer (high-k metal oxide nitride) is performed to provide the MONOS type memory cell having excellent performance and reliability.

As the quantity of nitrogen introduced into the high-k metal oxide increases, a valence band offset of the charge storage layer can be made smaller than that of the tunnel insulating film. This determines a lower limit of the amount of nitrogen to be introduced. On the other hand, an upper limit of the amount of nitrogen to be introduced is determined on the condition that the energy level of an electron trap created by oxygen vacancies is located within the bandgap of the charge storage layer.

Since optimum density range of nitrogen of the high-k metal oxynitride (or optimum compositional range of the high-k metal oxynitride) differs depending on the materials constituting the charge storage layer (for instance, HfON, HfAlON, HfSiON, or the like), the optimum range in each of those materials will be described in detail in embodiments.

According to the examples of the present invention, by constituting the tunnel insulating film from the silicon oxynitride film (SiON), current of the tunnel insulating film becomes large in the high electric field region in which the write/erase is performed, and becomes small in the low electric field region in which the data retention is performed. For this reason, it is possible to realize improvement in the write/erase properties and the retention property simultaneously.

In addition, by constituting the charge storage layer from the high-k insulating film, it is possible to realize the MONOS type memory cell with small Equivalent Oxide Thickness (EOT), thereby contributing to low power supply voltage.

Further, nitrogen introduced to the charge storage layer (trap layer) causes the following effects.

Firstly, speed of an erase operation limiting performance of the MONOS is improved by reduction of the band offset of the valence band of the charge storage layer.

Secondly, by setting the energy level of the electron traps due to oxygen vacancies into the band gap of the charge storage layer, the write property and the retention property are improved by securing the ability to capture charges which is essential to the charge storage layer.

As described above, according to the examples of the present invention, it is possible to realize the MONOS type memory cell having excellent property with respect to all of the write/erase and the retention functions.

2. Reference Example

Firstly, there will be described a reference example of the present invention.

FIG. 1 shows a MONOS type memory cell according to the reference example of the present invention.

FIG. 1A is a cross sectional view along channel length direction, and FIG. 1B is a cross sectional view along channel width direction. In these drawings, the channel length direction is referred to as column direction in which a bit line extends, while the channel width direction is referred to as row direction in which a word line (control gate electrode) extends.

Firstly, as shown in FIG. 1A, two source/drain diffusion layers 21 are separately located on a surface of a silicon substrate (including the case of a well) 11 doped with p-type impurity. A region between the source/drain diffusion layers 21 is a channel region, and when the memory cell operates in ON state, a channel for electrically connecting the two source/drain diffusion layers 21 is formed on the channel region.

On the channel region, there is arranged a tunnel oxide film ($SiO_2$) 12 with a thickness of approximately 3 to 4 nm. On the tunnel oxide film 12, there are stacked a silicon nitride film 13 with a thickness of approximately 6 nm, a silicon oxide film (block insulating film) 14 with a thickness of approximately 10 nm, and a phosphorus doped polycrystalline silicon film (control gate electrode) 15 with a thickness of 100 nm.

The source/drain diffusion layer 21 is formed in such a way that impurities are implanted in the silicon substrate 11 in a self-aligned manner using these stacked gate structures as a mask.

In addition, as shown in FIG. 1B, a plurality of stacked structures (gate part) composed of the tunnel oxide film 12, the silicon nitride film 13, the silicon oxide film 14, and the phosphorus doped polycrystalline silicon film 15 are formed in the row direction, and these are separated mutually by a device isolation insulating layer 22 with an STI (Shallow Trench Isolation) structure.

The device isolation insulating layer 22 fills a slit-shaped trench having a depth from the upper surface of the phosphorus doped polycrystalline silicon film 15 to the silicon substrate 11 (for instance, approximately 100 nm).

The level of the upper surface of the phosphorus doped polycrystalline silicon film 15 is approximately equal to that of the upper surface of the device isolation insulating layer 22. Then, a word line 23 extending in the row direction is placed on the phosphorus doped polycrystalline silicon film 15 and on the device isolation insulating layer 22. The word line 23 is constituted from a conductive film with a thickness of approximately 100 nm made of, for instance, tungsten.

In this structure, since the tunnel insulating film is the silicon oxide film, particularly during the erase operation, the holes are hard to be injected into the charge storage layer from the silicon substrate, and accordingly speed of the erase operation slows down. In addition, since the charge storage layer is the silicon nitride film, EOT of the whole MONOS structure cannot be made smaller, and thus realization of low power supply voltage is difficult.

Further, since the block insulating film is constituted from the material having equal dielectric constant to the tunnel insulating film (silicon oxide film), the leakage current flowing through the block insulating film during the write/erase operations becomes large.

3. Principle of the Present Invention

There will be described the principle of the present invention.

(1) Description of Qualitative Principle

A. As for Materials of Tunnel Insulating Film

Property of the tunnel insulating film becomes the most important factor when determining performance of the MONOS type memory cell. The tunnel insulating film is required to have the property in which large current flows in the high electric field region (up to 15 MV/cm) where the write/erase is performed, and the leakage current becomes extremely small in the low electric field region (up to 3.5 MV/cm) where data retention is performed. In addition, reduction of Equivalent Oxide Thickness (EOT) is also important as the memory cell is miniaturized. There will be discussed the most appropriate materials to meet such requirements.

Firstly, with respect to four kinds of the insulating films of the silicon oxide film ($SiO_2$), the silicon oxynitride film (SiON), aluminum oxide ($Al_2O_3$), and hafnium ($HfO_2$), the leakage current (tunneling current) characteristics are calculated with a simulation. In order that conditions of all the insulating films are equalized, thickness of the silicon oxide film is made 3 nm, and EOT of all the other insulating films is made 3 nm.

Figure 2:
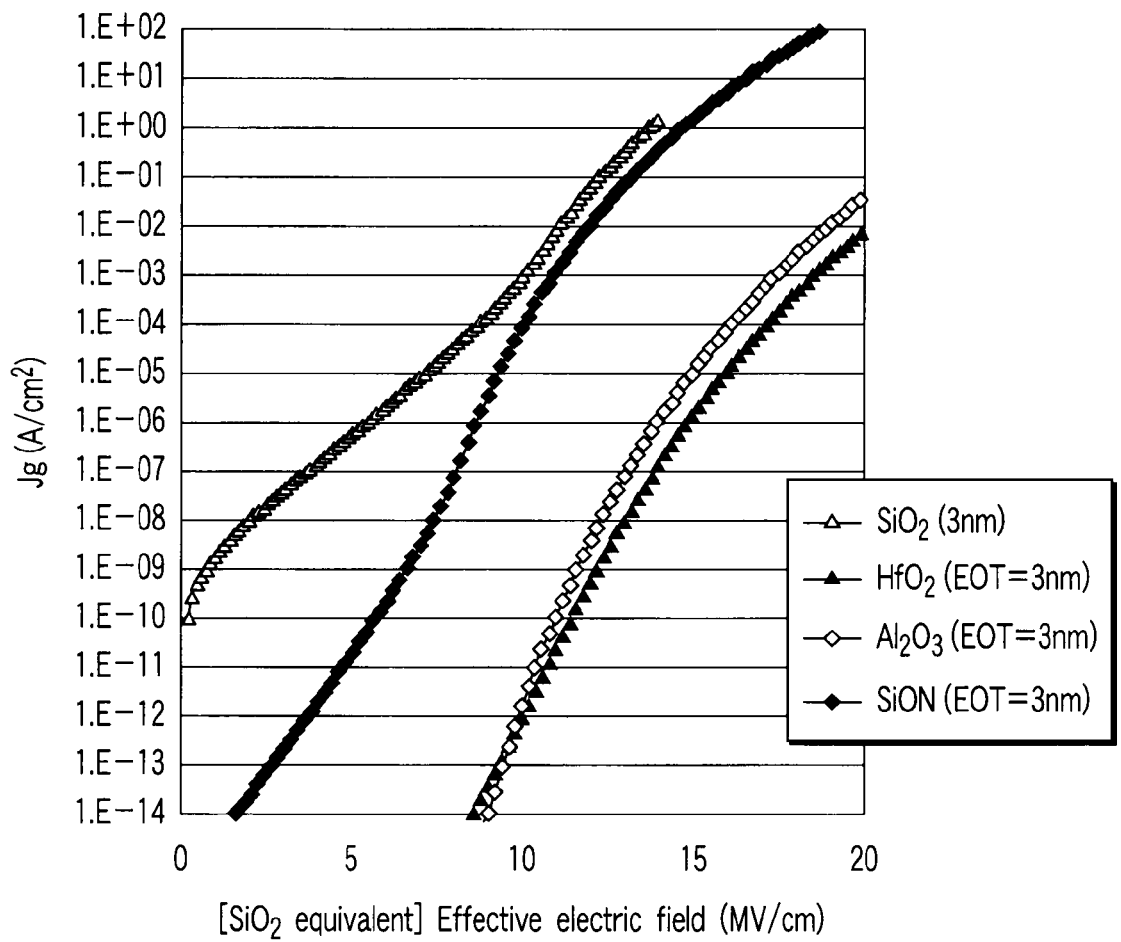
FIG. 2 is an explanatory figure showing relation between an effective electric field and a tunneling current.

FIG. 2 shows relation between an effective electric field and a leakage current Jg.

A horizontal axis represents the effective electric field ($SiO_2$ equivalent electric field), and a vertical axis represents the leakage current Jg.

Here, the composition of the silicon oxynitride film, x is set to be $x=0.6$ in $(SiO_2)_x(Si_3N_4)$. However, even with other compositions, approximately the same result can be obtained at the high electric field region.

Additionally, relative dielectric constant of the silicon oxynitride film is assumed to be $\lfloor =6.23$, by using N. Yasuda, K. Muraoka, M. Koike and H. Satake, "The relation between Dielectric Constant and Film Composition of Ultra-Thin Silicon Oxynitride Films: Experimental Evaluation and Analysis of Nonlinearity," Ext. Abs. SSDM p. 486 (2001) as a reference.

Further, an electron barrier height $\phi_e$ of the silicon oxynitride film is assumed to be $\phi_e=2.48$ eV following the concept of K. Muraoka, K. Kurihara, K. Yasuda and H. Satake, "Optimum structure of deposited ultrathin silicon oxynitride film to minimize leakage current," J. Appl. Phys. 94, 2038 (2003). Note that it is assumed that the barrier height of the silicon oxide film is 3.15 eV, and the barrier height of the silicon nitride film is 2.15 eV.

As is clear from FIG. 2, in the case of the silicon oxide film, the leakage current is relatively large in the low electric field region, and accordingly, deterioration of data retention performance is predicted.

On the other hand, in the case of aluminum oxide and hafnium, the tunneling current (leakage current) becomes small even in the high electric field region, while the leakage current is small in the low electric field region. Similarly, such property can be obtained in the high-k insulating film other than aluminum oxide and hafnium.

Meanwhile, in the operation of the write/erase, the density of current flowing through the tunnel insulating film should be about 0.1 $A/cm^2$. In the silicon oxide film and the silicon oxynitride film, this current density can be realized with an effective electric field of 15 MV/cm or less; however, in high-k materials such as aluminum oxide and hafnium, an effective electric field of 20 MV/cm or more is necessary to obtain current density of about 0.1 A/cm$^2$.

For this reason, when using the high-k material as the tunnel insulating film, high voltage must be applied to the MONOS structure during the write/erase operations. For the reason stated above, it is concluded that high-k materials are not appropriate as the tunnel insulating film.

In contrast, the silicon oxynitride film, in the high electric field region, realizes tunneling current density approximately equal to that of the silicon oxide film, and in the low electric field region, realizes leakage current density smaller than that of the silicon oxide film. That is, if using the silicon oxynitride film for the tunnel insulating film, it is possible to improve the write/erase property and the data retention property simultaneously.

Therefore, in the example of the present invention, the silicon oxynitride film is used for the tunnel insulating film.

Next, there will be discussed relation between composition of the silicon oxynitride film and the leakage current.

Figure 3:
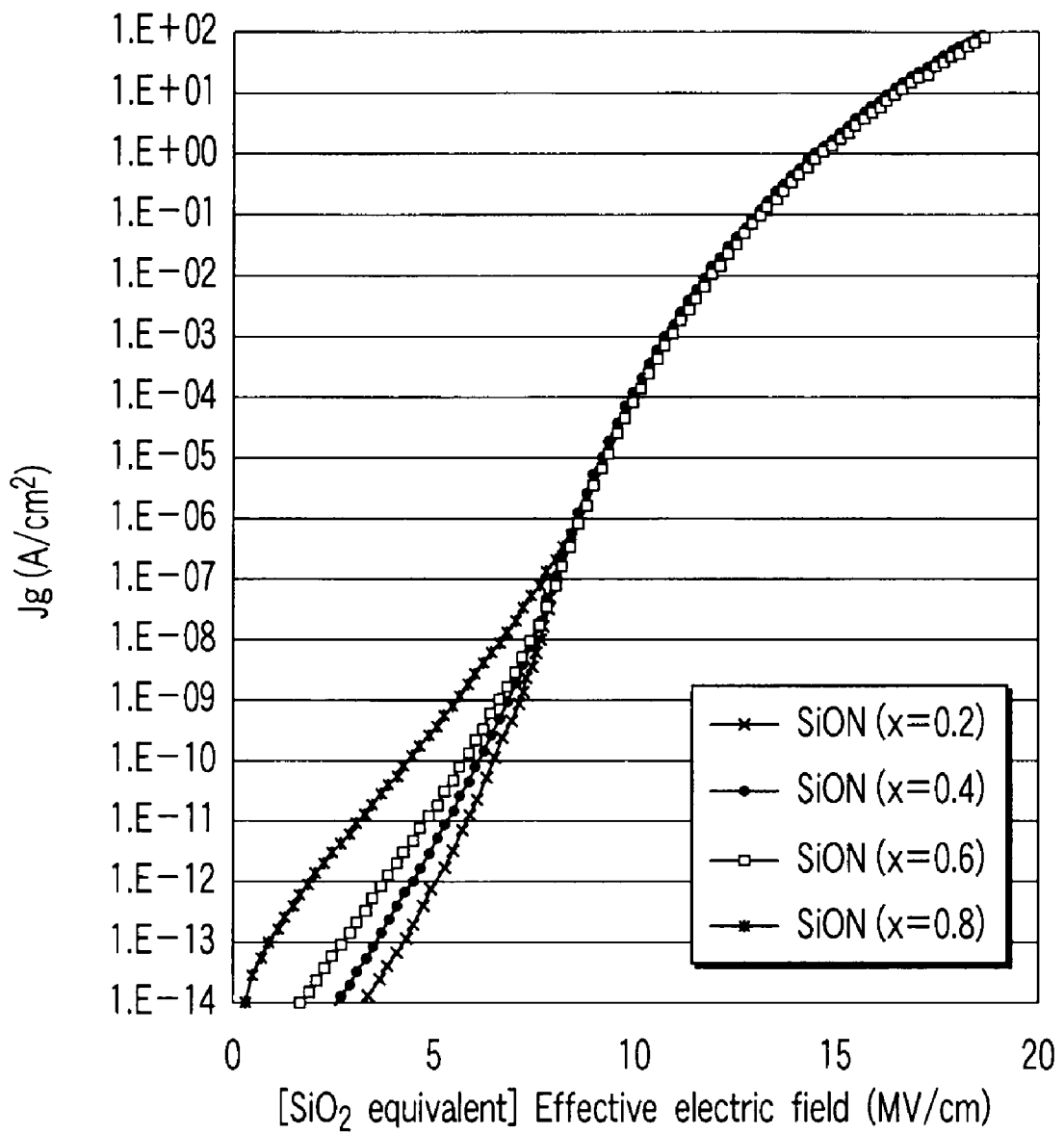
FIG. 3 is an explanatory figure showing dependence of the tunneling current on composition of the silicon oxynitride film.

FIG. 3 shows relation between composition of the silicon oxynitride film and the leakage current.

Composition of the silicon oxynitride film is described as $(SiO_2)_x(Si_3N_4)_{1-x}$, and compositional ratio x is set to be x=0.2, 0.4, 0.6, and 0.8. In addition, Equivalent Oxide Thickness (EOT) of the four samples is all 3 nm.

As is clear from FIG. 3, the tunneling current (leakage current) of the high electric field region is approximately constant regardless of composition of the silicon oxynitride film. In addition, the leakage current of the low electric field region tends to be reduced as the compositional ratio x becomes smaller. That is, the compositional ratio x of the silicon oxynitride film is preferably as small as possible.

Note that, in any compositional ratio, the leakage current in the low electric field region is sufficiently smaller than that of the silicon oxide film.

In this sense, there is no limitation in compositional range of the silicon oxynitride film, and thus, the compositional range of the silicon oxynitride film targeted by the example of the present invention is 0<x<1.

When describing the above comprehensively, the tunnel insulating film targeted by the example of the present invention is an insulating film whose principal constitutional element is Si, O, and N.

B. As for Relation Between Tunnel Insulating Film (SiON) and Charge Storage Layer Firstly, the electronic property using the silicon oxynitride film as the tunnel insulating film will be discussed.

It is known that when adding nitrogen to the silicon oxide film ($SiO_2$), band profile is changed. In this case, energy change of the conduction band edge (or change of the band offset of conduction band) is small, while the band offset of valence band is reduced substantially as the amount of introduced nitrogen increases (refer to, for instance, K. Muraoka, K. Kurihara, N. Yasuda and H. Satake, "Optimum structure of deposited ultrathin silicon oxynitride film to minimize leakage current," J. Appl. Phys. 94, 2038 (2003)).

This is because change of the band profile due to introduction of nitrogen is caused by the fact that the density of states originating from p orbitals of nitrogen atom is generated on the upper side of the valence band. This phenomenon, in which the band offset of the valence band is changed largely, should be taken into consideration when determining materials constituting the charge storage layer.

Thus, there will be discussed guideline of selecting the material of the charge storage layer of the MONOS type memory cell, when using the silicon oxynitride film as the tunnel insulating film.

The generally used silicon nitride film ($Si_3N_4$) as the charge storage layer can not sufficiently cope with future miniaturization of the memory cell. The reason is as follows.

Scaling becomes necessary also in the thickness direction of MONOS type gate stack structure accompanied by reduction of channel length of the memory cell. That is, in the MONOS type memory cell miniaturized, it becomes indispensable to reduce Equivalent Oxide Thickness (EOT) of the MONOS type gate stack structure. For this reason, decrease in Equivalent Oxide Thickness (EOT) of each layer of the MONOS type gate stack is required. Under these circumstances, decrease in Equivalent Oxide Thickness (EOT) of the charge storage layer is also required; however, Equivalent Oxide Thickness (EOT) of the silicon nitride film is relatively large.

Consequently, the charge storage layer is constituted from an insulating film (high-k insulating film) having dielectric constant higher than that of the silicon nitride film ($Si_3N_4$) to reduce Equivalent Oxide Thickness (EOT) of the charge storage layer.

In what follows, with respect to the case where the silicon oxynitride film is used as the tunnel insulating film and the high-k insulating film is used as the charge storage layer, there is performed optimization of electron properties of both the films. Its contention is two issues, i.e., the band profile and the trap energy level.

First, the band profile of the MONOS structure will be described.

The charge storage layer must perform capture and retention of the charge. For this reason, it is preferable that in the charge storage layer, as compared with the tunnel insulating film, both of the band offset of the conduction band (conduction band offset) and the band offset of the valence band (valence band offset) are small. In other words, the MONOS type memory cells, as a whole, have well-type potential (for instance, refer to Jpn. Pat. Appln. KOKAI Publication No. 2005-268756).

Here, "the band offset of the conduction band" indicates barrier height (barrier energy to electrons) of the conduction band of the insulating film while using the energy level of the conduction band edge of Si as a reference. In addition, "the band offset of the valence band" indicates barrier height (barrier energy to holes) of the valence band of the insulating film while using the energy level of the valence band edge of Si as a reference.

In the future MONOS type memory cell miniaturized, as described previously, it becomes necessary for the charge storage layer to be constituted from materials having high dielectric constant (high-k insulating film). Generally, there is a tendency that high-k insulating films have small conduction band offset and large valence band offset (for instance, refer to J. Robertson, "Band offsets of wide-band-gap oxides and implications for future electronic devices," J. Vac. Sci. Technol. B 18, 1785 (2000) FIG. 7).

On the other hand, in the silicon oxynitride film as the tunnel insulating film, as compared with the silicon oxide film (SiO2), the offset of the valence band substantially decreases. For this reason, as shown in area A of FIG. 4, in the case where the silicon oxynitride film as the tunnel insulating film is bonded to the high-k insulating film as the charge storage layer, the band offset of the valence band of the charge storage layer frequently becomes larger than the band offset of the valence band of the tunnel insulating film.

In this case, as shown in FIG. 5A, at the time of the erase operation of the MONOS type memory cell, the holes are hard to be injected into the charge storage layer from the Si substrate, and accordingly efficiency of the erase operation lowers. Note that the area A of FIG. 5A corresponds to the area A of FIG. 4.

Therefore, in the case where the tunnel insulating film is constituted from the SiON film, and the charge storage layer is constituted from the high-k insulating film, in order to improve performance of the MONOS type memory cell, particularly to improve performance of the erase operation, as shown in FIG. 5B, it becomes necessary to make the band offset of the valence band of the tunnel insulating film relatively lager than the band offset of the valence band of the charge storage layer.

As one of the important means for this purpose, in the example of the present invention, there is proposed a technique in which a high-k metal oxide based insulating film is used as the charge storage layer, and nitrogen is introduced therein.

Since nitrogen creates the density of states resulting from p-orbitals at upper side of the valence band edge, it is possible to raise the energy level of the valence band edge of the metal oxide based insulating film. That is, this is based on the principle similar to modulation of the band offset of the valence band in the case of introducing nitrogen into the silicon oxide film.

Next, the trap energy level as the second contention will be described. In the case where nitrogen is introduced into the high-k metal oxide in such a way as above, the trap energy level of the charge storage layer also changes, in addition to the band offset of the valence band. It is necessary to care about its adverse effects.

In what follows, there will be described about its adverse effects in detail. It is conceivable that charge capture of the high-k insulating film occurs due to various causes, and particularly, in an insulating film including Hf or Zr, defects caused by oxygen vacancy become the principal cause of the charge capture. With respect to this energy level of the oxygen vacancy defects, it is verified theoretically that the energy level is raised by introduction of nitrogen (for instance, refer to N. Umezawa, K. Shiraishi, T. Ohno, H. Watanabe, T. Chikyow, K. Torii, K. Yamabe, K. Yamada, H. Kitajima and T. Arikado, "First-principles studies of the intrinsic effect of nitrogen atoms on reduction in gate leakage current trough Hf-based high-k dielectrics," Appl. Phys. Lett. 86, 143507 (2005)).

According to this paper, for instance, the nitrogen atom introduced in $HfO_2$ causes interaction (coupling) with the oxygen vacancy and acquires electrons from the oxygen vacancy. Consequently, the oxygen vacancy becomes positively charged, and its energy level is raised.

When nitrogen concentration in $HfO_2$ is increased, and increment of the energy level caused by the oxygen vacancy becomes large, the energy level caused by the oxygen vacancy finally moves up into the conduction band of the insulating film. In this case, HfON results in a structure in which HfON does not have the oxygen vacancy defects in the band gap. Under such condition, since the principal cause of charge capture disappears, HfON can not be used as the charge storage layer in the MONOS type gate stack structure.

As understood from this example, in the case where SiON is used as the tunnel insulating film and the high-k metal oxide is used as the charge storage layer, accurate control of nitrogen amount introduced into the high-k metal oxide becomes extremely important.

That is, introduction of nitrogen into the charge storage layer is effective in order to obtain the MONOS type gate stack structure having the charge storage layer with small valence band offset. However, when incorporating too much nitrogen therein, the main cause of charge capture (trap) disappears, resulting in the adverse effect.

From the above, in the example of the present invention, the nitrogen-introduced high-k metal oxide is used as the charge storage layer, and optimum range of its nitrogen concentration is proposed.

(2) Description of Quantitative Principle

In what follows, there will be described quantitative principle in order to connect description of the above qualitative principle to composition of materials constituting the tunnel insulating film and the charge storage layer.

A. Quantitative Relation Between Composition of SiON Film and Band Offset of Valence Band Composition of the silicon oxynitride film and band offset have the following relation, while referring to, for instance, FIG. 8 of K. Muraoka, K. Kurihara, N. Yasuda and H. Satake, "Optimum structure of deposited ultrathin silicon oxynitride film to minimize leakage current," J. Appl. Phys. 94, 2038 (2003).

Dependence the band offset of the valence band on composition of the silicon oxynitride film is large.

Band offset of the valence band decreases with increase in nitrogen concentration. However, the band offset of the conduction band does not change significantly.

This is because, as described previously, the density of states is formed near the valence band edge due to introduction of nitrogen, and change of the valence band offset is generated principally.

Composition of the silicon oxynitride film can be represented by $(SiO_2)_x(Si_3N_4)_{1-x}$, ($0<x<1$) (for instance, refer to K. Muraoka, K. Kurihara, N. Yasuda, and H. Satake, "Optimum structure of deposited ultrathin silicon oxynitride film to minimize leakage current," J. Appl. Phys. 94, 2038 (2003)).

Ratio of nitrogen atoms to total number of atoms is provided by:

$$\frac{[N]}{[Si]+[O]+[N]} = \frac{4(1-x)}{7-4x} \quad (1)$$

It can be assumed that the band offset of the valence band changes linearly with respect to this quantity. This is because the valence band offset is determined by the density of states of nitrogen (amount of nitrogen to entirety).

In what follows, the band offset of the valence band is written as $\phi_V$.

Provided that the valence band offset of $SiO_2$ is $\phi_V(SiO_2)=4.5$ eV, and the valence band offset of $Si_3N_4$ is $\phi_V(Si_3N_4)=1.9$ eV, the band offset of the valence band of the silicon oxynitride film $(SiO_2)_x(Si_3N_4)_{1-x}$ is represented by:

$$\phi_v(SiON) = \phi_v(SiO_2) - \{\phi_v(SiO_2) - \phi_v(Si_3N_4)\}\frac{7}{4}\frac{[N]}{[Si]+[O]+[N]} \quad (2)$$

that is, $$\phi_v(x) = 4.5 - 2.6\frac{7(1-x)}{7-4x} \text{ (eV)} \quad (3)$$

Note that, coefficient (7/4) in the second term of the right-hand side in the formula (2) is a normalization factor.

Figure 8:
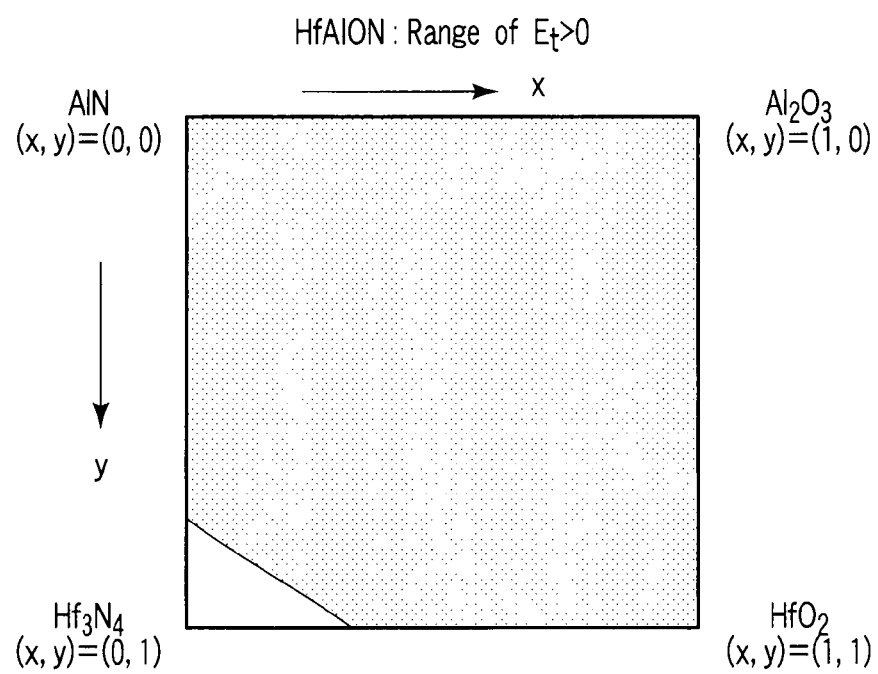
FIG. 8 is a view showing the compositional range when a trap level exists within a band gap in the case where HfAlON is used for the charge storage layer.
Figure 9:
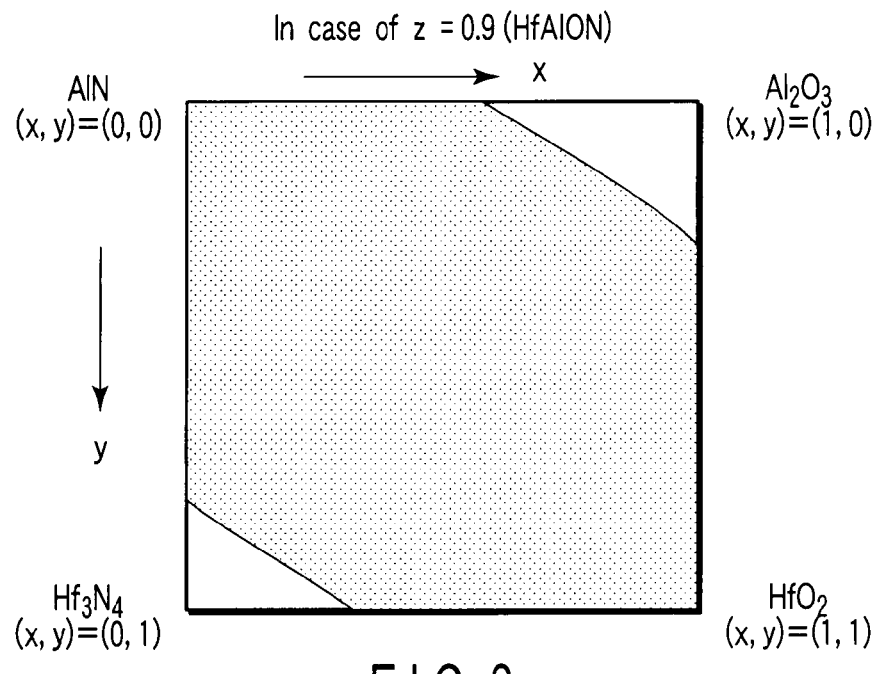
FIG. 9 is a view showing an appropriate compositional range when HfAlON is used for the charge storage layer.
Figure 10:
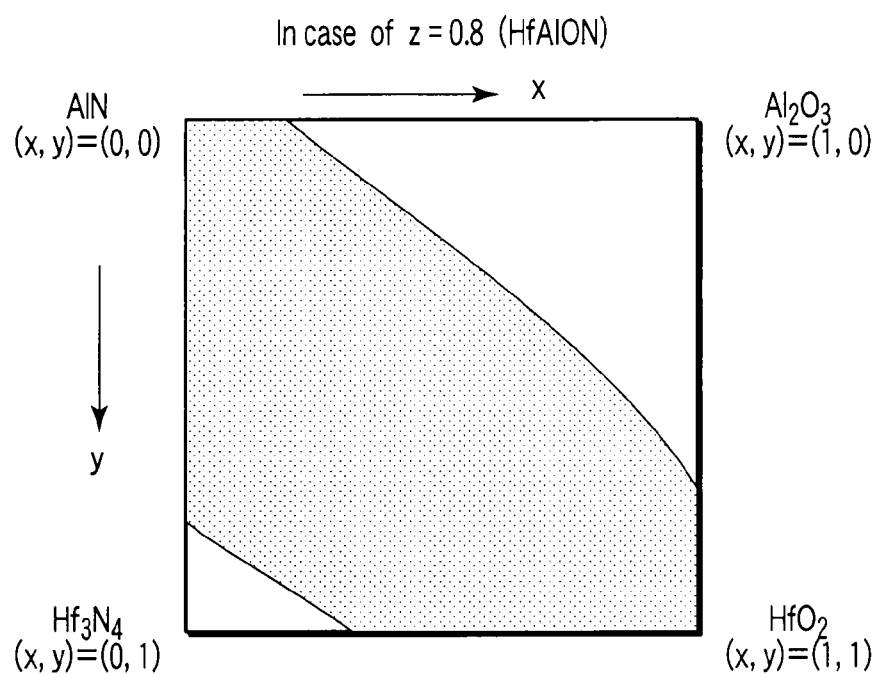
FIG. 10 is a view showing an appropriate compositional range when HfAlON is used for the charge storage layer.
Figure 11:
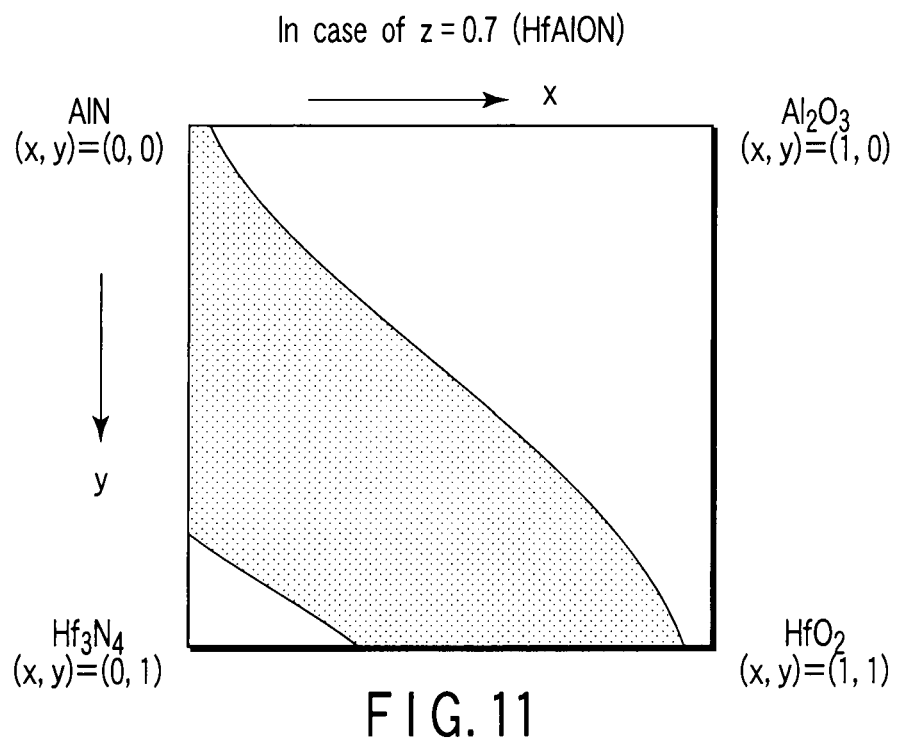
FIG. 11 is a view showing an appropriate compositional range when HfAlON is used for the charge storage layer.
Figure 12:
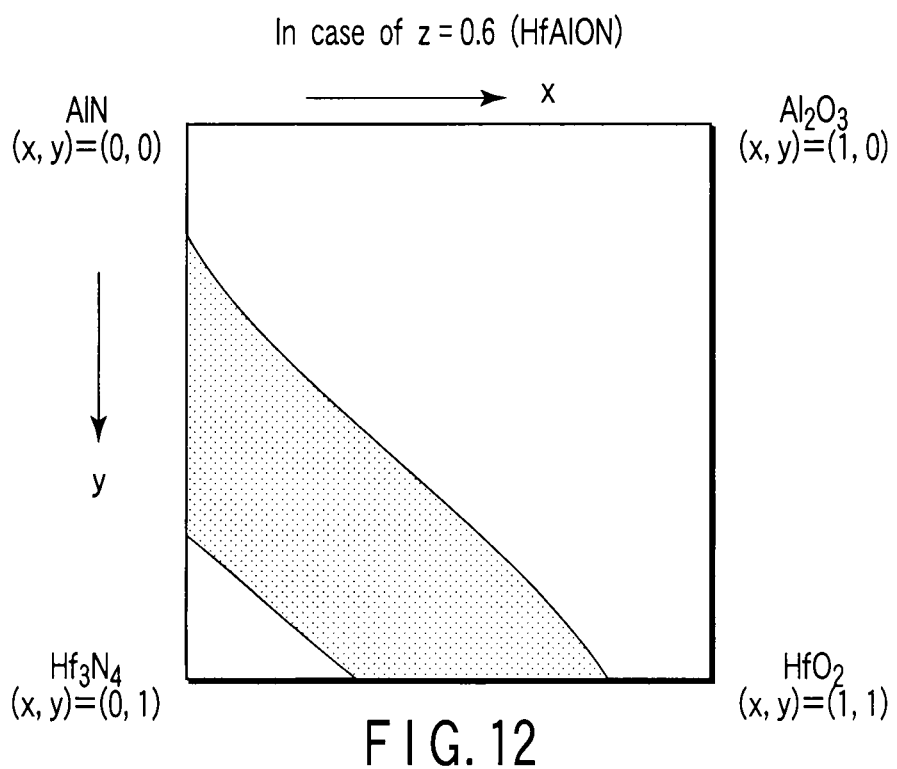
FIG. 12 is a view showing an appropriate compositional range when HfAlON is used for the charge storage layer.

When comparing the valence band offset of the formula (3) with experimental data of FIG. 8 of K. Muraoka, K. Kurihara, N. Yasuda and H. Satake, "Optimum structure of deposited ultrathin silicon oxynitride film to minimize leakage current," J. Appl. Phys. 94, 2038 (2003), the graph shown in FIG. 6 is obtained.

Figure 6:
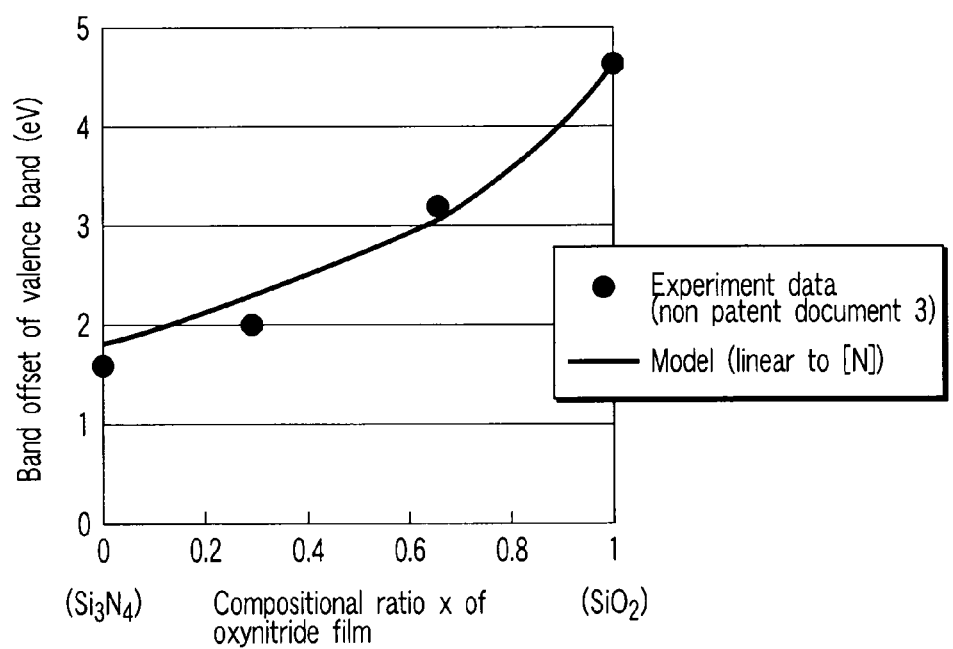
FIG. 6 is an explanatory figure showing a theoretical value and an experimental value of a band offset of a valence band of the silicon oxynitride film.

From FIG. 6, it is found that both favorably coincide with each other. This indicates that the model assumed here is correct.

Consequently, in the example of the present invention, the formula (3) is used as expression of the valence band offset of the silicon oxynitride film.

B. As for Method for Deriving Compositional Ratio of SiON Film from Measured Quantity Here, there will be described about a method for determining compositional ratio x of the silicon oxynitride film $(SiO_2)_x(Si_3N_4)_{1-x}$ as the tunnel insulating film (first insulating film) by using measured quantity.

It is well known that the silicon oxynitride film is expressed by binary pseudo-alloy model of $(SiO_2)_x(Si_3N_4)_{1-x}$ (for instance, refer to S. V. Hattangady, H. Niimi and G. Lucovsky, "Integrated processing of silicon oxynitride films by combined plasma and rapid-thermal processing," J. Vac. Sci. Technol. A 14, 3017 (1996)).

In this case, when atomic percent of Si, O and N atoms is expressed by compositional ratio x, percentage of each atom becomes as follows.

Si:(3−2x)/(7−4x)*100(%)     (a)

O:2x/(7−4x)*100(%)     (b)

N:4(1−x)/(7−4x)*100(%)     (c)

Figure 5:
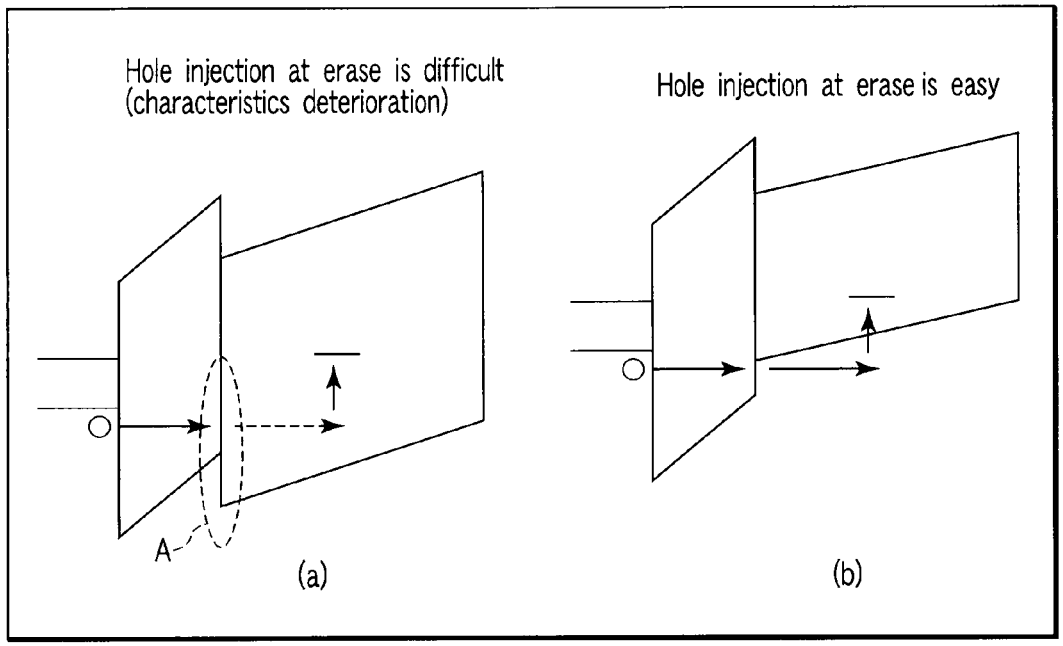
FIG. 5 is an explanatory figure showing difference in erase efficiency due to the band profile between the tunnel insulating film and the charge storage layer.

Note that, in FIG. 5 of S. V. Hattangady, H. Niimi and G. Lucovsky, "Integrated processing of silicon oxynitride films by combined plasma and rapid-thermal processing," J. Vac. Sci. Technol. A 14, 3017 (1996)), atomic percent of Si, O and N atoms expressed by the above formulas is illustrated as a function of the compositional ratio x.

Meanwhile, in a certain measuring method, if any one of atomic percent of Si, O and N atoms is found, it is possible to calculate compositional ratio x of the silicon oxynitride film using the formulas (a), (b), and (c).

In addition, in Auger Electron Spectroscopy (AES), X-ray Photoelectron Spectroscopy (XPS) or the like, in some cases, ratio [N]/[O] between nitrogen atom and oxygen atom is evaluated. In that case, it is possible to obtain the compositional ratio x using the formula:

$$x = \frac{2}{2 + [N]/[O]}$$

C. Quantitative Relation Between Composition of HfON Film and Band Offset of Valence Band Next, there is performed formulation of relation between the band offset of the valence band and compositional ratio in the case where the charge storage layer is a hafnium oxynitride film.

Composition of the hafnium oxynitride film is expressed by $(HfO_2)_y(Hf_3N_4)_{1-y}$, (0<y<1).

Here, composition of the hafnium nitride film is not HfN as a metallic material, but $Hf_3N_4$ as an insulator.

Nitrogen introduced into the hafnia ($HfO_2$) has the density of states within energy range from the valence band edge up to approximately 1.1 eV above it. In addition, the valence band offset $\phi_V$ of $HfO_2$ (compositional ratio y=1) is $\phi_V(HfO_2)$=3.3 eV. From these facts, the valence band offset $\phi_V(Hf_3N_4)$, when nitrogen concentration is maximum (compositional ratio y=0), results in $\phi_V(Hf_3N_4)$=2.2 eV (for instance, refer to G. Shang, P. W. Peacock and J. Robertson, "Stability and band offsets of nitrogenated high-dielectric-constant gate oxides," Appl. Phys. Lett. 84, 108 (2004)).

Next, the valence band offset of the hafnium oxynitride film is formulated where compositional ratio y falls in the range of 0 to 1.

It is assumed that the valence band offset changes linearly with respect to ratio of nitrogen atoms in the hafnium oxynitride film. This is the same way of thinking as in the case of silicon oxynitride film.

Ratio of nitrogen atoms to total number of atoms in this case is represented by:

$$\frac{[N]}{[Hf] + [O] + [N]} = \frac{4(1-y)}{7-4y} \quad (4)$$

Therefore, the valence band offset of the hafnium oxynitride film can be formulated as a function of the compositional ratio y:

$$\phi_V(HfON) = \phi_V(HfO_2) - \{\phi_V(HfO_2) - \phi_2(Hf_3N_4)\}\frac{7}{4}\frac{[N]}{[Hf]+[O]+[N]} \quad (5)$$

or $$\phi_V(y) = 3.3 - 1.1\frac{7(1-y)}{7-4y} \quad (6)$$

D. Energy Level of Oxygen Vacancy Defects of HfON Film

Next, in the case where the charge storage layer is the hafnium oxynitride film (HfON), there will be discussed how the energy level of the oxygen vacancy defects depends on nitrogen concentration.

Firstly, the energy level of the oxygen vacancy defects of hafnia ($HfO_2$) has depth of approximately 2.0 eV from the conduction band edge of hafnia, while referring to, for instance, FIG. 2 (energy level of neutral oxygen vacancy ($V_o^0$)) of K. Xiong, J. Robertson, M. C. Gibson and S. J. Clark, "Defect energy levels in $HfO_2$ high-dielectric-constant gate oxide," Appl. Phys. Lett. 87, 183505 (2005).

In addition, with respect to change of the energy level of the oxygen vacancy defects when nitrogen is introduced into hafnia, reference is made to FIG. 2 of H. Momida, T. Hamada, T. Yamamoto, T. Uda, N. Umezawa, T. Chikyow, K. Shiraishi and T. Ohno, "Effects of nitrogen atom doping on dielectric constants of Hf-based gate oxides," Appl. Phys. Lett. 88, 112903 (2006), for instance.

According to H. Momida, T. Hamada, T. Yamamoto, T. Uda, N. Umezawa, T. Chikyow, K. Shiraishi and T. Ohno, "Effects of nitrogen atom doping on dielectric constants of Hf-based gate oxides," Appl. Phys. Lett. 88, 112903 (2006), difference in oxygen vacancy defect ($V_o$) level before and after introducing nitrogen into a Hf-based insulating film becomes approximately 2.4 eV.

This indicates the fact that, when introducing nitrogen, $V_o$ level increases in accordance with the amount of incorporated nitrogen.

Meanwhile, in calculation of H. Momida, T. Hamada, T. Yamamoto, T. Uda, N. Umezawa, T. Chikyow, K. Shiraishi and T. Ohno, "Effects of nitrogen atom doping on dielectric constants of Hf-based gate oxides," Appl. Phys. Lett. 88, 112903 (2006), the insulating film is made of not pure hafnia, but of hafnium-silicate doped with Si. However, since increase in energy level due to oxygen vacancy ($V_o$) is primarily influenced by the interaction between $V_o$ and nitrogen, the increment in the oxygen vacancy defect energy level in the case where insulating film material is changed from oxide to nitride should always be approximately 2.4 eV, regardless of the presence of added substance of metal or semiconductor to the insulating film material.

This is because, as discussed in N. Umezawa, K. Shiraishi, T. Ohno, H. Watanabe, T. Chikyow, K. Torii, K. Yamabe, K. Yamada, H. Kitajima and T. Arikado, "First-principles studies of the intrinsic effect of nitrogen atoms on reduction in gate leakage current trough Hf-based high-k dielectrics," Appl. Phys. Lett. 86, 143507 (2005)), when nitrogen is introduced, nitrogen atom adjacent to $V_o$ captures electrons from the oxygen vacancy ($V_o$) to charge the oxygen vacancy ($V_o$) positively, and as a result, rise in the energy level of the oxygen vacancy defects occurs.

Therefore, the energy level of the oxygen vacancy defects equally changes in accordance with the amount of introduced nitrogen, and results in energy difference of approximately 2.4 eV between the oxide and the nitride, in the case of hafnia as well as other Hf-based insulating films (HfSiO, HfAlO or the like).

Based on the above result, dependence of the energy level due to oxygen vacancy on the compositional ratio of the hafnium oxynitride film is formulated.

Provided that composition of the hafnium oxynitride film is $(HfO_2)_y(Hf_3N_4)_{1-y}$, ratio of nitrogen atoms to total number of atoms, like the above formula (4), is represented by:

$$[N]/([Hf]+[O]+[N])=4(1-y)/(7-4y).$$

It is assumed that the energy level of the oxygen vacancy defect changes linearly with respect to this quantity. It is also assumed that the energy level due to the oxygen vacancy, in the case of pure hafnia ($HfO_2$: y=1) not including nitrogen, exists at depth of $E_t(HfO_2)=2.0$ eV relative to the energy level of the conduction band edge, based on calculation of K. Xiong, J. Robertson, M. C. Gibson and S. J. Clark, "Defect energy levels in $HfO_2$ high-dielectric-constant gate oxide," Appl. Phys. Lett. 87, 183505 (2005). In addition, it is assumed that $V_o$ level changes by $E_t(Hf_3N_4)-E_t(HfO_2)=-2.4$ eV corresponding to the compositional change from y=1 to y=0 due to introduction of nitrogen. This is based on the result of H. Momida, T. Hamada, T. Yamamoto, T. Uda, N. Umezawa, T. Chikyow, K. Shiraishi and T. Ohno, "Effects of nitrogen atom doping on dielectric constants of Hf-based gate oxides," Appl. Phys. Lett. 88, 112903 (2006). Note that the minus symbol indicates rise of the level since the energy level is measured toward deep side.

Therefore, depth of the energy level of the oxygen vacancy defects in the hafnium oxynitride film $(HfO_2)_y(Hf_3N_4)_{1-y}$, when the energy level of the conduction band edge is used as a reference is represented by:

$$E_t(HfON) = E_t(HfO_2) - \{E_t(HfO_2) - E_t(Hf_3N_4)\}\frac{7}{4}\frac{[N]}{[Hf]+[O]+[N]} \quad (7)$$

or $$\varepsilon_t(y) = 2.0 - 2.4\frac{7(1-y)}{7-4y} \text{ (eV)} \quad (8)$$

As found from the formula (8), when introducing nitrogen (when reducing y), the trap energy level becomes $\in_t<0$ in the region where compositional ratio exceeds a critical value, so that the energy level of the oxygen vacancy defects falls in the conduction band of the hafnium oxynitride film.

Critical composition at this time is y=0.32 by setting the energy level to $\in_t=0$ in the formula (8).

Therefore, in the example of the present invention, compositional ratio of the hafnium oxynitride film is restricted within the range of y>0.32. This can cause a trap level to exist within a band gap of the charge storage layer of the MONOS type memory cell.

E. As for Method for Deriving Compositional Ratio of HfON Film from Measured Quantity There will be described a method for determining the compositional ratio y of the HfON film $(HfO_2)_y(Hf_3N_4)_{1-y}$ as the charge storage layer from the measured quantity.

HfON film is expressed by binary pseudo-alloy model in which $HfO_2$ is used as component of oxide, and $Hf_3N_4$ is used as component of nitride (for instance, refer to G. Shang, P. W. Peacock and J. Robertson, "Stability and band offsets of nitrogenated high-dielectric-constant gate oxides," Appl. Phys. Lett. 84, 108 (2004)).

When atomic percent of Hf, O and N atoms is expressed by compositional ratio y, each atomic percent becomes as follows.

$$Hf:(3-2y)/(7-4y)*100(\%) \quad (d)$$

$$O:2y/(7-4y)*100(\%) \quad (e)$$

$$N:4(1-y)/(7-4y)*100(\%) \quad (f)$$

Meanwhile, if any one of atomic percent of Hf, O and N atoms is found in a certain measuring method, it is possible to calculate compositional ratio y of the HfON film using any one of the formulas (d), (e), and (f).

In addition, in Auger Electron Spectroscopy (AES), X-ray Photoelectron Spectroscopy (XPS) or the like, after confirming that principal components of the substance to be measured are Hf, O, and N, it is possible to obtain the compositional ratio y from the ratio [N]/[O] between nitrogen atom and oxygen atom using the formula:

$$y = \frac{2}{2+[N]/[O]}.$$

F. Quantitative Relation Between Composition of HfAlON Film and Valence Band Offset Next, there will be discussed the band offset of the valence band when the charge storage layer is hafnium-aluminate oxynitride.

This four-element insulating material can be represented, by using a compositional index x representing the oxidized degree and a compositional index y of the insulating film including Hf, by:

$$[(HfO_2)_x(Hf_3N_4)_{1-x}]_y[(Al_2O_3)_x(AlN)_{1-x}]_{1-y}$$

Therefore, compositional coordinate (x, y) determines the electronic property of this material.

With respect to change of the valence band offset due to introduction of nitrogen, as described in G. Shang, P. W. Peacock and J. Robertson, "Stability and band offsets of nitrogenated high-dielectric-constant gate oxides," Appl. Phys. Lett. 84, 108 (2004)), the band offset increases by about 1.1 eV when composition changes from the oxide to the nitride, regardless of kind of the high-k metal oxide.

In addition, according to G. Shang, P. W. Peacock and J. Robertson, "Stability and band offsets of nitrogenated high-dielectric-constant gate oxides," Appl. Phys. Lett. 84, 108

(2004)), and A. Chin, C. C. Laio, C. Chen, K. C. Chiang, D. S. Yu, W. J. Yoo, G. S. Samudra, T. Wang, I. J. Hsieh, S. P. McAlister and C. C. Chi, "Low Voltage High Speed SiO$_2$/AlGaN/AlLaO$_3$/TaN memory with Good Retention," IEDM Tech. Dig. pp. 165 to 168 (2005), the valence band offsets of HfO$_2$, Hf$_3$N$_4$, Al$_2$O$_3$, and AlN are $\phi_V$(HfO$_2$)=3.3 eV, $\phi_V$(Hf$_3$N$_4$)=2.2 eV, $\phi_V$(Al$_2$O$_3$)=4.2 eV and $\phi_V$(AlN)=3.1 eV, respectively.

These are the valence band offsets corresponding to the compositional coordinates (x, y)=(1, 1), (0, 1), (1, 0), (0, 0).

Next, there will be discussed the valence band offset for arbitrary compositional coordinate (x, y).

Firstly, paying attention to the fact that the compositional index of the oxide is x=1, the valence band offset in the case where the material is complete oxide (HfO$_2$)$_y$(Al$_2$O$_3$)$_{1-y}$ is represented by:

$$\phi_v(\text{HFAlO}) = y\phi_v(\text{HfO}_2) + (1-y)\phi_v(\text{Al}_2\text{O}_3) \quad (9)$$

or $$\phi_v(\text{HfAlO}) = 3.3y + 4.2(1-y)(\text{eV}) \quad (10).$$

Note that linear relation of the valence band offset to a compositional index y is assumed here.

Next, like the previously described examples, it is conceivable that the valence band offset changes linearly with respect to the ratio of the nitrogen atom to total number of atoms. This is because the valence band offset is determined by the density of states of nitrogen.

Now, an atomic number ratio of Hf, Al, O, N in the material is obtained as follows:

$$[\text{Hf}]:[\text{Al}]:[\text{O}]:[\text{N}] = (3-2x)y:(1+x)(1-y):x(3-y):(1-x)(1+3y) \quad (11)$$

Then, the ratio of the nitrogen atoms to the total number of atoms becomes as follows:

$$\frac{[N]}{[Hf]+[Al]+[O]+[N]} = \frac{(1-x)(1+3y)}{(3-2x)y+(1+x)(1-y)+x(3-y)+(1-x)(1+3y)} \quad (12)$$

Here, as shown in G. Shang, P. W. Peacock and J. Robertson, "Stability and band offsets of nitrogenated high-dielectric-constant gate oxides," Appl. Phys. Lett. 84, 108 (2004), it is noted that the valence band offset of the complete nitride is always higher by 1.1 eV than that of the complete oxide in any high-k materials.

As a particular case, considering the limit where this material is the complete nitride (Hf$_3$N$_4$)$_y$(AlN)$_{1-y}$, $$\frac{[N]}{[Hf]+[Al]+[N]} = \frac{1+3y}{2+5y} \quad (13)$$

is obtained in the formula (12), putting x to x=0.

Therefore, the valence band offset of the hafnium-aluminate oxynitride (HfAlON) for arbitrary compositional ratio (x, y) is represented, by using the normalization factor of the formula (13), as follows:

$$\phi_v(\text{HfAlON}) = \quad (14)$$
$$3.3y + 4.2(1-y) - 1.1 \frac{(1-x)(1+3y)}{\left(\frac{1+3y}{2+5y}\right)\{(3-2x)y+(1+x)(1-y)+x(3-y)+(1-x)(1+3y)\}} (\text{eV})$$

G. Relation Between Composition of HfAlON Film and Energy Level of Oxygen Vacancy Defect Next, there will be discussed the trap energy level caused by the oxygen vacancy in the hafnium-aluminate oxynitride.

Like the previous discussion, this four-element insulating material is represented, by using a compositional index x representing the oxidized degree and a compositional index y of the insulating film including Hf, as follows:

$$[(\text{HfO}_2)_x(\text{Hf}_3\text{N}_4)_{1-x}]_y[(\text{Al}_2\text{O}_3)_x(\text{AlN})_{1-x}]_{1-y}$$

Trap level caused by the oxygen vacancy is determined corresponding to the compositional coordinate (x, y).

In the case of aluminum oxynitride (Al$_2$O$_3$)$_x$(AlN)$_{1-x}$ where compositional ratio y is y=0, increase in trap level, just as the case of hafnium oxynitride ((HfO$_2$)$_x$(Hf$_3$N$_4$)$_{1-x}$) of y=1, is expected although the calculation data is not necessarily sufficient. The expectation is based on the fundamentals that charge supply to nitrogen from the oxygen vacancy is the principal cause of the increase in defect energy level.

According to K. Xiong, J. Robertson, M. C. Gibson and S. J. Clark, "Defect energy levels in HfO$_2$ high-dielectric-constant gate oxide," Appl. Phys. Lett. 87, 183505 (2005), and K. Matsunaga, T. Tanaka, T. Yamamoto, Y. Ikuhara, "First-principles calculations of intrinsic defects in Al$_2$O$_3$," Phys. Rev. B 68, 085110 (2003), the trap energy levels caused by oxygen vacancies in HfO$_2$ and Al$_2$O$_3$, both being the complete oxides, are $E_t$(HfO$_2$)=2 eV, and $E_t$(Al$_2$O$_3$)=4 eV, respectively.

Here, the oxygen vacancy defect level in Al$_2$O$_3$ is in depth of 3.6 eV from the conduction band edge, if utilizing the result of H. Momida, T. Hamada, T. Yamamoto, T. Uda, N. Umezawa, T. Chikyow, K. Shiraishi and T. Ohno, "Effects of nitrogen atom doping on dielectric constants of Hf-based gate oxides," Appl. Phys. Lett. 88, 112903 (2006) as it is. However, in this calculation, the band gap of Al$_2$O$_3$ is 6 eV, while the band gap of Al$_2$O$_3$ actually used in the MONOS type gate stack structure is about 7 eV ($\gamma$-Al$_2$O$_3$, after crystallization). Thus, it is necessary to correct the band gap.

Assuming that the trap level should also be corrected in proportion to the band gap, the trap level of Al$_2$O$_3$ due to the oxygen vacancy should be depth of about 4.2 eV from the conduction band edge.

Thus, the energy level of the oxygen vacancy defect in Al$_2$O$_3$ is expected to exist in depth of approximately 4 eV from the conduction band edge, although there may be slight differences depending on the estimating method.

Summarizing the above results, the energy level of the oxygen vacancy defect for the complete oxide (HfO$_2$)$_y$(Al$_2$O$_3$)$_{1-y}$ becomes as follows:

$$E_t(\text{HFAlO}) = yE_t(\text{HfO}_2) + (1-y)E_t(\text{Al}_2\text{O}_3) \quad (15)$$

or $$\phi_v(\text{HfAlO}) = 2y + 4(1-y)(\text{eV}) \quad (16)$$

Further, when considering the fact that changing the material from oxide to nitride increases the oxygen vacancy level by 2.4 eV, the energy level of the oxygen vacancy defect for the hafnium-aluminate oxynitride film of arbitrary composition (x, y) is represented as follows:

$$E_t(HfAlON) = 2y + 4(1-y) - 2.4 \frac{(1-x)(1+3y)}{\left(\frac{1+3y}{2+5y}\right)\{(3-2x)y + (1+x)(1-y) + x(3-y) + (1-x)(1+3y)\}} \quad (17)$$

Note that, $E_t$ is set to be $E_t>0$ when the conduction band edge is used as a reference point and the trap level is deeper (energy is low) than the reference point.

H. As for Method of Deriving Compositional Ratio (x, y) of HfAlON Film from Measured Quantity Here, indicated is a method for deriving compositional ratio (x, y) of the four-element insulating material $[(HfO_2)_x(Hf_3N_4)_{1-x}]_y[(Al_2O_3)_x(AlN)_{1-x}]_{1-y}$ from quantity which can be evaluated experimentally.

As described previously, in this four-element insulating material, relation of the formula (11) is established.

Consequently, provided that an atomic number ratio of Al to Hf in the charge storage layer is defined as $R_{ah}=[Al]/[Hf]$, and further an atomic number ratio of N and O is defined as $R_{no}=[N]/[O]$, $$R_{ah} = \frac{[Al]}{[Hf]} = \frac{(1+x)(1-y)}{(3-2x)y} \quad (18)$$

$$R_{no} = \frac{[N]}{[O]} = \frac{(1-x)}{(1+3y)} \quad (19)$$

are established.

From these two formulas, compositional ratio y of the insulating film including Hf is represented by an equation of:

$$Ay^2 + By + C = 0 \quad (20)$$

in which respective coefficients A, B and C are as follows:

$$A = -3R_{ah}R_{no} + 3R_{ah} - R_{no} + 6 \quad (21)$$

$$B = 9R_{ah}R_{no} + R_{ah} + 4R_{no} - 4 \quad (22)$$

$$C = -(3R_{no} + 2). \quad (23)$$

Then, the equation is resolved and solution is obtained as follows:

$$y = \frac{-B + \sqrt{B^2 - 4AC}}{2A} \quad (24)$$

In addition, the compositional ratio x as the oxidation index of this four-element insulating material becomes as follows:

$$x = \frac{1}{1 + R_{no}\frac{3-y}{1+3y}} \quad (25)$$

I. Quantitative Relation Between Composition of HfSiON Film and Valence Band Offset Next, there will be discussed the valence band offset of the hafnium-silicate oxynitride (HfSiON).

This four-element insulating material can be represented, by using a compositional index x representing the oxidized degree and a compositional index y of the insulating film including Hf, by:

$[(HfO_2)_x(Hf_3N_4)_{1-x}]_y[(SiO_2)_x(Si_3N_4)_{1-x}]_{1-y}.$

Electronic property of this material is determined corresponding to compositional coordinate (x, y).

The valence band offsets of $HfO_2$, $Hf_3N_4$, $SiO_2$ and $Si_3N_4$ are $\phi_v(HfO_2)=3.3$ eV, $\phi_v(Hf_3N_4)=2.2$ eV, $\phi_v(SiO_2)=4.5$ eV and $\phi_v(Si_3N_4)=1.9$ eV, respectively. These values correspond to the compositional coordinates (x, y)=(1, 1), (0, 1), (1, 0), (0, 0), respectively.

The valence band offset for the arbitrary composition (x, y) meets the valence band offset of these reference points, and changes in proportion to ratio of the number of nitrogen atoms to the total number of atoms. The ratio of Hf, Si, O, N in the composition (x, y) is as follows:

$[Hf]:[Si]:[O]:[N]=(3-2x)y:(3-2x)(1-y):2x:4(1-x). \quad (26)$

Therefore, the ratio of the nitrogen atoms to the total number of atoms is represented as follows:

$$\frac{[N]}{[Hf]+[Si]+[O]+[N]} = \frac{4(1-x)}{(3-2x)y+(3-2x)(1-y)+2x+4(1-x)} \quad (27)$$

$$= \frac{4(1-x)}{7-4x}$$

In addition, the valence band offset in the hafnium silicate $(HfO_2)_y(SiO_2)_{1-y}$, being the complete oxide (x=1), is proportional to its composition, and is represented by:

$\phi_v(HfSiO) = y\phi_v(HfO_2) + (1-y)\phi_v(SiO_2) \quad (28)$ or $\phi_v(HfSiO) = 3.3y + 4.5(1-y)(eV). \quad (29)$ When summarizing the above discussions, the valence band offset of the hafnium-silicate oxynitride is represented by:

$$\phi_v(HfSiON) = 3.3y + 4.5(1-y) - \{1.1y + 2.6(1-y)\}\frac{7(1-x)}{7-4x}(eV) \quad (30)$$

Here, coefficient $\{1.1y+2.6(1-y)\}$ of the third term of the right hand side of the formula (30) indicates the difference in valence band offset between the oxide and the nitride. In the insulating material including Hf ($HfO_2 \rightarrow Hf_3N_4$ (y=1)), this difference is 1.1 eV; in the silicon oxynitride film ($SiO_2 \rightarrow Si_3N_4$ (y=0)), this difference is 2.6 eV.

J. Quantitative Relation Between Composition of HfSiON Film and Energy Level of Oxygen Vacancy Defect Next, there will be discussed the trap level caused by the oxygen vacancy in hafnium-silicate oxynitride (HfSiON).

Just as the previous discussion, the four-element insulating material can be represented, by using a compositional index x representing the oxidized degree and a compositional index y of the insulating material including Hf, by:

$[(HfO_2)_x(Hf_3N_4)_{1-x}]_y[(SiO_2)_x(Si_3N_4)_{1-x}]_{1-y}.$

Trap level caused by the oxygen vacancy is determined in accordance with the compositional coordinate (x, y).

Since increase in the energy level of the oxygen vacancy defects due to introduction of nitrogen is caused by supply of charges (electrons) to the nitrogen from the oxygen vacancy, the trap level increases in proportion to the density of states of nitrogen (ratio of the nitrogen atoms to the total number of atoms).

Firstly, there is considered about the case where the compositional ratio y of the insulating material including Hf is at the limit of y=0, that is, about the oxygen vacancy defect of the silicon oxynitride film.

In this case, substance of "oxygen vacancy defect" is regarded as Si dangling bond.

Besides, the Si dangling bond in the silicon oxynitride film and the oxygen vacancy defect can be recognized as a common concept in a sense that O atom or N atom is missing, and in addition, the Si dangling bond becomes the dominant defect from a quantitative standpoint.

In this case, for the silicon nitride film in which composition (x, y) is (x, y)=(0, 0), depth of the Si dangling bond from the conduction band edge of the insulating material is about $E_t(Si_3N_4)=2.0$ eV. In addition, for the silicon oxide film in which composition (x, y) is (x, y)=(1, 0), depth of the Si dangling bond from the conduction band edge of the insulating material is about $E_t(SiO_2)=3.8$ eV.

Note that it is assumed that a defect level exists near the center of the Si band gap for the latter.

In addition, when the compositional ratio y of the insulating material including Hf is at the limit of y=1, that is, when the insulating material including Hf is the hafnium oxynitride film $(HfO_2)_x(Hf_3N_4)_{1-x}$, $E_t(HfON)$ is represented by:

$$E_t(HfON)=2.0-2.4*7(1-x)/(7-4x)(eV),$$

which is the same as the formula (8).

When summarizing the above discussions, the trap level (or the defect level of the Si dangling bond) of the oxygen vacancy for arbitrary composition (x, y) of the hafnium-silicate oxynitride, while setting the conduction band edge as a reference level, can be represented by:

$$E_t(HfSiON) = 2.0y + 3.8(1-y) - \{2.4y + 1.8(1-y)\}\frac{7(1-x)}{7-4x}(eV) \quad (31)$$

Note that positive direction is taken as the direction becoming deep in terms of energy.

Coefficient $\{2.4y+1.8(1-y)\}$ of the third term of the right hand side of the formula (31) indicates the difference in energy depth of the defect level between the oxide and the nitride. In the insulating material including Hf $(HfO_2 \rightarrow Hf_3N_4$ (y=1)), this difference is 2.4 eV; in the complete silicon oxynitride film $(SiO_2 \rightarrow Si_3N_4$ (y=0)), this difference is 1.8 eV.

K. As for Method of Deriving Compositional Ratio (x, y) of HfSiON Film from Measured Quantity Next, there is shown a method for deriving compositional ratio (x, y) of the four-element insulating material $[(HfO_2)_x(Hf_3N_4)_{1-x}]_y[(SiO_2)_x(Si_3N_4)_{1-x}]_{1-y}$ from quantity which can be evaluated experimentally.

As described previously, in this four-element insulating material, relation of the formula (26) is established with respect to atomic number ratio of the respective elements. Consequently, provided that an atomic number ratio of Si and Hf in the charge storage layer constituted from HfSiON is defined as $R_{sh}$=[Si]/[Hf], and further the atomic number ratio of N and O is defined as $R_{no}$=[N]/[O], $$R_{sh} = \frac{[Si]}{[Hf]} = \frac{(3-2x)(1-y)}{(3-2x)y} = \frac{1-y}{y} \quad (32)$$

$$R_{no} = \frac{[N]}{[O]} = \frac{4(1-x)}{2x} \quad (33)$$

are established.

Therefore, from the evaluated value of $R_{sh}$, $$y = \frac{1}{1+R_{sh}} \quad (34)$$

is obtained, and from the evaluated value of $R_{no}$, $$x = \frac{1}{1+\frac{R_{no}}{2}} \quad (35)$$

is obtained.

(3) Compositional Range

Based on the above quantifications, desirable compositional range of the tunnel insulating film and the charge storage layer in the present invention will be indicated below.

A. Desirable Compositional Range in the Case where Charge Storage Layer is HfON

When a relational expression $\phi_V(SiON) > \phi_V(HfON)$ to be met by the valence band offset is introduced, while using the formulas (1) and (2) relating to the valence band offset of the silicon oxynitride film as the tunnel insulating film, and using the formulas (4) and (5) relating to the valence band offset of the hafnium oxynitride film as the charge storage layer, a relational expression to be met by the compositional ratio x of the silicon oxynitride film $(SiO_2)_x(Si_3N_4)_{1-x}$ and the compositional ratio y of the hafnium oxynitride film $(HfO_2)_y(Hf_3N_4)_{1-y}$, by using quantity w of:

$$w = \frac{\{\phi_v(SiO_2) - \phi_v(Si_3N_4)\}\frac{7(1-x)}{7-4x} - \{\phi_v(SiO_2) - \phi_v(HfO_2)\}}{\{\phi_v(HfO_2) - \phi_v(Hf_3N_4)\}} \quad (36)$$

results in:

$$y < \frac{7(1-w)}{7-4w} \text{ [where } 0 < x < 1, 0 < y < 1 \text{]} \quad (37)$$

When applying values of the valence band offset of $HfO_2$, $Hf_3N_4$, $SiO_2$ and $Si_3N_4$ to the formula (36), w is represented by:

$$w = \frac{2.6 \frac{7(1-x)}{7-4x} - 1.2}{1.1} \quad (38)$$

In addition, in the hafnium oxynitride film, when introducing condition $E_t(HfON) > 0$ to the formula (4) and the formula (7), $$y > \frac{1}{1 - \frac{3}{7} \frac{E_t(HfO_2)}{E_t(Hf_3N_4)}} \quad (39)$$

is obtained. Note that $E_t(HfON) > 0$ indicates the presence of the energy level within the band gap of the hafnium oxynitride film.

When using the fact that $E_t(HfO_2)$ is $E_t(HfO_2) = 2$ eV, and $E_t(Hf_3N_4)$ is $E_t(Hf_3N_4) = -0.4$ eV, y becomes $$y > 0.32 \quad (40)$$

Preferable MONOS characteristic is obtained in the compositional range meeting simultaneously the formulas (36), (37) or the formulas (37), (38), and the formula (39) or the formula (40).

Figure 7:
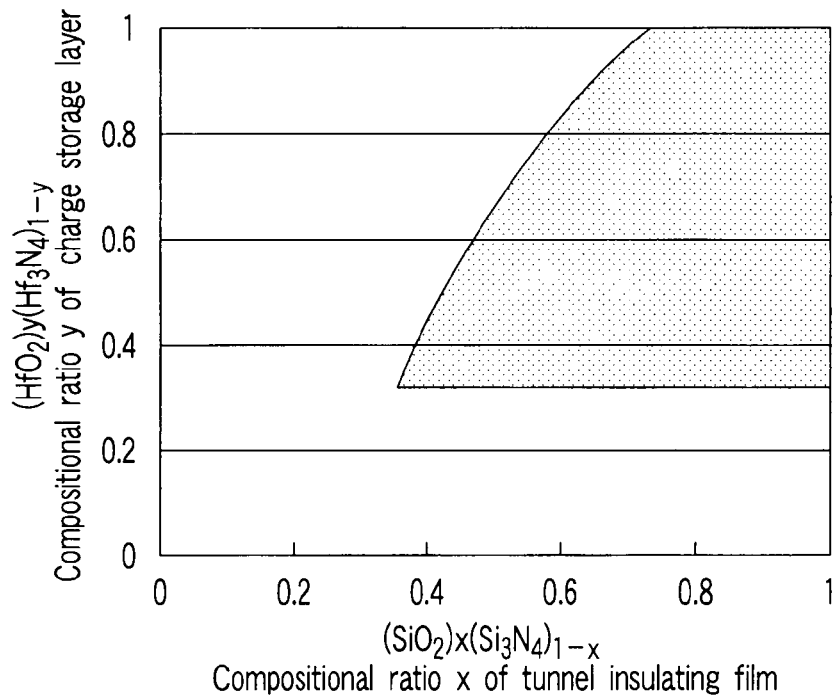
FIG. 7 is a figure showing an appropriate compositional range when HfON is used for the charge storage layer.

The shaded area of FIG. 7 illustrates the relation to be met by both of the compositional ratio x of the silicon oxynitride film $(SiO_2)_x(Si_3N_4)_{1-x}$ and the compositional ratio y of the hafnium oxynitride film $(HfO_2)_y(Hf_3N_4)_{1-y}$ obtained as above.

B. Desirable Compositional Range in the Case where Charge Storage Layer is HfAlON When representing film composition of HfAlON as $[(HfO_2)_x(Hf_3N_4)_{1-x}]_y[(Al_2O_3)_x(AlN)_{1-x}]_{1-y}$ using a compositional index x representing the oxidized degree and a compositional index y of an insulating material including Hf, the energy level $E_t(HfAlON)$ of the oxygen vacancy defect is provided by the formula (17).

In the case where this defect energy level meets $E_t(HfAlON) > 0$, the defect level exists within the band gap of HfAlON.

The compositional range corresponding to this becomes an area filled thinly in FIG. 8.

In addition, the valence band offset $\phi_V(HfAlON)$ of HfAlON is provided by the formula (14).

On the other hand, when representing the composition of the silicon oxynitride film as the tunnel insulating film by $(SiO_2)_z(Si_3N_4)_{1-z}$, the valence band offset $\phi_V(SiON)$ is represented by the formula (3) in which x is replaced by z. The range of the compositional index (x, y) of the charge storage layer (HfAlON), in which $\phi_V(HfAlON) < \phi_V(SiON)$ is established with respect to the valence band offset, is determined depending on the compositional ratio z of the silicon oxynitride film.

FIGS. 9 to 14 show ranges of the compositional index (x, y), in which the valence band offset meets the relation of $\phi_V(HfAlON) < \phi_V(SiON)$ and the defect level satisfies $E_t(HfAlON) > 0$, in the respective cases where the compositional ratio z of the silicon oxynitride film is changed in the range of z=0.4 to 0.9.

Note that in the case where the compositional ratio z of the silicon oxynitride film is 0.3 or less, a range satisfying the both relations concurrently does not exist. It is possible to realize the MONOS type memory cell with excellent characteristics if HfAlON within the compositional range as described above is used as the charge storage layer, depending on the compositional ratio z of the silicon oxynitride film.

C. Desirable Compositional Range in the Case where Charge Storage Layer is HfSiON When representing film composition of HfSiON as $[(HfO_2)_x(Hf_3N_4)_{1-x}]_y[(SiO_2)_x(Si_3N_4)_{1-x}]_{1-y}$ using the compositional index x representing the oxidized degree and the compositional index y as the insulating material including Hf, the energy level $E_t(HfSiON)$ of the oxygen vacancy defect is provided by the formula (31).

In the case where this defect energy level meets $E_t(HfSiON) > 0$, the defect level exists within the band gap of HfSiON.

Figure 15:
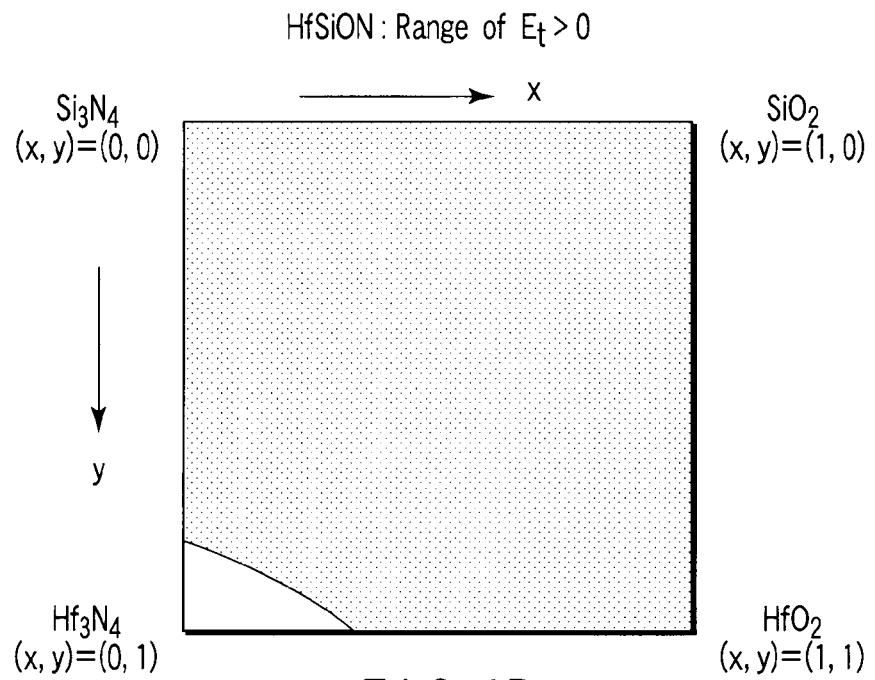
FIG. 15 is a view showing the compositional range when a trap level exists within a band gap in the case where HfSiON is used for the charge storage layer.
Figure 16:
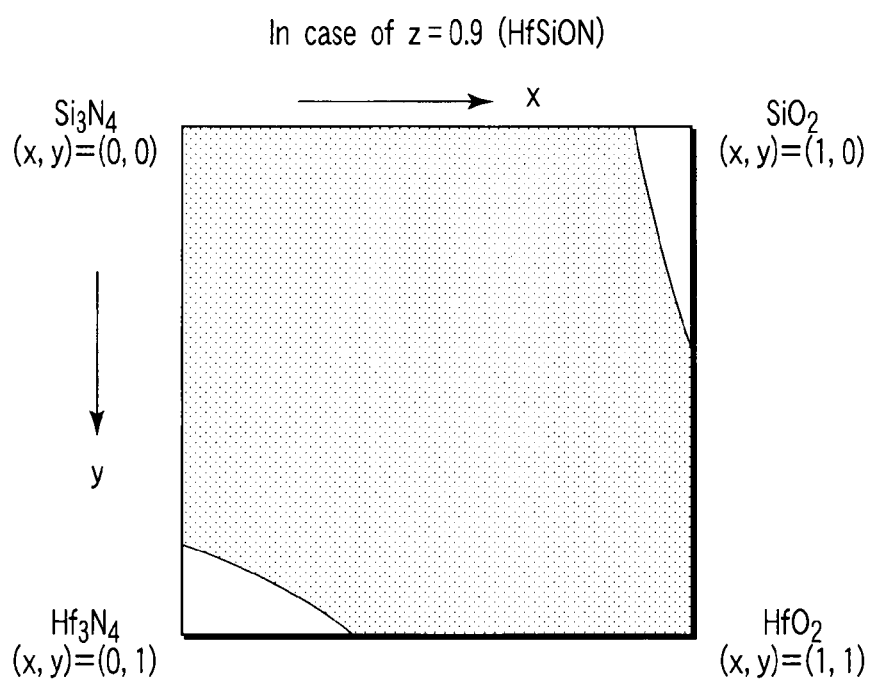
FIG. 16 is a view showing an appropriate compositional range when HfSiON is used for the charge storage layer.
Figure 17:
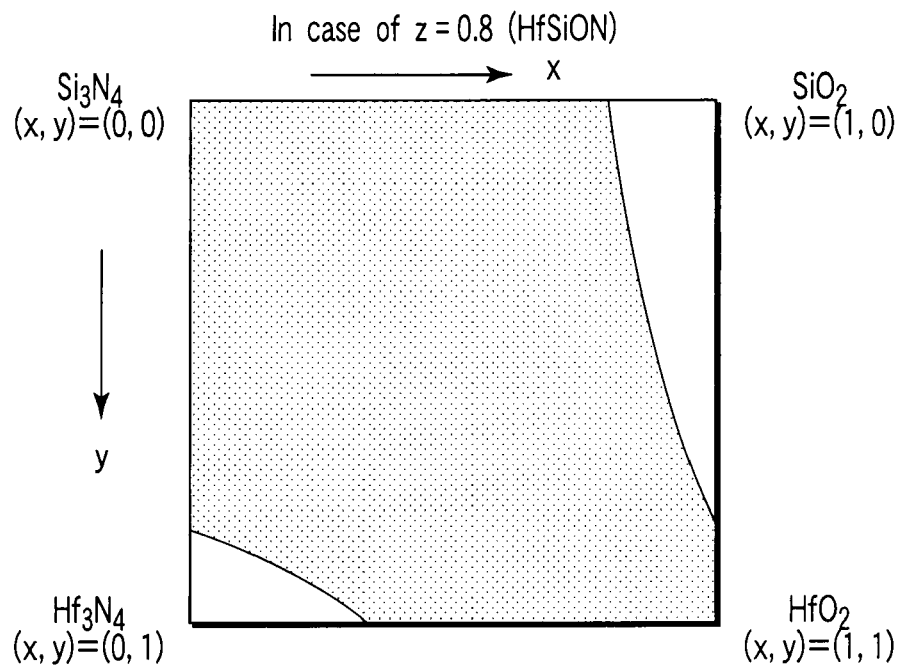
FIG. 17 is a view showing an appropriate compositional range when HfSiON is used for the charge storage layer.
Figure 18:
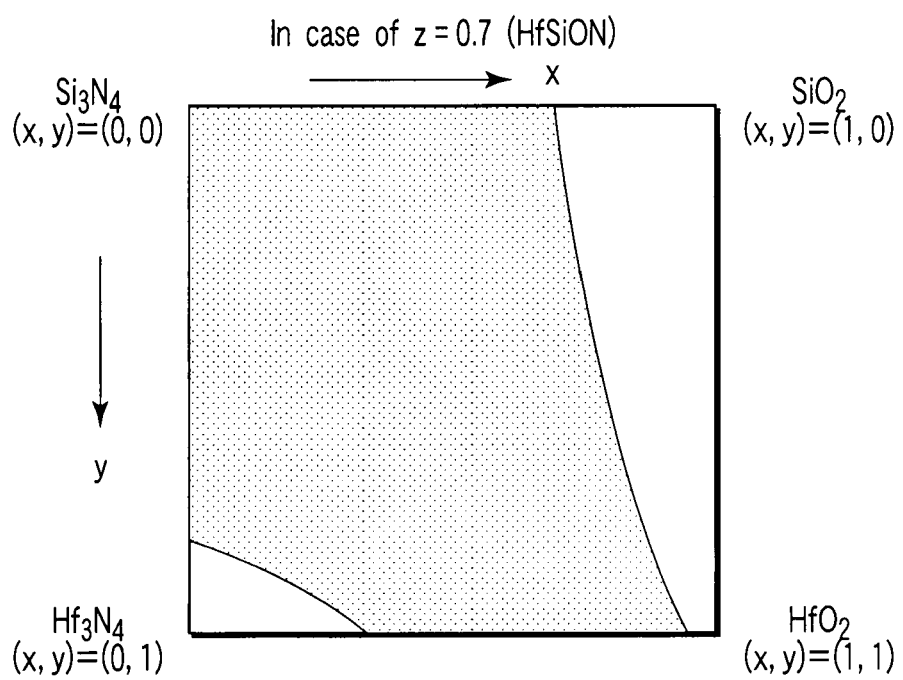
FIG. 18 is a view showing an appropriate compositional range when HfSiON is used for the charge storage layer.
Figure 19:
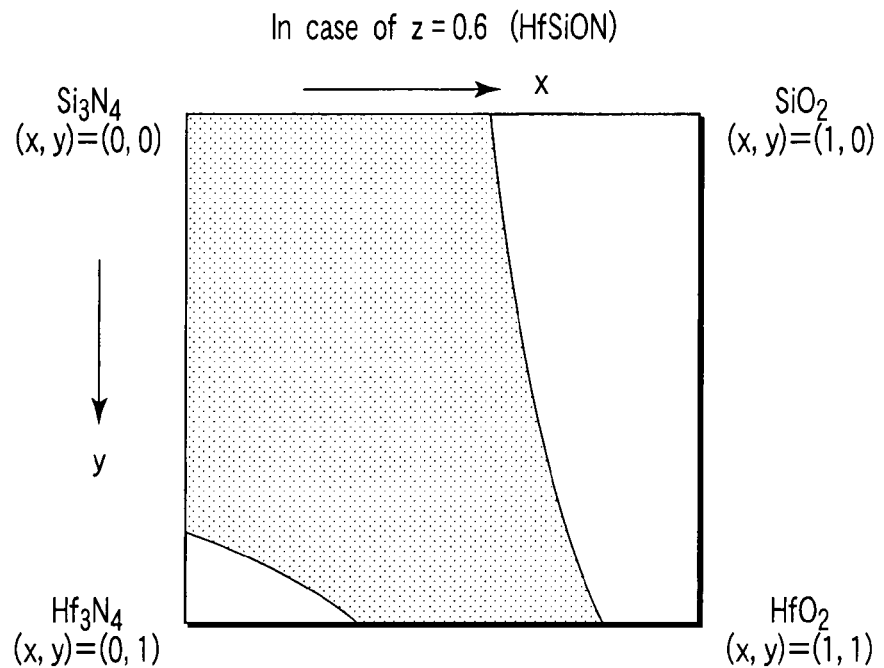
FIG. 19 is a view showing an appropriate compositional range when HfSiON is used for the charge storage layer.
Figure 20:
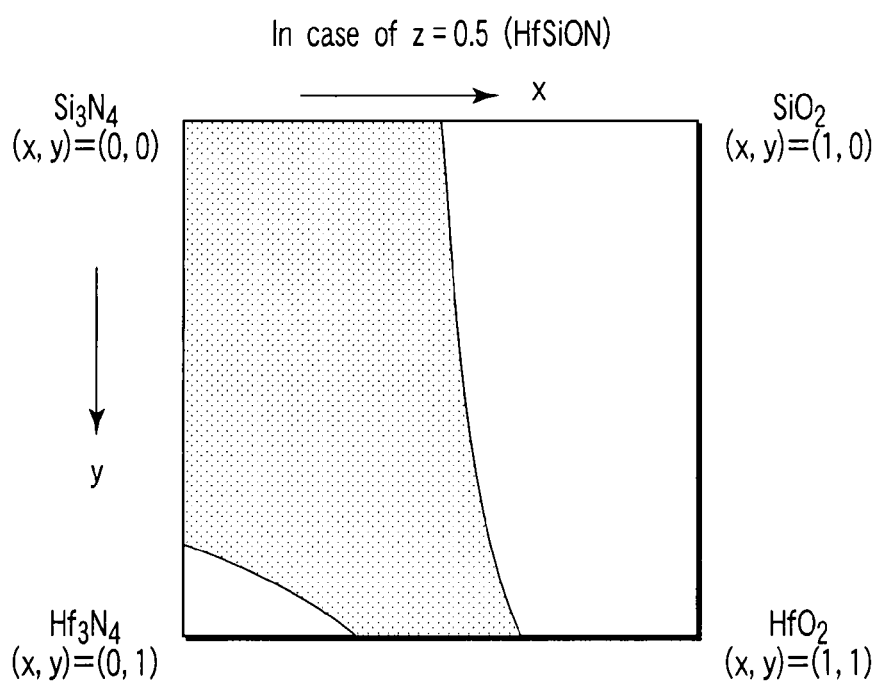
FIG. 20 is a view showing an appropriate compositional range when HfSiON is used for the charge storage layer.
Figure 21:
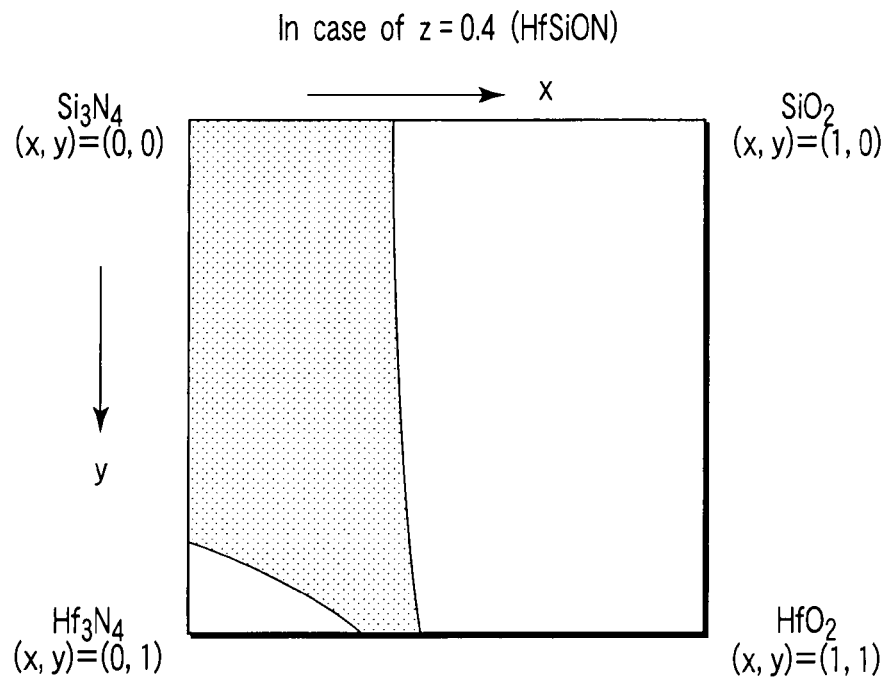
FIG. 21 is a view showing an appropriate compositional range when HfSiON is used for the charge storage layer.
Figure 22:
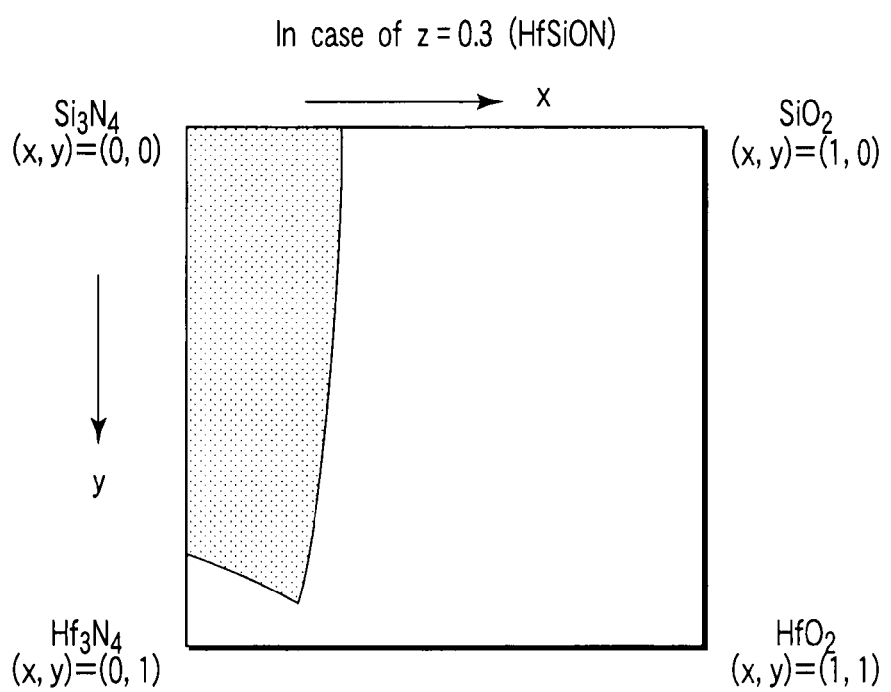
FIG. 22 is a view showing an appropriate compositional range when HfSiON is used for the charge storage layer.
Figure 23:
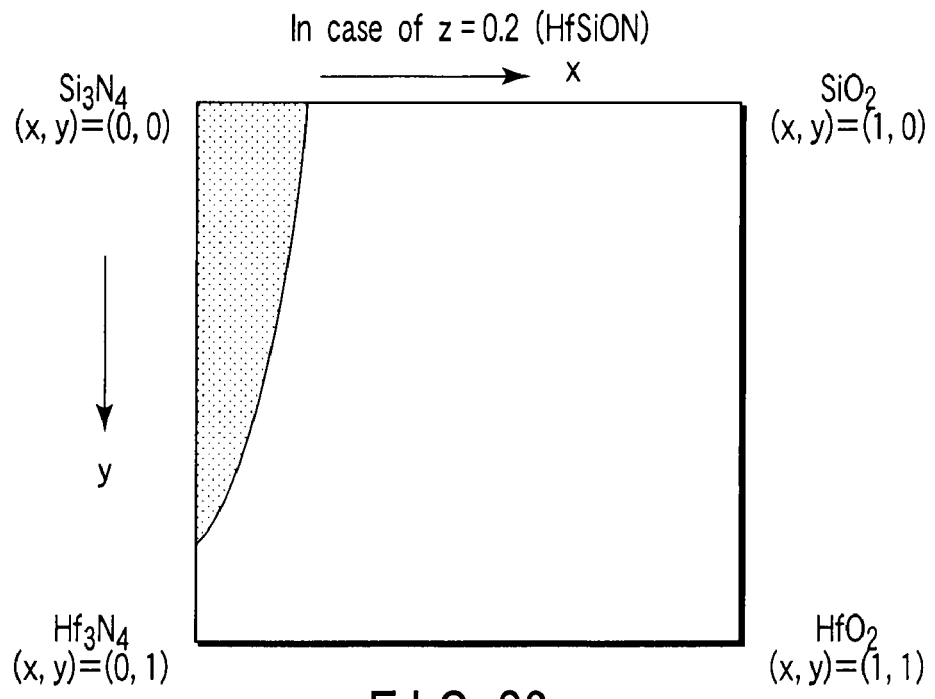
FIG. 23 is a view showing an appropriate compositional range when HfSiON is used for the charge storage layer.
Figure 24:
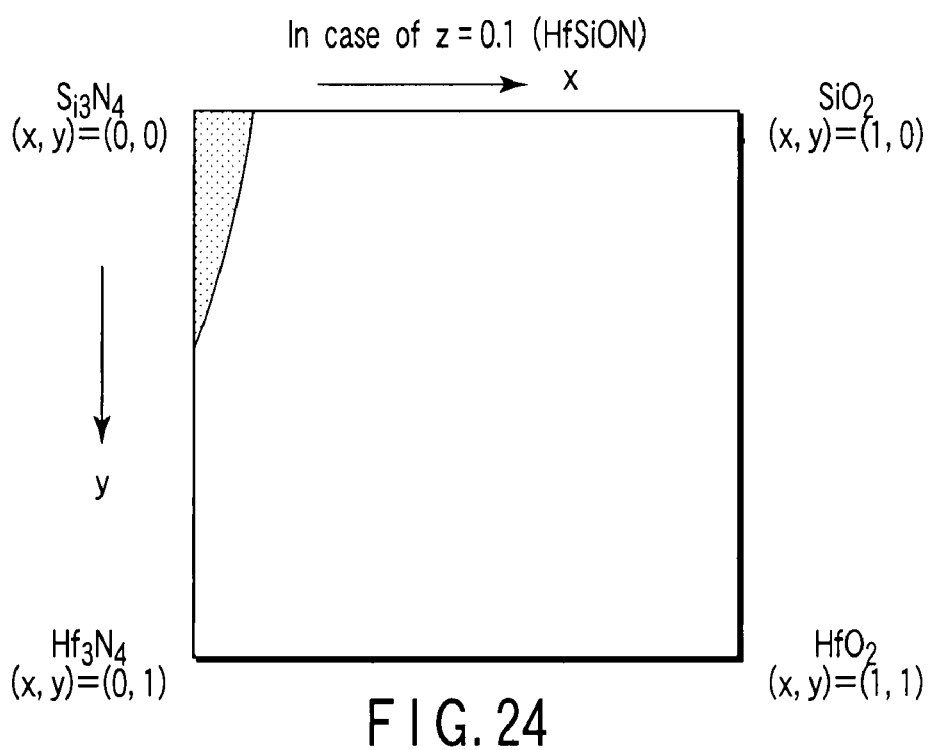
FIG. 24 is a view showing an appropriate compositional range when HfSiON is used for the charge storage layer.

The corresponding compositional range is an area filled thinly in FIG. 15.

In addition, the valence band offset $\phi_V(HfSiON)$ of HfSiON is provided by the formula (30).

On the other hand, when representing the composition of the silicon oxynitride film as the tunnel insulating film by $(SiO_2)_z(Si_3N_4)_{1-z}$, the valence band offset $\phi_V(SiON)$ is provided by the formula (3) in which x is replaced by z. The range of the compositional index (x, y) of the charge storage layer (HfSiON), in which $\phi_V(HfSiON) < \phi_V(SiON)$ is established concerning the valence band offset, is determined depending on the compositional ratio z of the silicon oxynitride film.

FIGS. 16 to 24 show ranges of the compositional index (x, y), in which the valence band offset meets the relation of $\phi_V(HfSiON) < \phi_V(SiON)$ and the defect level satisfies $E_t(HfSiON) > 0$, in the respective cases where the compositional ratio z of the silicon oxynitride film is changed in the range of z=0.1 to 0.9.

It is possible to realize the MONOS type memory cell with excellent characteristics if HfSiON within the compositional range as described above is used as the charge storage layer, depending on the compositional ratio z of the silicon oxynitride film.

D. Desirable Compositional Range of SiON Film in which Emphasis is Put on Initial Performance and Long-Term Reliability Next, there will be discussed the desirable compositional range of the SiON film as the tunnel insulating film.

According to theoretical calculation of the tunnel current based on WKB approximation, low electric field leakage current can be suppressed and current of high electric field region can be maintained as ratio of the composition x is reduced, as shown in FIG. 3. Therefore, as long as the SiON film is an ideal material without defects, smaller ratio of the composition x is desirable basically.

However, since the silicon nitride film is a film having many defects, there are such fears as capture of carriers caused by the defects, generation of leakage current (stress-induced leakage current: SILC) due to stress application, and deterioration of breakdown voltage and time-dependent charge to breakdown Qbd.

For instance, according to G. Lucovsky, Y. Wu, H. Niimi, V. Misra, L. C. Phillips, "Bonding constraints and defect formation at interfaces between crystalline silicon and advanced single layer and composite gate dielectrics," Appl. Phys. Lett. 74, 2005 (1999), defect density in the insulating film is determined by constraints imposed on the bonds of constituent atoms. This "bond constraint" is proportional to average coordination number $N_{av}$ of the constituent atoms, and $N_{av}=3$ becomes the boundary for determining whether the number of defects is large or small.

In the silicon oxynitride film $(SiO_2)_x(Si_3N_4)_{1-x}$, the average coordination number is calculated below.

Si atom has fourfold coordination, oxygen atom has twofold coordination, and nitrogen atom has threefold coordination.

Since existence ratios of the respective atoms are $(3-2x)/(7-4x)$, $2x/(7-4x)$, $4(1-x)/(7-4x)$, the average coordination number $N_{av}$ of the silicon oxynitride film is calculated as:

$$N_{av} = 4\frac{3-2x}{7-4x} + 2\frac{2x}{7-4x} + 3\frac{4(1-x)}{7-4x} = \frac{8(3-2x)}{7-4x}. \tag{41}$$

For the silicon nitride film ($Si_3N_4$), in which the compositional ratio is $x=0$, $N_{av}$ is $N_{av}=24/7=3.43$. Since $N_{av}$ becomes $N_{av}>3$, the silicon nitride film falls in the category of the film with many defects.

On the other hand, for the silicon oxide film ($SiO_2$), in which the compositional ratio is $x=1$, $N_{av}$ is $N_{av}=8/3=2.67$. Since $N_{av}$ becomes $N_{av}<3$, the silicon oxide film is the film with few defects.

By putting $N_{av}$ to $N_{av}=3$ in the formula (41), the compositional ratio x is obtained as 0.75. Therefore, when compositional ratio x is $x>0.75$, the tunnel insulating film with few defects and good long-term reliability can be provided; however, as understood from FIG. 3, performance (initial performance) thereof is not necessarily high. On the other hand, when the compositional ratio x is $x<0.75$, although the tunnel insulating film has many defects, and is disadvantageous in terms of reliability, there is obtained high initial performance of the tunnel insulating film.

Therefore, in the case where it is necessary to put emphasis on long-term reliability rather than initial performance of the tunnel insulating film, the range in which compositional ratio x of the SiON film is 0.75 or more should be used.

In contrast, in the case of putting emphasis on initial performance over long-term reliability of the tunnel insulating film, the range in which compositional ratio x of the SiON film is 0.75 or less should be used.

Also, in both cases, it goes without saying that, based on the example of the present invention, the charge storage layer with optimum composition should be formed in accordance with the composition of the tunnel insulating film.

Note that, whether emphasis is put on initial performance or long-term reliability of the tunnel insulating film depends on application usage of the flash memory which is fabricated by integrating the memory cells.

4. Embodiments

On the basis of the principles of the present invention described above, the best mode for executing the present invention will be described in detail using drawings.

(1) First Embodiment

Figure 25:
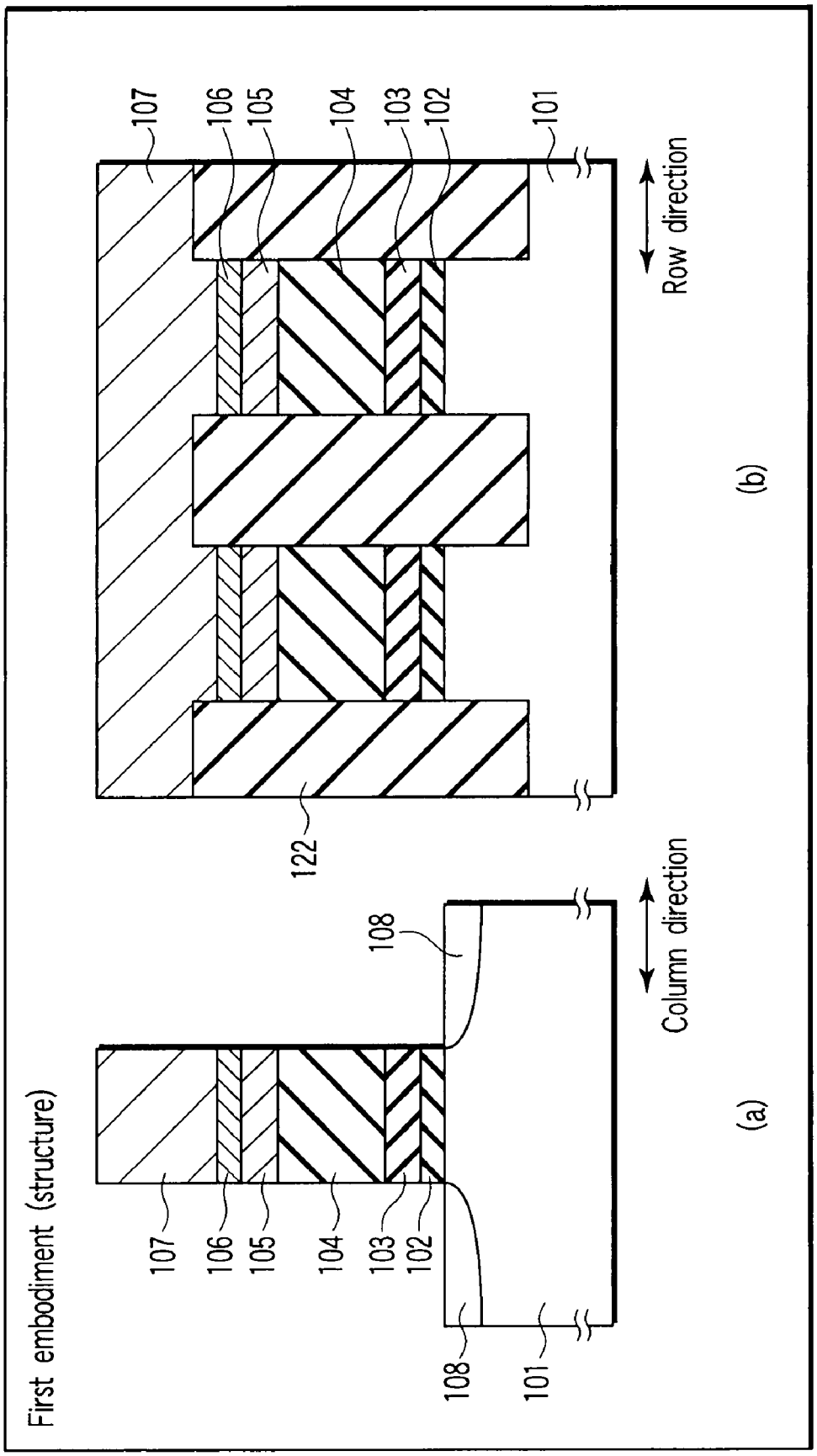
FIG. 25 is a cross sectional view showing a cell structure as a first embodiment.

FIG. 25 shows a memory cell according to the first embodiment.

FIG. 25A is a cross sectional view along a channel length direction, and FIG. 25B is a cross sectional view along a channel width direction. In addition, FIG. 26 shows the structure of FIG. 25A in detail.

On a surface part of a p-type silicon substrate (including well) 101, two source/drain diffusion layers 108 are separately arranged from each other. A portion between the source/drain diffusion layers 108 is a channel region, and when the memory cell becomes ON state, a channel for electrically conducting the two source/drain diffusion layers 108 is formed on the channel region.

On the channel region, for instance, there is arranged a tunnel insulating film (first insulating film) 102 with a thickness of approximately 4 nm constituted from the silicon oxynitride film (SiON). On the tunnel insulating film 102, for instance, there is arranged a charge storage layer 103 with a thickness of approximately 10 nm constituted from the hafnium oxynitride film (HfON). On the charge storage layer 103, for instance, there is arranged a block insulating film (second insulating film) 104 with a thickness of approximately 15 nm constituted from an alumina film ($Al_2O_3$).

On the block insulating film 104, for instance, there is arranged a control gate electrode 105 constituted from tantalum nitride (TaN). On the control gate electrode 105, for instance, there is arranged a barrier metal 106 constituted from tungsten nitride (WN), and on the barrier metal 106, for instance, there is arranged a low resistance metal film 107 constituted from tungsten (W).

In addition, a plurality of the tunnel insulating films 102, the charge storage layers 103, the block insulating films 104, the control gate electrodes 105 and the barrier metals 106 are formed in a row direction, and these are separated from one another by device isolation insulating layers 122 with STI (Shallow Trench Isolation) structure.

The low resistance metal film 107 extends in the row direction, resulting in a word line.

Here, it is assumed that composition of the tunnel insulating film (SiON) 102 is, for instance, $(SiO_2)_{0.8}(Si_3N_4)_{0.2}$, and composition of the charge storage layer (HfON) 103 is, for instance, $(HfO_2)_{0.8}(Hf_3N_4)_{0.2}$.

However, composition of the tunnel insulating film 102 and the charge storage layer 103 is not limited to $x=0.8$, $y=0.8$, and as long as it is included within the compositional range shown in FIG. 7, any compositional ratio can be used.

In addition, the block insulating film 104 has dielectric constant higher than that of the tunnel insulating film, and has a function to suppress a leakage current between the control gate electrode 105 and the charge storage layer 103. As long as the block insulating film 104 has such characteristics, any material thereof can be used without being limited to the alumina film.

For instance, the block insulating film 104 may be constituted from aluminum oxynitride (AlON) or hafnia ($HfO_2$).

Materials constituting the control gate electrode 105 are determined in consideration of a work function and reactivity with the block insulating film 104. The control gate electrode 105 is constituted from, for instance, one material selected from the group of TaN, TiN, HfN, TaSiN, TaSix, Ru, W, WSix, and Ru, or its silicide materials.

The barrier metal 106 can be omitted depending on manufacturing process.

In addition, the low resistance metal film 107 is constituted from one material selected from the group of, for instance, W, WSix, NiSix, MoSix, TiSix, and CoSix.

Next, a method of manufacturing the memory cell of FIGS. 25 and 26 will be described.

In FIGS. 27 to 31, (a) of them is a cross sectional view along a channel length direction, and (b) of them is a cross sectional view along a channel width direction.

Figure 27:
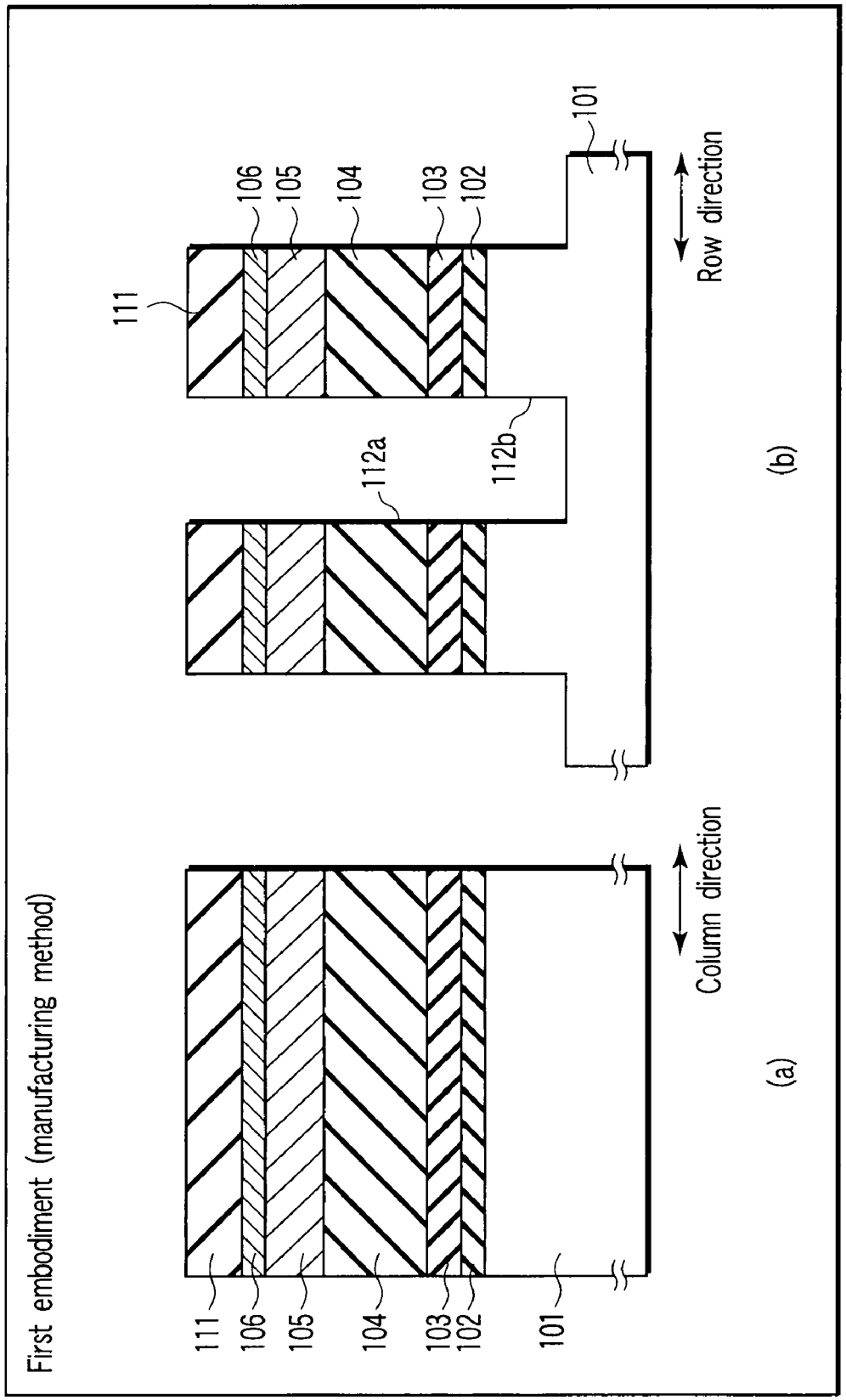
FIG. 27 is a cross sectional view showing a method of manufacturing the cell structure of the first embodiment.

Firstly, as shown in FIG. 27, by diluted hydrofluoric acid treatment, a natural oxide film existing on a surface of the silicon substrate (including well) 101 doped with p-type impurity is removed to expose the surface of the silicon substrate 101.

After that, by a thermal oxynitridation method using NO gas, the tunnel insulating film 102 with a thickness of approximately 4 nm composed of the silicon oxynitride film is formed on the silicon substrate 101. In addition, nitrogen density of the tunnel insulating film 102 can be raised by plasma nitridation treatment.

Subsequently, by a reactive sputtering method in mixed gas of oxygen and nitrogen, the charge storage layer 103 with a thickness of approximately 10 nm composed of the hafnium oxynitride film is formed on the tunnel insulating film 102. In addition, by the sputtering method using $Al_2O_3$ as a target, the block insulating film 104 with a thickness of approximately 15 nm composed of the alumina film is formed on the charge storage layer 103.

Further, by the reactive sputtering method in nitrogen gas using Ta as the target, the control gate electrode 105 with a thickness of approximately 30 nm composed of a tantalum nitride film is formed on the block insulating film 104. In addition, by the reactive sputtering method in the nitrogen gas using tungsten as the target, the barrier metal 106 composed of the tungsten nitride film is formed on the control gate electrode 105.

Then, a mask material 111 for processing the device isolation region is formed on the barrier metal 106. A photoresist is formed on the mask material 111, and the photoresist is exposed and developed. In addition, by the RIE (reactive ion etching) method, a pattern of the photoresist is transferred to the mask material 111. After that, the photoresist is removed.

In this state, using the mask material 111 as the mask, by the RIE method, the barrier metal 106, the control gate electrode 105, the block insulating film 104, the charge storage layer 103 and the tunnel insulating film 102 are etched sequentially, to form a slit 112a for separating the memory cells adjacent in the row direction.

Further, by the RIE method, the silicon substrate 101 is subjected to etching, to form a trench 112b with depth of approximately 100 nm for device isolation.

Figure 28:
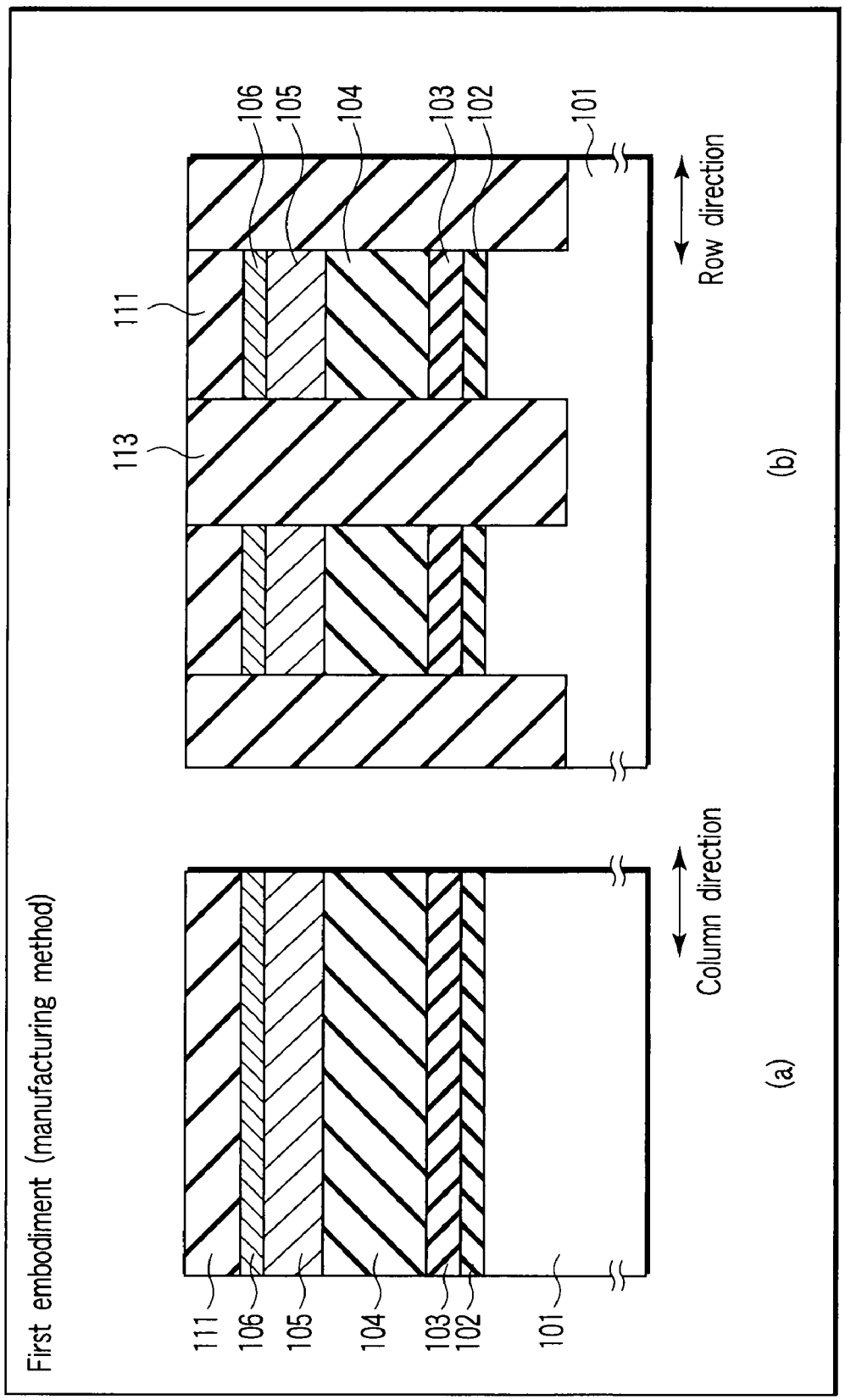
FIG. 28 is a cross sectional view showing a method of manufacturing the cell structure of the first embodiment.

Next, as shown in FIG. 28, by the CVD method, a silicon oxide film (buried oxide film) 113 completely filling the slit 112a and the trench 112b is formed. Continuously, by the CMP (Chemical Mechanical Polishing) method, the silicon oxide film 113 is polished until the mask material 111 is exposed, to flatten a surface of the silicon oxide film 113. After that, the mask material 111 is selectively removed.

Figure 29:
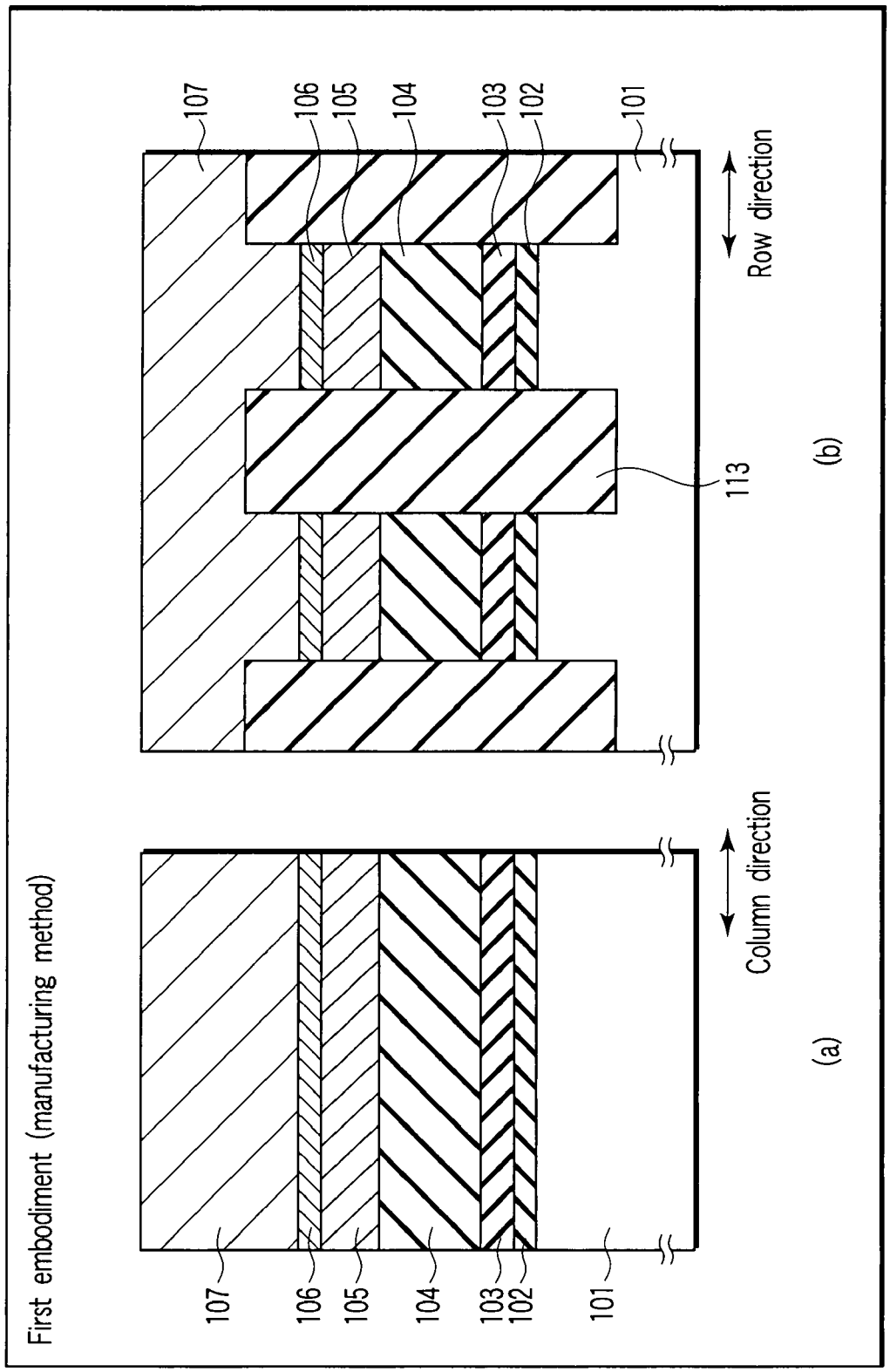
FIG. 29 is a cross sectional view showing a method of manufacturing the cell structure of the first embodiment.

Next, as shown in FIG. 29, by the CVD method, the low resistance metal film 107 with a thickness of approximately 120 nm composed of, for instance, tungsten is formed on the barrier metal 106.

Figure 30:
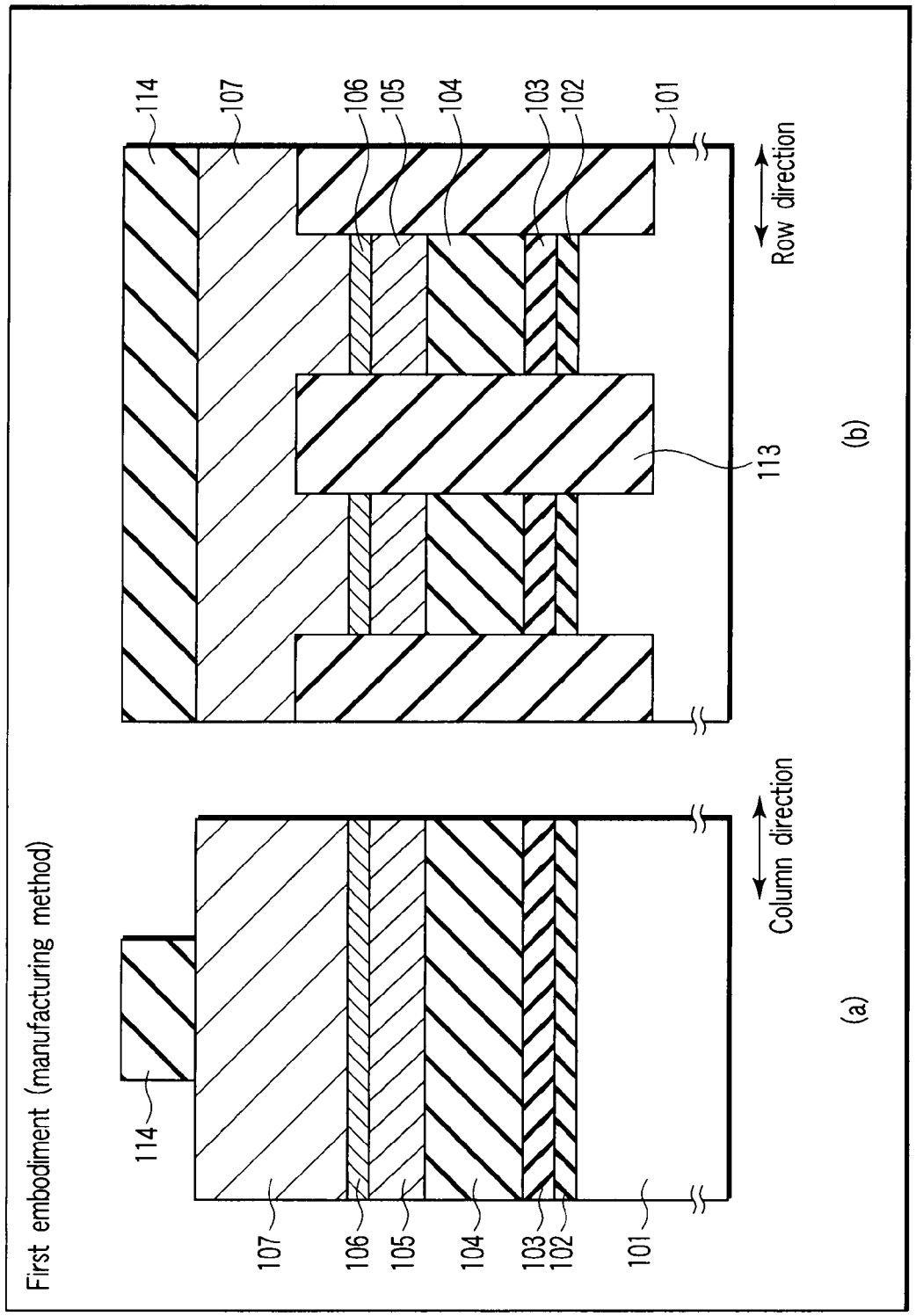
FIG. 30 is a cross sectional view showing a method of manufacturing the cell structure of the first embodiment.

Next, as shown in FIG. 30, by the CVD method, a mask material 114 is formed on the low resistance metal film 107. The photoresist is formed on this mask material 114, and the photoresist is exposed and developed. Then, by the RIE method, a pattern of the photoresist is transferred on the mask material 114. After that, the photoresist is removed.

Figure 31:
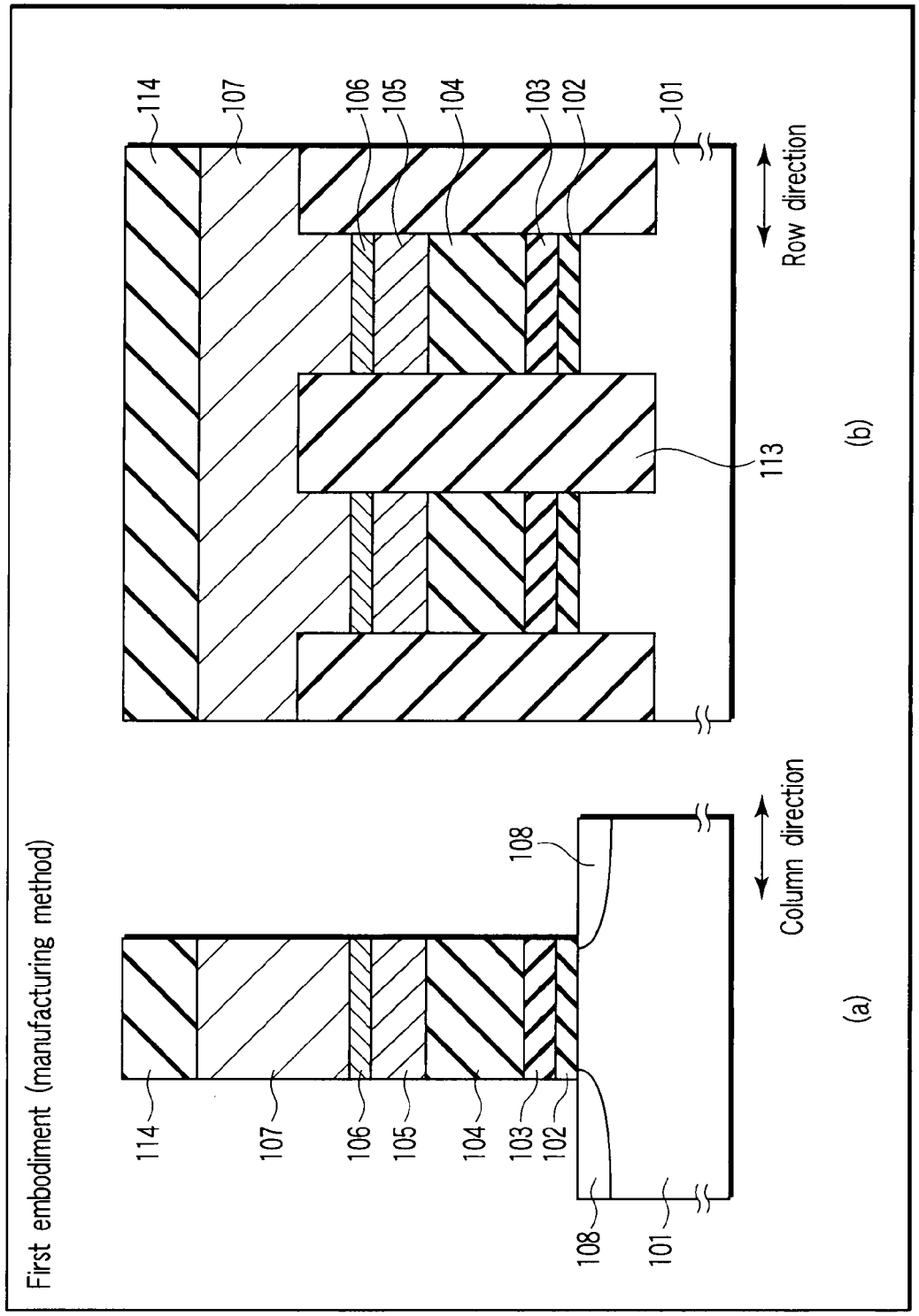
FIG. 31 is a cross sectional view showing a method of manufacturing the cell structure of the first embodiment.

Next, as shown in FIG. 31, with the mask material 114 as the mask, by the RIE method, the low resistance metal film 107, the barrier metal 106, the control gate electrode 105, the block insulating film 104, the charge storage layer 103 and the tunnel insulating film 102 are etched sequentially to form a MONOS type gate stack structure.

After these processes, by the CVD method, there is performed processing to form the silicon oxide film on a side surface of the MONOS type gate stack structure, after which, by the ion implantation method, an $n^+$ type source/drain diffusion layer 108 (refer to FIG. 31) is formed on a surface region of the silicon substrate 101 in a self-aligned manner to complete the memory cell. Finally, by the CVD method, an interlayer insulating film (not shown) for covering the memory cell is formed.

The above manufacturing method is just one example. The memory cell of FIGS. 25 and 26 may be formed by the manufacturing method other than the above method.

For instance, the CVD method or ALD (atomic layer deposition) method may be used instead of the sputtering method. As a specific example, concerning the alumina film as the block insulating film, it is possible to form the alumina film by using the ALD method using $Al(CH_3)_3$ and $H_2O$ (or $O_3$) instead of the sputtering method.

In addition, the HfON film as the charge storage layer may be formed by the ALD method using $Hf[N(CH_3)_2]_4$ and $H_2O$ (or $O_3$), and annealing in $NH_3$ gas atmosphere performed in the middle of or immediately after formation of the HfON film instead of the reactive sputtering method.

Note that, treatment by plasma nitrogen may be substituted for annealing in $NH_3$ gas atmosphere.

In addition, the HfON film used for the charge storage layer may be formed by the ion implantation method (acceleration energy of about 200 eV) of nitrogen, after forming the $HfO_2$ film at the beginning.

The silicon oxynitride film as the tunnel insulating film may be formed by performing oxidizing treatment after thermal nitridation of the Si substrate by $NH_3$. In addition, the silicon oxynitride film may be formed by performing thermal oxidation or plasma oxidation after performing nitridation of the Si substrate (for instance, refer to T. Ito, I. Kato, T. Nozaki, T. Nakayama and H. Ishikawa, "Plasma-enhanced thermal nitridation of silicon," Appl. Phys. Lett. 38, 370 (1981) by $NH_3$ using plasma assistance.

Further, the respective films constituting the above-described MONOS type gate stack structure can be formed by film formation methods such as a laser ablation method and an MBE method, or by combining these methods, in addition to the sputtering method, the CVD method, and the ALD method.

According to the present embodiment, the valence band offset for the compositional ratio y=0.8 of the hafnium oxynitride film results in $\phi_V(HfON)=2.9$ eV, and the valence band offset for the compositional ratio x=0.8 of the silicon oxynitride film results in $\phi_V(SiON)=3.54$ eV.

Relation between both the films is $\phi_V(SiON) > \phi_V(HfON)$; therefore the charge storage layer has the valence band offset smaller than that of the tunnel insulating film. For this reason, it is possible to realize improvement in erase speed and improvement in retention property after erase simultaneously.

In addition, according to the present embodiment, depth of the energy level of the oxygen vacancy defect for the compositional ratio y=0.8 of the hafnium oxynitride film is 1.1 eV, which is positioned within the band gap of the charge storage layer. For this reason, trap density is secured sufficiently, required threshold voltage shift can be obtained at the time of writing, and excellent data retention property can be obtained after writing.

Therefore, it is possible to obtain preferable property relating to all of write, erase and data retention required for the operation of the NAND type flash memory; thus it is possible to realize excellent effects as the memory cell of the NAND type flash memory.

(2) Second Embodiment

The second embodiment is a modified example of the first embodiment.

Figure 32:
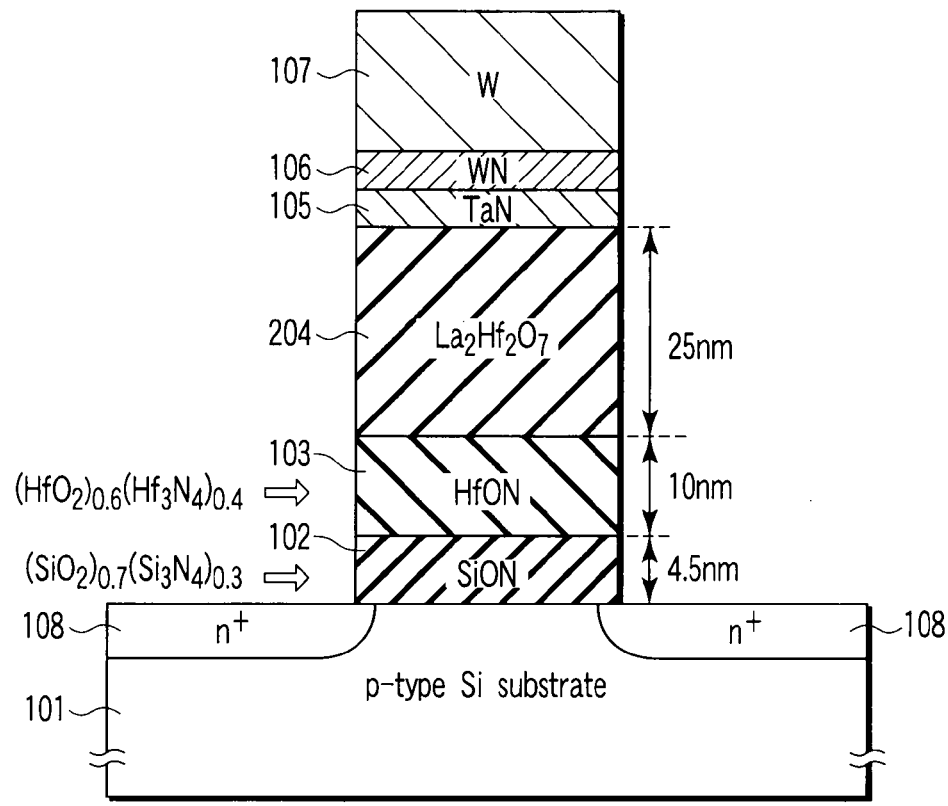
FIG. 32 is a cross sectional view showing a cell structure as a second embodiment.

FIG. 32 shows a memory cell according to the second embodiment.

This memory cell is different from the memory cell of the first embodiment in that a lanthanum-hafnia film ($La_2Hf_2O_7$) as the so-called "higher-k" insulating material is used as a block insulating film 204.

Since this material has very large dielectric constant, the effect to reduce the leakage current becomes remarkable when applied to the block insulating film 204. Note that, superiority in the case of applying the insulating film to a logic CMOS circuit, is described in, for instance, X. P. Wang, C. Shen, M.-F. Li, H. Y. Yu, Y. Sun, Y. P. Feng, A. Lim, H. W. Sik, A. Chin, Y. C. Yeo, P. Lo and D. L. Kwong, "Dual Metal Gates with Band-Edge Work Functions on Novel HfLaO High-k Gate Dielectric," Session 2.2, 2006, Symp. VLSI Tech. (2006).

On a surface part of a p-type silicon substrate 101, two source/drain diffusion layers 108 are separately arranged from each other. On the channel region between the source/drain diffusion layers 108, for instance, there is arranged a tunnel insulating film (first insulating film) 102 with a thickness of approximately 4.5 nm constituted from the silicon oxynitride film (SiON).

On the tunnel insulating film 102, for instance, there is arranged the charge storage layer 103 with a thickness of approximately 10 nm constituted from the hafnium oxynitride film (HfON). On the charge storage layer 103, for instance, there is arranged a block insulating film (second insulating film) 204 with a thickness of approximately 25 nm constituted from a lanthanum-hafnia film ($La_2Hf_2O_7$).

On the block insulating film 204, for instance, there is arranged a control gate electrode 105 constituted from tantalum nitride (TaN). On the control gate electrode 105, for instance, there is arranged a barrier metal 106 constituted from tungsten nitride (WN), and on the barrier metal 106, for instance, there is arranged a low resistance metal film 107 constituted from tungsten (W).

Here, it is assumed that the composition of the silicon oxynitride film $(SiO_2)_x(Si_3N_4)_{1-x}$ as the tunnel insulating film 102 is, for instance, $x=0.7$, and the composition of the hafnium oxynitride film $(HfO_2)_y(Hf_3N_4)_{1-y}$ as the charge storage layer is, for instance, $y=0.6$. In addition, the compositional ratio of the lanthanum-hafnia film $(HfO_2)_z(La_2O_3)_{1-z}$ as the block insulating film 204 is $z=2/3$.

With respect to the control gate electrode 105, the barrier metal 106 and the low resistance metal film 107, change of the material as described in the above first embodiment is possible.

In addition, with respect to the method of manufacturing the memory cell of FIG. 32, fundamentally, it is possible to apply the process of the first embodiment (FIGS. 27 to 31) as it is.

The lanthanum-hafnia film as the block insulating film 204 can be formed by the CVD method and the ALD method, as well as by the sputtering method.

According to the present embodiment, the valence band offset for the compositional ratio $y=0.6$ of the hafnium oxynitride film results in $\phi_V(HfON)=2.6$ eV, and the valence band offset for the compositional ratio $x=0.7$ of the silicon oxynitride film results in $\phi_V(SiON)=3.2$ eV.

Relation between both the films is $\phi_V(SiON)>\phi_V(HfON)$; therefore the charge storage layer has the valence band offset smaller than that of the tunnel insulating film. For this reason, it is possible to realize improvement in erase speed and improvement in retention property after erase simultaneously.

In addition, according to the present embodiment, the depth of the energy level of the oxygen vacancy defect to the compositional ratio $y=0.6$ of the hafnium oxynitride film is 0.54 eV; thus the trap level is positioned within the band gap of the charge storage layer. For this reason, trap density is secured sufficiently, required threshold voltage shift can be obtained at the time of writing, and good data retention property can be obtained after writing.

Further, since the lanthanum-hafnia film with high dielectric constant is used as the block insulating film, the leakage current via the block insulating film can be suppressed remarkably, threshold voltage window of write and erase is widened, and the retention property is preferably held by reduction of leakage current in low electric field region. In addition, in such MONOS type gate stack structure, it is possible to realize low power consumption due to reduction of power supply voltage by decrease in Equivalent Oxide Thickness (EOT).

Therefore, in the second embodiment, the same effect as the first embodiment can be obtained, and due to improvement in the block insulating film, further excellent effects can be realized as the memory cell of the NAND type flash memory.

(3) Third Embodiment

The third embodiment is also a modified example of the first embodiment.

Figure 33:
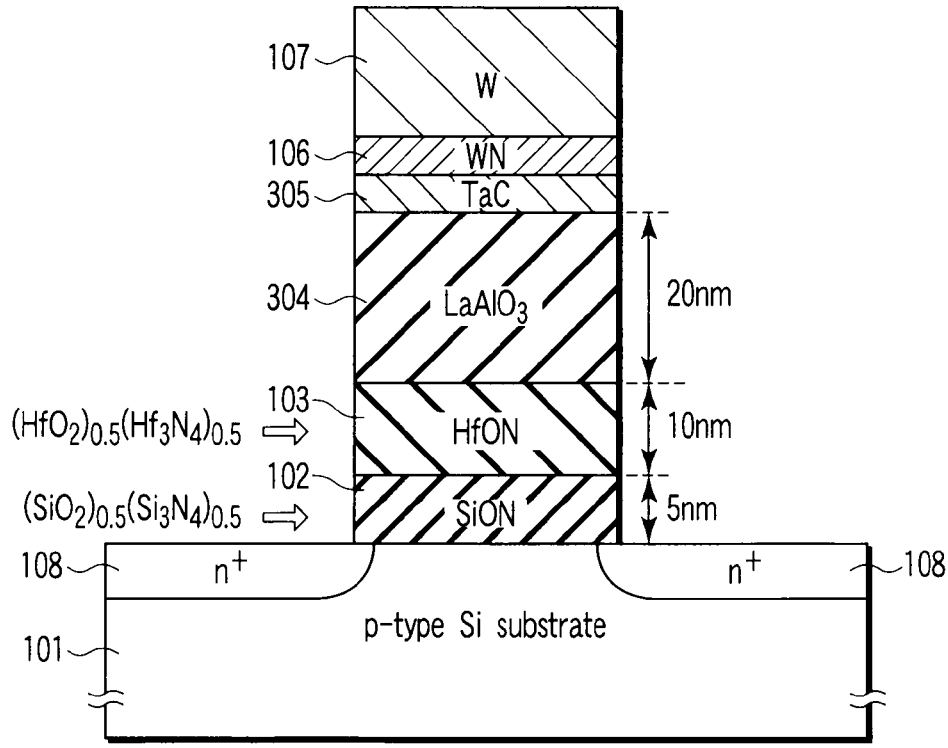
FIG. 33 is a cross sectional view showing a cell structure as a third embodiment.

FIG. 33 shows a memory cell according to the third embodiment.

In this modified example, the composition of the silicon oxynitride film as the tunnel insulating film 102 is made closer to that of the silicon nitride film, and accordingly nitrogen density of HfON as the charge storage layer 103 is raised.

In addition, a lanthanum-aluminate film ($LaAlO_3$) as one of the "higher-k" insulating materials is used as a block insulating film 304. Further, tantalum-carbide (TaC) exhibiting excellent heat endurance and having large work function is used as a control gate electrode 305.

On a surface part of a p-type silicon substrate 101, two source/drain diffusion layers 108 are arranged separately from each other. On the channel region between the source/drain diffusion layers 108, for instance, there is arranged a tunnel insulating film (first insulating film) 102 with a thickness of approximately 5 nm constituted from the silicon oxynitride film (SiON).

On the tunnel insulating film 102, for instance, there is arranged the charge storage layer 103 with a thickness of approximately 10 nm constituted from the hafnium oxynitride film (HfON). On the charge storage layer 103, for instance, there is arranged a block insulating film (second insulating film) 304 with a thickness of approximately 20 nm constituted from a lanthanum-aluminate film ($LaAlO_3$).

On the block insulating film 304, for instance, there is arranged the control gate electrode 305 constituted from tantalum carbide (TaC). On the control gate electrode 305, for instance, there is arranged a barrier metal 106 constituted from tungsten nitride (WN), and on the barrier metal 106, for instance, there is arranged a low resistance metal film 107 constituted from tungsten (W).

Here, it is assumed that the compositional ratio of the silicon oxynitride film $(SiO_2)_x(Si_3N_4)_{1-x}$ as the tunnel insulating film is $x=0.5$, and the compositional ratio of the hafnium oxynitride film $(HfO_2)_y(Hf_3N_4)_{1-y}$ as the charge storage layer is $y=0.5$. In addition, the compositional index as ratio of the lanthanum-aluminate film $(Al_2O_3)_z(La_2O_3)_{1-z}$ as the block insulating film is $z=0.5$.

With respect to the control gate electrode 305, the barrier metal 106 and the low resistance metal film 107, change of the material as described in the above first embodiment is possible. In particular, with respect to the control gate electrode 305, tantalum nitride (TaN) may be used instead of tantalum carbide.

In addition, with respect to the method of manufacturing the memory cell of FIG. 33, fundamentally, it is possible to apply the process of the first embodiment (FIGS. 27 to 31) as it is.

In this embodiment, it is possible to form the tunnel oxynitride film with required composition in a short period of time by performing a re-oxidation process after plasma-assisted ammonia nitridation, thereby raising the nitrogen density in the tunnel oxynitride film.

The lanthanum-aluminate film as the block insulating film 304 can be formed by the CVD method and the ALD method as well as by the sputtering method.

With respect to formation of the lanthanum-aluminate film, there may be employed a method in which an ultrathin film (ground) of alumina is formed in the first place, and subsequently, the lanthanum-aluminate film is deposited on the ultrathin film of alumina. In this case, the alumina film to become the ground is mixed with the lanthanum-aluminate film on the alumina film at the time of annealing, resulting in a uniform film. According to this method, it is possible to raise heat endurance property of the lanthanum-aluminate film.

According to the present embodiment, the valence band offset for the compositional ratio y=0.5 of the hafnium oxynitride film results in $\phi_V(HfON)=2.5$ eV, and the valence band offset for the compositional ratio x=0.5 of the silicon oxynitride film results in $\phi_V(SiON)=2.68$ eV.

Relation between both the films is $\phi_V(SiON)>\phi_V(HfON)$; therefore the charge storage layer has the valence band offset smaller than that of the tunnel insulating film. For this reason, it is possible to realize improvement in erase speed and improvement in retention property after erase simultaneously.

In addition, according to the present embodiment, the energy level of the oxygen vacancy defect for the compositional ratio y=0.5 of the hafnium oxynitride film is 0.32 eV, which is positioned within the band gap of the charge storage layer. For this reason, trap density is secured sufficiently, required threshold voltage shift at the time of writing can be obtained, and excellent data retention property can be obtained after writing.

Note that, the depth of this trap is sufficiently larger than, for instance, energy 0.036 eV of $k_B T$ at 150° C.

Further, since the lanthanum-aluminate film with high dielectric constant is used as the block insulating film, the leakage current via the block insulating film can be suppressed, the threshold voltage window of write and erase is widened, and the retention property is preferably held by reduction of leakage current in low electric field region. In addition, in such MONOS type gate stack structure, it is possible to realize low power consumption due to reduction of power supply voltage by decrease in Equivalent Oxide Thickness (EOT).

Therefore, in the third embodiment, the same effect as the first embodiment is obtained, and excellent effects can be realized as the memory cell of the NAND type flash memory.

(4) Fourth Embodiment

FIG. 34 shows a memory cell according to the fourth embodiment.

The memory cell is different from the memory cell of the first embodiment in that a hafnium-aluminate oxynitride film is used as the charge storage layer.

On a surface part of a p-type silicon substrate (including well) 101, two source/drain diffusion layers 108 are arranged separately from each other. A portion between the source/drain diffusion layers 108 is a channel region, and when the memory cell becomes ON state, a channel for electrically conducting the two source/drain diffusion layers 108 is formed on the channel region.

On the channel region, for instance, there is arranged a tunnel insulating film (first insulating film) 102 with a thickness of approximately 4.5 nm constituted from the silicon oxynitride film (SiON). On the tunnel insulating film 102, for instance, there is arranged a charge storage layer 403 with a thickness of approximately 8 nm constituted from the hafnium-aluminate oxynitride film (HfAlON). On the charge storage layer 403, for instance, there is arranged a block insulating film (second insulating film) 304 with a thickness of approximately 20 nm constituted from a lanthanum-aluminate film (LaAlO$_3$).

On the block insulating film 304, for instance, there is arranged a control gate electrode 105 constituted from tantalum nitride (TaN). On the control gate electrode 105, for instance, there is arranged a barrier metal 106 constituted from tungsten nitride (WN), and on the barrier metal 106, for instance, there is arranged a low resistance metal film 107 constituted from tungsten (W).

Here, it is assumed that the compositional ratio of the silicon oxynitride film as the tunnel insulating film is, in $(SiO_2)_z(Si_3N_4)_{1-z}$, z=0.7, and the composition of the hafnium-aluminate oxynitride film as the charge storage layer is, for instance, [Al]/[Hf]=0.250 and [N]/[O]=1.44.

The composition of this film corresponds to x=0.5 and y=0.75, in $[(HfO_2)_x(Hf_3N_4)_{1-x}]_y[(Al_2O_3)_x(AlN)_{1-x}]_{1-y}$, when calculating the composition using the formulas (20) to (25) with these ratios as basis. In addition, it is assumed that the compositional ratio of the lanthanum-aluminate film (Al$_2$O$_3$)$_z$(La$_2$O$_3$)$_{1-z}$ as the block insulating film is z=0.5.

With respect to the control gate electrode 105, the barrier metal 106 and the low resistance metal film 107, change of the materials as described in the above first embodiment is possible.

In addition, with respect to the method of manufacturing the memory cell of FIG. 34, fundamentally, it is possible to apply the process of the first embodiment (FIGS. 27 to 31) as it is.

The hafnium-aluminate oxynitride film as the charge storage layer is formed by, for instance, the reactive co-sputtering method in oxygen/nitrogen mixed gas using Hf target and Al target.

In addition, the hafnium-aluminate oxynitride film can also be formed by the methods such as CVD method and ALD method. The HfAlON film can also be formed in such a way that, for instance, the ALD method using Hf[N(CH$_3$)$_2$]$_4$, Al(CH$_3$)$_3$ and H$_2$O is employed, and annealing in NH$_3$ gas atmosphere is performed in the middle of or at the end of the film formation process. In this case, the plasma nitridation may be utilized instead of annealing with NH$_3$ gas.

The valence band offset for the hafnium-aluminate oxynitride film of the present embodiment is $\phi_V(HfAlON)=2.84$ eV, and the valence band offset for the compositional ratio z=0.7 of the silicon oxynitride film is $\phi_V(SiON)=3.2$ eV.

Relation between both the films is $\phi_V(SiON)>\phi_V(HfAlON)$; therefore the valence band offset of the charge storage layer is smaller than that of the tunnel insulating film. For this reason, it is possible to realize improvement in erase speed and improvement in retention property after erasing simultaneously.

In addition, the energy level of the oxygen vacancy defects for the hafnium-aluminate oxynitride film of the present embodiment is 1.01 eV, which is positioned within the band gap of the charge storage layer. For this reason, trap density is secured sufficiently, required threshold voltage shift can be obtained at write time, and good data retention property can be obtained after writing.

(5) Fifth Embodiment

The fifth embodiment is a modified example of the fourth embodiment.

FIG. 35 shows a memory cell according to the fifth embodiment.

This memory cell is different from the memory cell of the fourth embodiment in that the compositional ratio of the tunnel insulating film 102 and the charge storage layer 403 differ, and trace amount of Si is introduced into the lanthanum-aluminate film as a block insulating film 504.

This addition of Si contributes to improvement in heat endurance property of the block insulating film 504. In addition, the tantalum carbide film (TaC) is used as the control gate electrode 305.

On the surface part of the p-type silicon substrate 101, two source/drain diffusion layers 108 are arranged separately from each other. On the channel region between the source/drain diffusion layers 108, for instance, there is arranged a tunnel insulating film (first insulating film) 102 with a thickness of approximately 4.7 nm constituted from the silicon oxynitride film (SiON). On the tunnel insulating film 102, for instance, there is arranged the charge storage layer 403 with a thickness of approximately 8 nm constituted from the hafnium-aluminate oxynitride film (HfAlON). On the charge storage layer 403, for instance, there is arranged the block insulating film (second insulating film) 504 with a thickness of approximately 20 nm constituted from a lanthanum-aluminate film (LaAlO$_3$(Si)) to which trace amount of Si is added.

On the block insulating film 504, for instance, there is arranged a control gate electrode 305 constituted from tantalum-carbide (TaC). On the control gate electrode 305, for instance, there is arranged a barrier metal 106 constituted from tungsten nitride (WN), and on the barrier metal 106, for instance, there is arranged a low resistance metal film 107 constituted from tungsten (W).

Here, it is assumed that the compositional ratio of the silicon oxynitride film as the tunnel insulating film is, in $(SiO_2)_z(Si_3N_4)_{1-z}$, z=0.6, and composition of the hafnium-aluminate oxynitride film as the charge storage layer is, for instance, [Al]/[Hf]=0.272 and [N]/[O]=2.02.

The composition of this film corresponds to x=0.4 and y=0.7, in $[(HfO_2)_x(Hf_3N_4)_{1-x}]_y[(Al_2O_3)_x(AlN)_{1-x}]_{1-y}$, when calculating the composition using the formulas (20) to (25) with these ratios as basis. In addition, the compositional ratio of the lanthanum-aluminate film $(Al_2O_3)_z(La_2O_3)_{1-z}$ as the block insulating film is z=0.5, and Si of approximately 2 atomic % is added thereto.

With respect to the control gate electrode 305, the barrier metal 106 and the low resistance metal film 107, change of the materials as described in the above first embodiment is possible.

In addition, with respect to the method of manufacturing the memory cell of FIG. 35, fundamentally, it is possible to apply the process of the first embodiment (FIGS. 27 to 31) as it is.

The hafnium-aluminate oxynitride film of the charge storage layer is formed by, for instance, the reactive co-sputtering method in oxygen/nitrogen mixed gas using Hf target and Al target.

In addition thereto, the hafnium-aluminate oxynitride film can also be formed by the methods such as CVD method and ALD method. The film can also be formed in such a way that, for instance, the ALD method using Hf[N(CH$_3$)$_2$]$_4$, Al(CH$_3$)$_3$ and H$_2$O is employed, and annealing in NH$_3$ gas atmosphere is performed in the middle of or at the end of the film formation process. In this case, the plasma nitridation may be utilized instead of annealing with NH$_3$ gas.

In addition, the lanthanum-aluminate film as the block insulating film to which Si is added can be formed by methods such as the sputtering method, the CVD method and the ALD method. For instance, addition of Si can be performed by reactive co-sputtering of La, Al, and Si.

The valence band offset for the hafnium-aluminate oxynitride film of the present embodiment is $\phi_V$(HfAlON)=2.80 eV, and the valence band offset for the compositional ratio z=0.6 of the silicon oxynitride film is $\phi_V$(SiON)=2.92 eV.

Relation between both the films is $\phi_V$(SiON)>$\phi_V$(HfAlON); therefore the valence band offset of the charge storage layer is sufficiently smaller than that of the tunnel insulating film. For this reason, it is possible to realize improvement in erase speed and improvement in retention property after erasing simultaneously.

In addition, the energy level of the oxygen vacancy defects for the hafnium-aluminate oxynitride film of the present embodiment is 0.93 eV, which is positioned within the band gap of the charge storage layer. For this reason, trap density is secured sufficiently, required threshold voltage shift can be obtained at the time of write, and good data retention property can be obtained after writing.

(6) Sixth Embodiment

FIG. 36 shows a memory cell according to the sixth embodiment.

This memory cell is different from the memory cell of the fourth embodiment in that a hafnium-silicate oxynitride film is used as the charge storage layer 503. In addition, the alumina film is used as the block insulating film 104.

On a surface part of the p-type silicon substrate 101, two source/drain diffusion layers 108 are arranged separately from each other. On the channel region between the source/drain diffusion layers 108, for instance, there is arranged a tunnel insulating film (first insulating film) 102 with a thickness of approximately 4 nm constituted from the silicon oxynitride film (SiON). On the tunnel insulating film 102, for instance, there is arranged the charge storage layer 503 with a thickness of approximately 6 nm constituted from the hafnium-silicate oxynitride film (HfSiON). On the charge storage layer 503, for instance, there is arranged a block insulating film (second insulating film) 104 with a thickness of approximately 15 nm constituted from an alumina film (Al$_2$O$_3$).

On the block insulating film 104, for instance, there is arranged a control gate electrode 105 constituted from tantalum nitride (TaN). On the control gate electrode 105, for instance, there is arranged a barrier metal 106 constituted from tungsten nitride (WN), and on the barrier metal 106, for instance, there is arranged a low resistance metal film 107 constituted from tungsten (W).

Here, it is assumed that the compositional ratio of the silicon oxynitride film as the tunnel insulating film is, in $(SiO_2)_z(Si_3N_4)_{1-z}$, z=0.8, and the composition of the hafnium-silicate oxynitride film as the charge storage layer is, for instance, [Si]/[Hf]=0.667 and [N]/[O]=1.33.

In $[(HfO_2)_x(Hf_3N_4)_{1-x}]_y[(SiO_2)_x(Si_3N_4)_{1-x}]_{1-y}$, the ratio corresponds to x=0.6 and y=0.6, when calculating it by using the formulas (34), (35).

With respect to the control gate electrode 105, the barrier metal 106 and the low resistance metal film 107, change of the materials as described in the above first embodiment is possible.

In addition, with respect to the method of manufacturing the memory cell of FIG. 36, fundamentally, it is possible to apply the process of the first embodiment (FIGS. 27 to 31) as it is.

The hafnium-silicate oxynitride film as the charge storage layer is formed by, for instance, the reactive co-sputtering method in oxygen/nitrogen mixed gas using Hf target and Si target.

The hafnium-silicate oxynitride film can also be formed by the methods such as CVD method and ALD method. The hafnium-silicate oxynitride film can also be formed in such a way that, for instance, the ALD method using $Hf[N(CH_3)_2]_4$, $SiH[(CH_3)_2]_3$ and $H_2O$ is employed, and annealing in $NH_3$ gas atmosphere is performed in the middle of or at the end of the film formation process.

As a precursor for introducing Si, $Si_2Cl_6$ may also be used instead of $SiH[(CH_3)_2]_3$. In addition, as the oxidizing agent, $O_3$ may be used instead of $H_2O$. Further, the plasma nitridation may be used instead of the annealing with $NH_3$ gas.

Although the alumina film as the block insulating film can be formed by the sputtering method, the alumina film may be formed by the CVD method or the ALD method. In the case of employing the ALD method, for instance, $Al[(CH_3)_3]_3$ and $H_2O$ (or $O_3$) are used.

The valence band offset for the hafnium-silicate oxynitride film of the present embodiment is $\phi_V$(HfSiON)=2.75 eV, and the valence band offset for the compositional ratio z=0.8 of the silicon oxynitride film is $\phi_V$(SiON)=3.54 eV.

Relation between both the films is $\phi_V$(SiON)>$\phi_V$(HfSiON); therefore the valence band offset of the charge storage layer is smaller than that of the tunnel insulating film. For this reason, it is possible to realize improvement in erase speed and improvement in retention property after erasing simultaneously.

In addition, the energy level of the oxygen vacancy defects for the hafnium-silicate oxynitride film of the present embodiment is 1.41 eV, which is positioned within the band gap of the charge storage layer. For this reason, trap density is secured sufficiently, required threshold voltage shift can be obtained at the time of write, and good data retention property can be obtained after writing.

(7) Seventh Embodiment

FIG. 37 shows a memory cell according to the seventh embodiment.

This memory cell is different from the memory cell of the sixth embodiment in that an ultrathin hafnium-silicate film is introduced between the hafnium-silicate oxynitride film as the charge storage layer 503 and the alumina film as the block insulating film 104.

The hafnium-silicate film functions as an interface trap layer 509, and contributes to increase in efficiency of the charge capture.

On a surface part of the p-type silicon substrate 101, two source/drain diffusion layers 108 are arranged separately from each other. On the channel region between the source/drain diffusion layers 108, for instance, there is arranged a tunnel insulating film (first insulating film) 102 with a thickness of approximately 4.5 nm constituted from the silicon oxynitride film (SiON). On the tunnel insulating film 102, for instance, there is arranged the charge storage layer 503 with a thickness of approximately 6 nm constituted from the hafnium-silicate oxynitride film (HfSiON).

On the charge storage layer 503, there is arranged an ultrathin hafnium-silicate film (HfSiO) functioning as the interface trap layer 509. Thickness of the interface trap layer 509 is set to, for instance, approximately 1 nm or less. On the interface trap layer 509, for instance, there is arranged the block insulating film (second insulating film) 104 with a thickness of approximately 15 nm constituted from the alumina film ($Al_2O_3$).

On the block insulating film 104, for instance, there is arranged a control gate electrode 105 constituted from tantalum nitride (TaN). On the control gate electrode 105, for instance, there is arranged a barrier metal 106 constituted from tungsten nitride (WN), and on the barrier metal 106, for instance, there is arranged a low resistance metal film 107 constituted from tungsten (W).

Here, it is assumed that the compositional ratio z of the silicon oxynitride film as the tunnel insulating film is, in $(SiO_2)_z(Si_3N_4)_{1-z}$, z=0.7, and the composition of the hafnium-silicate oxynitride film as the charge storage layer is [Si]/[Hf]=1.00 and [N]/[O]=2.00.

In $[(HfO_2)_x(Hf_3N_4)_{1-x}]_y[(SiO_2)_x(Si_3N_4)_{1-x}]_{1-y}$, the ratio corresponds to x=0.5 and y=0.5, when calculating it by using the formulas (34), (35).

With respect to the control gate electrode 105, the barrier metal 106 and the low resistance metal film 107, change of the materials as described in the above first embodiment is possible.

In addition, with respect to the method of manufacturing the memory cell of FIG. 37, fundamentally, it is possible to apply the process of the first embodiment (FIGS. 27 to 31) as it is.

The hafnium-silicate oxynitride film as the charge storage layer is formed by, for instance, the reactive co-sputtering method in oxygen/nitrogen mixed gas using Hf target and Si target.

The hafnium-silicate oxynitride film can also be formed by the methods such as CVD method and ALD method. The hafnium-silicate oxynitride film can also be formed in such a way that, for instance, the ALD method using $Hf[N(CH_3)_2]_4$, $SiH[(CH_3)_2]_3$ and $H_2O$ is employed, and annealing in $NH_3$ gas atmosphere is performed in the middle of or at the end of the film formation process.

As the precursor for introducing Si, $Si_2Cl_6$ may be used instead of $SiH[(CH_3)_2]_3$. In addition, as the oxidizing agent, $O_3$ may be used instead of $H_2O$. Further, the plasma nitridation may be used instead of the annealing with $NH_3$ gas.

The interface trap layer 509 on the charge storage layer 503 is formed with rapid oxidation after the charge storage layer 503 is formed. Like the formation of the interface trap layer by oxidizing an upper surface of the silicon nitride film (for instance, refer to E. Suzuki, Y. Hayashi, K. Ishii and T. Tsuchiya, "Traps created at the interface between the nitride and the oxide on the nitride by thermal oxidation," Appl. Phys. Lett. 42, 608 (1983)), the oxidation step is preferably performed in such a way as to implement a pyrogenic oxidation in atmosphere including $H_2O$.

Although the alumina film as the block insulating film can be formed by the sputtering method, the alumina film may be formed by the CVD method or the ALD method. In the case of employing the ALD method, for instance, $Al[(CH_3)_3]_3$ and $H_2O$ (or $O_3$) are used.

The valence band offset for the hafnium-silicate oxynitride film of the present embodiment is $\phi_V(\text{HfSiON})=2.61$ eV, and the valence band offset for the compositional ratio $z=0.7$ of the silicon oxynitride film is $\phi_V(\text{SiON})=3.20$ eV.

Relation between both the films is $\phi_V(\text{SiON})>\phi_V(\text{HfSiON})$; therefore the valence band offset of the charge storage layer is smaller than that of the tunnel insulating film. For this reason, it is possible to realize improvement in erase speed and improvement in retention property after erasing simultaneously.

In addition, the energy level of the oxygen vacancy defects for the hafnium-silicate oxynitride film of the present embodiment is 1.43 eV, which is positioned within the band gap of the charge storage layer. Further, the energy level of defects in the hafnium-silicate film of the interface trap layer is deeper than the above level.

For this reason, trap density is secured sufficiently, required threshold voltage shift can be obtained at the time of write, and good data retention property can be obtained after writing.

5. COMPARISON OF ERASE CHARACTERISTICS BETWEEN A CELL WITHIN COMPOSITIONAL RANGE AND A CELL OUT OF COMPOSITIONAL RANGE OF THE PRESENT INVENTION

Next, specifically shown is how conceptual content described in the schematic view of FIG. 5 appears as difference in erase characteristics of the memory cells.

It is assumed that, an example falling within the compositional range of the present invention, as shown in FIG. 38, is a MONOS type memory cell composed of an SiON tunnel insulating film 102 with a film thickness of 2 nm, an HfON charge storage layer 103 with a film thickness of 5 nm, and an $Al_2O_3$ block insulating film 104 with a film thickness of 10 nm.

Compositional ratio x of the silicon oxynitride film $(SiO_2)_x(Si_3N_4)_{1-x}$ is $x=0.8$, and compositional ratio y of the charge storage layer $(HfO_2)_y(Hf_3N_4)_{1-y}$ is $y=0.8$.

In addition, the valence band offset for the SiON film of the compositional ratio $x=0.8$ is 3.54 eV, and the dielectric constant thereof is 5.4. The valence band offset for the HfON film of the compositional ratio $y=0.8$ is 2.89 eV, and the dielectric constant thereof is about 20. The dielectric constant of $Al_2O_3$ is 11.

It is assumed that, an example not falling within the scope of claims of the present invention, as shown in FIG. 39, is a MONOS type memory cell composed of the SiON tunnel insulating film 102 with a film thickness of 2.64 nm, the HfON charge storage layer 103 with a film thickness of 5 nm, and the $Al_2O_3$ block insulating film 104 with a film thickness of 10 nm.

Difference from the sample falling within the compositional ratio of the present invention is summarized as two points, i.e., the compositional ratio and the film thickness of the silicon oxynitride film. The compositional ratio x of the silicon oxynitride film $(SiO_2)_x(Si_3N_4)_{1-x}$ is $x=0.2$. The valence band offset for the SiON film of this compositional ratio is 2.15 eV, and dielectric constant thereof is 7.13.

Note that, the example falling within the compositional range of the present invention is different from the example not falling within the compositional range of the present invention in physical film thickness of the SiON film; however, the both have equivalent value as Equivalent Oxide Thickness (EOT) represented in terms of $SiO_2$, which is 1.44 nm.

Figure 40:
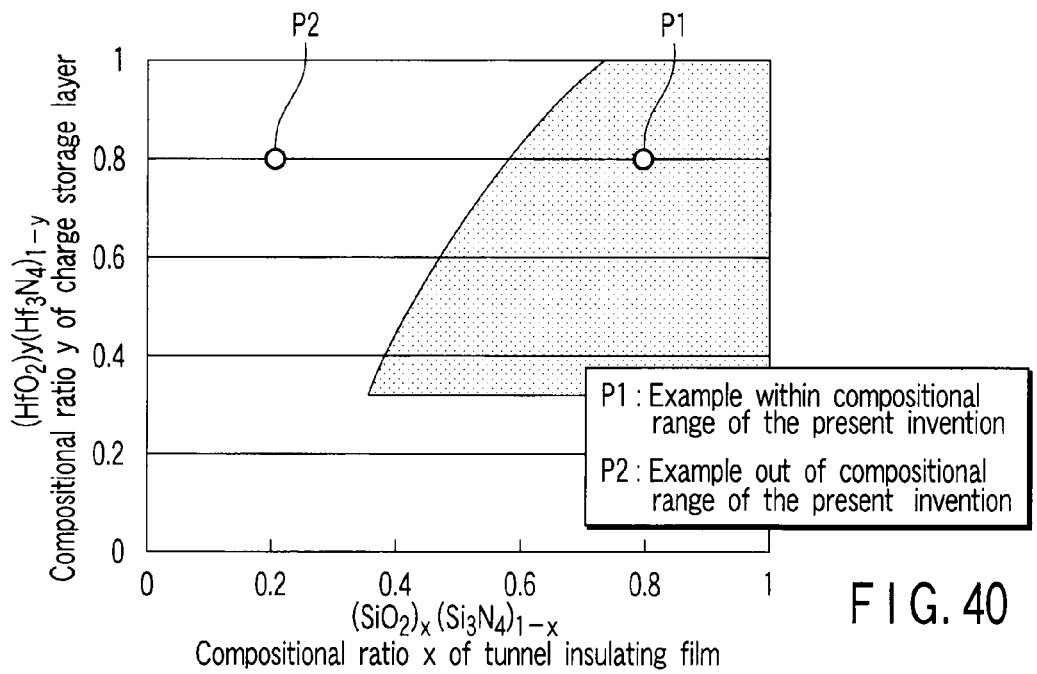
FIG. 40 is a view showing compositions of two samples.

Positional relation of the compositions of these two samples is shown in FIG. 40. P1 corresponds to the memory cell of FIG. 38, and P2 corresponds to the memory cell of FIG. 39.

Figure 41:
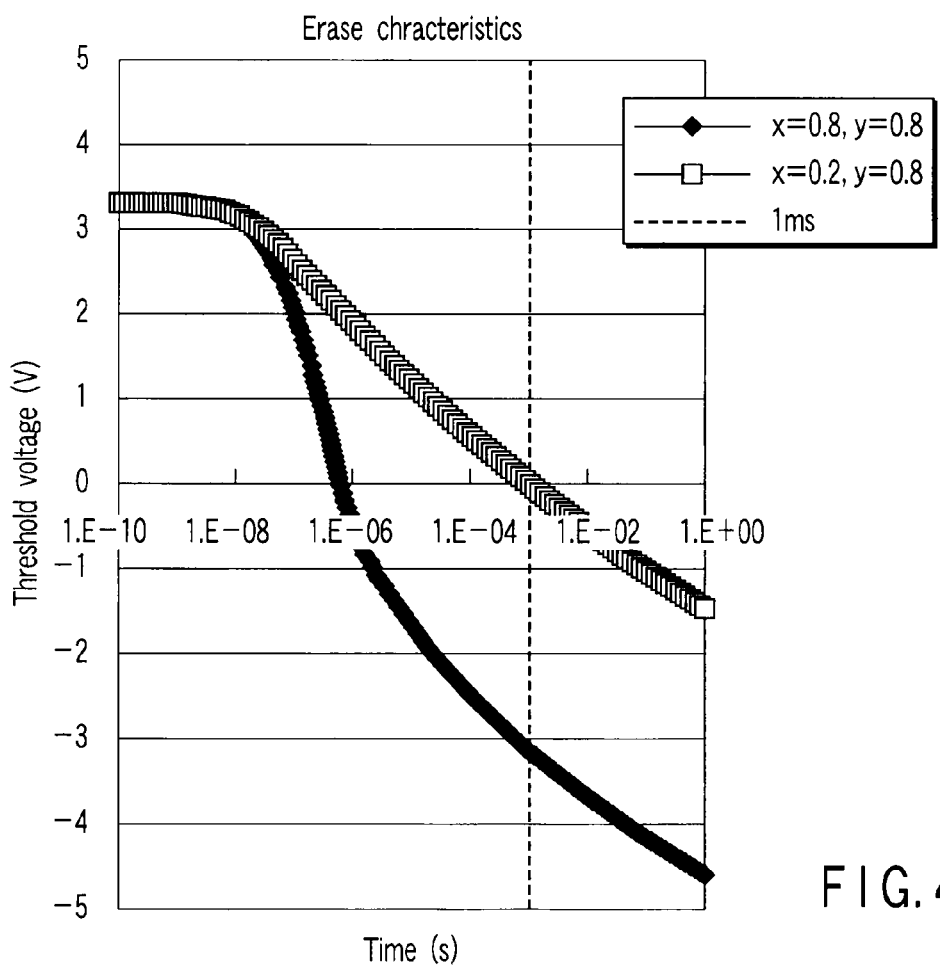
FIG. 41 is a view showing difference in erase properties of the two samples.

FIG. 41 shows simulation result of erase characteristics when applying control gate voltage $V_g=-16V$.

In these two samples, as schematically shown in FIG. 5, relation of the valence band offset between the tunnel insulating film and the charge storage layer is important, since it is conceivable that an electrical conduction mechanism of the tunnel insulating film is mainly direct-tunneling. In a time region in the vicinity of 1 ms when an erase operation ends, the memory cell falling within the compositional range of the present invention exhibits dramatically superior erase property to the memory cell not falling within the compositional range of the present invention.

As understood from the above specific examples, when adjusting relation of the composition between the tunnel insulating film and the charge storage layer so as to meet the compositional range of the present invention, it is possible to exert excellent performance as the MONOS type memory cell. It is important for miniaturization of the memory cell to meet the compositional range of the present invention. This is because, as the tunnel insulating film becomes thinner accompanied by the miniaturization, electrical conduction in the direct-tunneling region becomes dominant, so that correlation of the valence band offset becomes important.

6. APPLICATION EXAMPLES

The example of the present invention is effective for the nonvolatile semiconductor memory having the memory cell in which the charge storage layer is constituted from the insulating film and particularly, effective for the flash memory with NAND type device constitution.

In addition, the example of the present invention is applicable to the nonvolatile semiconductor memory of NOR type, AND type and DINOR type, 2-tr type flash memory in which advantages of NOR type and NAND type are fused together, and further, 3-tr NAND type having a structure in which one memory cell is sandwiched by two selection transistors.

7. OTHERS

The example of the present invention can be materialized while modifying respective constituent elements without deviating from the spirit of the invention.

For instance, although the charge storage layer is constituted from Hf based metal oxynitride, in Zr based metal oxynitride having chemical characteristic approximately equivalent to Hf, concept of the present invention and way of thinking about quantification are the same as those of the Hf based metal oxynitride. In addition, the way of thinking of the present invention applies to compound or mixture of the Hf based metal oxynitride and the Zr based oxynitride.

In addition, the tunnel insulating film and the charge storage layer in the example of the present invention are not necessarily uniform, and are not necessarily a single-layered film. Concerning the valence band offset in the case where composition is non-uniform in a film thickness direction, or in the case of the stack structure in which a plurality of films are stacked, way of thinking of the present invention may be applied to relation of the valence band offsets derived from the composition of the respective films in the interface region between the tunnel insulating film and the charge storage layer.

Concerning the trap level of the charge storage layer, way of thinking of the present invention may be applied to the composition in the region whose nitrogen concentration is the highest within the charge storage layer.

Further, the block insulating film is not necessarily uniform, and not necessarily a single-layered film. Concerning relation of the dielectric constant between the block insulating film and the tunnel insulating film, it is only necessary that average dielectric constant of the block insulating film is larger than average dielectric constant of the tunnel insulating film.

In addition, the stack gate structure according to the example of the present invention is not necessarily formed on the silicon (Si) substrate. For instance, the stack gate structure of the present invention may be formed on a well region formed on the silicon substrate. Further, an SiGe substrate, a Ge substrate, an SiGeC substrate or the like may be used instead of the silicon substrate, and the stack gate structure of the present invention may be formed on the well region within these substrates.

Further, in the example of the present invention, an SOI (silicon on insulator) substrate, an SGOI (silicon-germanium on insulator) substrate, a GOI (germanium on insulator) substrate or the like in which a thin film semiconductor is formed on the insulating film can also be used, and the stack gate structure of the present invention may be formed on the well region within these substrates.

In addition, in the example of the present invention, there has been described about the n-channel MONOS gate stack structure on the p-type silicon substrate (including well region); however it is possible to replace it by a p-channel MONOS gate stack structure on an n-type silicon substrate (including well region). In this case, conductivity type of the source or drain diffusion layer is p-type.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A memory cell of a nonvolatile semiconductor memory comprising:
    source/drain diffusion layers formed separately on a surface part of a semiconductor substrate;
    a first insulating film whose principal constituent elements are Si, O and N, formed on a channel between the source/drain diffusion layers;
    a charge storage layer whose principal constituent elements are Hf, O and N, formed on the first insulating film;
    a second insulating film having dielectric constant higher than that of the first insulating film and formed on the charge storage layer; and
    a control gate electrode formed on the second insulating film,
    wherein when a composition of the first insulating film is defined as $(SiO_2)_x(Si_3N_4)_{1-x}$ (where $0<x<1$), a composition of the charge storage layer is defined as $(HfO_2)_y(Hf_3N_4)_{1-y}$ (where $0<y<1$), and further valence band offsets of a silicon oxide film, a silicon nitride film, a hafnium oxide film and a hafnium nitride film are represented by $\phi_V(SiO_2)$, $\phi_V(Si_3N_4)$, $\phi_V(HfO_2)$, and $\phi_V(Hf_3N_4)$, respectively,
    correlation between a compositional ratio x of the first insulating film and a compositional ratio y of the charge storage layer meets:

$$y < \frac{7(1-w)}{7-4w} \text{ [where } 0<x<1, 0<y<1]$$

$$w = \frac{\{\phi_v(SiO_2) - \phi_v(Si_3N_4)\}\frac{7(1-x)}{7-4x} - \{\phi_v(SiO_2) - \Phi_v(HfO_2)\}}{\{\phi_v(HfO_2) - \phi_v(Hf_3N_4)\}}$$

and,
    in the case where trap energy levels due to oxygen vacancies in a hafnium oxide film and a hafnium nitride film are represented by $E_t(HfO_2)$ and $E_t(Hf_3N_4)$ which are evaluated in such a way that band edges of respective conduction bands are defined as reference points and direction within band gap is defined as positive direction, the compositional ratio y of the charge storage layer meets:

$$y > \frac{1}{1 - \frac{3}{7}\frac{E_t(HfO_2)}{E_t(Hf_3N_4)}}.$$

2. The memory cell according to claim 1,
    wherein, in the composition $(SiO_2)_x(Si_3N_4)_{1-x}$ of the first insulating film, x is $x \leqq 0.75$.
3. The memory cell according to claim 1,
    wherein, in the composition $(SiO_2)_x(Si_3N_4)_{1-x}$ of the first insulating film, x is $x \geqq 0.75$.
4. A memory cell of a nonvolatile semiconductor memory comprising:
    source/drain diffusion layers formed separately on a surface part of a semiconductor substrate;
    a first insulating film whose principal constituent elements are Si, O and N, formed on a channel between the source/drain diffusion layers;
    a charge storage layer whose principal constituent elements are Hf, O and N, formed on the first insulating film;
    a second insulating film having dielectric constant higher than that of the first insulating film and formed on the charge storage layer; and
    a control gate electrode formed on the second insulating film,
    wherein when a composition of the first insulating film is represented by $(SiO_2)_x(Si_3N_4)_{1-x}$ (where $0<x<1$), and a composition of the charge storage layer is represented by $(HfO_2)_y(Hf_3N_4)_{1-y}$ (where $0<y<1$),
    correlation between a compositional ratio x of the first insulating film and a compositional ratio y of the charge storage layer falls within a range of:

$$y<7(1-w)/(7-4w)[\text{where } 0<x<1, 0<y<1]$$

$$w = \frac{2.6\frac{7(1-x)}{7-4x} - 1.2}{1.1}$$

and,
    the compositional ratio y of the charge storage layer falls within a range meeting: $y>0.32$.

5. The memory cell according to claim 4,
wherein, in the composition $(SiO_2)_x(Si_3N_4)_{1-x}$ of the first insulating film, x is x≦0.75.

6. The memory cell according to claim 3,
wherein, in the composition $(SiO_2)_x(Si_3N_4)_{1-x}$ of the first insulating film, x is x≧0.75.

7. A memory cell of a nonvolatile semiconductor memory comprising:
source/drain diffusion layers formed separately on a surface part of a semiconductor substrate;
a first insulating film whose principal constituent elements are Si, O and N, formed on a channel between the source/drain diffusion layers, the first insulating film being represented by $(SiO_2)_z(Si_3N_4)_{1-z}$, wherein z being a compositional index;
a charge storage layer whose principal constituent elements are Hf, Al, O and N, formed on the first insulating film, the charge storage layer having compositional indexes x and y;
a second insulating film having dielectric constant higher than that of the first insulating film and formed on the charge storage layer; and
a control gate electrode formed on the second insulating film,
wherein the compositional index y is represented by $$y = \frac{-B + \sqrt{B^2 - 4AC}}{2A}$$

where A, B and C are coefficients derived from an atomic number ratio $R_{ah}$ between Al and Hf of the charge storage layer and an atomic number ratio $R_{no}$ between N to O of the charge storage layer, and the coefficients A, B and C are defined as $A = -3R_{ah}R_{no} + 3R_{ah} - R_{no} + 6$ $B = 9R_{ah}R_{no} + R_{ah} + 4R_{no} - 4$ $C = -(3R_{no} + 2);$ wherein the compositional index x is represented by $$x = \frac{1}{1 + R_{no}\frac{(3-y)}{(3y+1)}};$$

wherein the compositional indexes x and y of the charge storage layer are such selected that (A) a valence band offset $\phi_V(SiON)$ of the first insulating film becomes larger than a valence band offset $\phi_V(HfAlON)$ of the charge storage layer, where $\phi_V(HfAlON) = 3.3y + 4.2(1-y) - 1.1$ $$-2.4\frac{(1-x)(1+3y)}{\left(\frac{3y+1}{5y+2}\right)\{(1+x)(1-y) + (3-2x)y + x(3-y) + (1-x)(1+3y)\}}(eV)$$

and $\phi_V(SiON) = 4.5 - 2.6\frac{7(1-z)}{(7-4z)}(eV)$, and (B) an energy level $E_t$ of an oxygen vacancy defect in the charge storage layer meets $E_t > 0$ eV, where $$E_t = 4(1-y) + 2.2y -$$
$$2.4\frac{(1-x)(1+3y)}{\left(\frac{3y+1}{5y+2}\right)\{(1+x)(1-y) + (3-2x)y + x(3-y) + (1-x)(1+3y)\}}(eV).$$

8. The memory cell according to claim 7,
wherein, in the composition $(SiO_2)_z(Si_3N_4)_{1-z}$ of the first insulating film, z is z≦0.75.

9. The memory cell according to claim 7,
wherein, in the composition $(SiO_2)_z(Si_3N_4)_{1-z}$ of the first insulating film, z is z≧0.75.

10. A memory cell of a nonvolatile semiconductor memory comprising:
source/drain diffusion layers formed separately on a surface part of a semiconductor substrate;
a first insulating film whose principal constituent elements are Si, O and N, formed on a channel between the source/drain diffusion layers, the first insulating film being represented by $(SiO_2)_z(Si_3N_4)_{1-z}$, wherein z being a compositional index;
a charge storage layer whose principal constituent elements are Hf, Si, O and N, formed on the first insulating film, the charge storage layer having compositional indexes x and y;
a second insulating film having dielectric constant higher than that of the first insulating film and formed on the charge storage layer; and
a control gate electrode formed on the second insulating film,
wherein the compositional index y is represented by $$y = \frac{1}{1 + R_{sh}}$$

where $R_{sh}$ is defined by an atomic number ratio between Si and Hf;

wherein the compositional index x is represented by $$x = \frac{1}{1 + \frac{R_{no}}{2}}$$

where $R_{no}$ is defined by an atomic number ratio between N and O;

wherein the compositional indexes x and y of the charge storage layer are such selected that (A) a valence band offset $\phi_{h,tunnel}$ of the first insulating film becomes larger than a valence band offset $\phi_V(HfSiON)$ of the charge storage layer, where $\phi_V(HfSiON) = 3.3y + 4.5(1-y) - \{1.1y + 2.6(1-y)\}\frac{7(1-x)}{7-4x}$ (eV)

and $\phi_{h,tunnel} = 4.5 - 2.6\frac{7(1-z)}{(7-4z)}$ (eV), and (B) an energy level $E_t$ of an oxygen vacancy defect in the charge storage layer meets $E_t > 0$ eV, where $$E_t = 2.0y + 3.8(1-y) - \{2.4y + 1.8(1-y)\}\frac{7(1-x)}{7-4x} \text{ (eV)}.$$

11. The memory cell according to claim 10, wherein, in the composition $(SiO_2)_z(Si_3N_4)_{1-z}$ of the first insulating film, z is $z \leq 0.75$.

12. The memory cell according to claim 10, wherein, in the composition $(SiO_2)_z(Si_3N_4)_{1-z}$ of the first insulating film, z is $z \geq 0.75$.

* * * * *